United States Patent
Miura et al.

(10) Patent No.: US 7,613,880 B2
(45) Date of Patent: Nov. 3, 2009

(54) MEMORY MODULE, MEMORY SYSTEM, AND INFORMATION DEVICE

(75) Inventors: Seiji Miura, Hachioji (JP); Kazushige Ayukawa, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 175 days.

(21) Appl. No.: 10/536,460

(22) PCT Filed: Nov. 27, 2003

(86) PCT No.: PCT/JP03/15165

§ 371 (c)(1), (2), (4) Date: May 25, 2005

(87) PCT Pub. No.: WO2004/049168

PCT Pub. Date: Jun. 10, 2004

(65) Prior Publication Data

US 2006/0041711 A1 Feb. 23, 2006

(30) Foreign Application Priority Data

Nov. 28, 2002 (JP) ............................. 2002-344815

(51) Int. Cl.
*G06F 12/00* (2006.01)

(52) U.S. Cl. ..................... 711/115; 711/103; 711/105; 711/111; 711/118; 711/165

(58) Field of Classification Search ....................... None
See application file for complete search history.

(56) References Cited

U.S. PATENT DOCUMENTS 5,838,603 A  11/1998  Mori et al. ..................... 365/63

(Continued)

FOREIGN PATENT DOCUMENTS

EP   0 566 306 A2   10/1993

(Continued)

OTHER PUBLICATIONS

Sharp Corporation, "a stacked memory (stacked CSP) a flash memory + a RAM data Sheet" type name LRS1380, (online), Dec. 10, 2001 (URL:http://www.sharp.co.jp/products/device/flash/cmlist.html).

*Primary Examiner*—Reginald G Bragdon
*Assistant Examiner*—Shawn X Gu
(74) *Attorney, Agent, or Firm*—Miles & Stockbridge P.C.

(57) ABSTRACT

A memory system including large-capacity ROM and RAM in which high-speed reading and writing are enabled is provided. A memory system including a non-volatile memory (CHIP1), DRAM (CHIP3), a control circuit (CHIP2) and an information processing device (CHIP4) is configured. Data in FLASH is transferred to SRAM or DRAM in advance to speed up. Data transfer between the non-volatile memory (FLASH) and DRAM (CHIP3) can be performed in the background. The memory system including these plural chips is configured as a memory system module in which each chip is mutually laminated and each chip is wired via a ball grid array (BGA) and bonding wire between the chips. Data in FLASH can be read at the similar speed to that of DRAM by securing a region in which the data in FLASH can be copied in DRAM and transferring the data to DRAM in advance immediately after power is turned on or by a load instruction.

21 Claims, 32 Drawing Sheets

U.S. PATENT DOCUMENTS

| | | | |
|---|---|---|---|
| 6,064,585 A | 5/2000 | Mori et al. | 365/63 |
| 6,072,719 A * | 6/2000 | Tanzawa et al. | 365/185.03 |
| 6,292,426 B1 | 9/2001 | Ikeda et al. | 365/230.03 |
| 6,313,493 B1 | 11/2001 | Mori et al. | 257/296 |
| 6,324,103 B2 * | 11/2001 | Hiraki et al. | 365/189.05 |
| 6,392,950 B2 | 5/2002 | Ayukawa et al. | |
| 6,411,561 B2 | 6/2002 | Ayukawa et al. | 365/230.03 |
| 6,418,506 B1 | 7/2002 | Pashley et al. | 711/103 |
| 6,522,581 B2 | 2/2003 | Takata et al. | 365/185.05 |
| 6,539,456 B2 * | 3/2003 | Stewart | 711/113 |
| 6,587,393 B2 | 7/2003 | Ayukawa et al. | |
| 6,594,169 B2 | 7/2003 | Sakui | 365/51 |
| 2001/0015905 A1 * | 8/2001 | Kim et al. | 365/51 |
| 2001/0046167 A1 | 11/2001 | Ayukawa et al. | 365/200 |
| 2001/0048616 A1 | 12/2001 | Ayukawa et al. | 365/200 |
| 2001/0053090 A1 | 12/2001 | Takata et al. | 365/185.08 |
| 2002/0006071 A1 | 1/2002 | Ikeda et al. | 365/230.03 |
| 2002/0114178 A1 | 8/2002 | Sakui | 365/51 |
| 2002/0131318 A1 | 9/2002 | Ayukawa et al. | 365/230.03 |
| 2002/0185337 A1 | 12/2002 | Miura et al. | 185/11 |
| 2002/0199056 A1 | 12/2002 | Ayukawa et al. | 711/106 |
| 2003/0002377 A1 | 1/2003 | Sumitani et al. | 365/230.03 |
| 2004/0049629 A1 | 3/2004 | Miura et al. | 711/105 |

FOREIGN PATENT DOCUMENTS

| | | |
|---|---|---|
| EP | 0 707 316 A2 | 4/1996 |
| EP | 1 154 434 A1 | 11/2001 |
| EP | 1 164 594 A1 | 12/2001 |
| EP | 1 271 540 A2 | 1/2003 |
| JP | 5-299616 A | 11/1993 |
| JP | 6-215589 A | 8/1994 |
| JP | 7-146820 A | 6/1995 |
| JP | 8-167703 A | 6/1996 |
| JP | 8-305680 A | 11/1996 |
| JP | 2000-339954 A | 12/2000 |
| JP | 2001-005723 A | 1/2001 |
| JP | 2001-510612 A | 7/2001 |
| JP | 2001-344967 A | 12/2001 |
| JP | 2001-357684 A | 12/2001 |
| JP | 2002-251884 A | 9/2002 |
| JP | 2002-366429 A | 12/2002 |
| JP | 2003-6041 A | 1/2003 |
| JP | 2003-15954 A | 1/2003 |
| WO | WO 98/25213 A1 | 6/1998 |
| WO | WO 98/25271 A1 | 6/1998 |
| WO | WO 98/29816 A1 | 7/1998 |

* cited by examiner (A)

(B)

(A)

(B)

(A)

(B)

(A)

(B)

(A)

(B)

MEMORY MODULE, MEMORY SYSTEM, AND INFORMATION DEVICE

TECHNICAL FIELD

The present invention relates to a memory system including a dynamic random access memory (DRAM) and a method of controlling the memory system.

BACKGROUND ART

Heretofore, a stacked memory acquired by integrally molding a flash memory having 32-Mbit capacity and a static random access memory (SRAM) having 4-Mbit capacity in a fine pitch ball grid array (FBGA) type package in the form of a stacked chip has been provided. As for the flash memory and SRAM, the respective address input terminals and the respective data input/output terminals are connected to an input/output electrode of the FBGA type package in common. However, each control terminal is independent (for example, refer to "a stacked memory (stacked CSP) a flash memory+a RAM data sheet)", type name LRS1380, [online], Dec. 10, 2001, Sharp Corporation, searched on Aug. 21, 2002, URL: http://www.sharp.co.jp/products/device/flash/cmlist.html).

There is also a stacked memory acquired by integrally molding a flash memory chip and a DRAM chip in a lead frame type package. In the stacked memory, respective address input terminals, respective data input/output terminals and respective control terminals of the flash memory and DRAM are connected to an input/output electrode of the package in common (for example, see FIGS. 1 and 17 in Japanese Patent Laid-Open No. H5 (1993)-299616 and refer to a specification of an European patent application No. 0566306).

There is also a system configured by a flash memory treated as a main memory device, a cache memory, a controller and CPU (for example, see FIG. 1 in Japanese Patent Laid-Open No. H7 (1995)-146820).

There is also a semiconductor memory configured by a flash memory, DRAM and a transfer control circuit (for example, see FIG. 2 in JP-A-2001-5723).

DISCLOSURE OF THE INVENTION

Inventors of the invention examined a mobile telephone, a memory module used for the mobile telephone in which a flash memory and SRAM were packaged in one package and the operation prior to the invention.

As shown in FIG. 32, currently, an information processing device PRC and a memory module MCM are used in a mobile telephone.

The information processing device PRC is configured by a central processing unit CPU and an SRAM controller. The memory module MCM is configured by a NOR flash memory NOR FLASH and SRAM. The information processing device PRC accesses the memory module MCM via an SRAM interface (SRAM IF) to read and write data.

After power is turned on, the information processing device PRC reads boot program data stored in the NOR flash memory NOR FLASH and activates itself. Afterward, the information processing device PRC reads an application program from the NOR flash memory NOR FLASH if necessary and executes it in the central processing unit CPU. SRAM functions as a work memory and stores the result of operation by the central processing unit CPU.

Recently, as functions (for distributing music and games) added to a mobile telephone increase, applications, data and a work area respectively managed by the mobile telephone increase and it is estimated that a flash memory and SRAM respectively having larger memory size are required. Further, the enhancement of the functions of a recent mobile telephone is remarkable and a demand for a high-speed and large-capacity memory increases.

Currently, a NOR flash memory used in a mobile telephone uses a memory array system called NOR configuration. The NOR type denotes array configuration in which the parasitic resistance of a memory array is minimized and the resistance is reduced by providing a metal bit line contact in the ratio of one to two memory cells connected in parallel. Therefore, the read time is approximately 80 ns and can be substantially made similar to the read time of SRAM. However, as one contact per two cells is required to be provided, there is a problem that the contact part accounts for a large rate for the area of a chip, the area of a 1-bit memory cell increases, and the NOR type cannot correspond to the increase of capacity.

For a representative large-capacity flash memory, there are an AND flash memory using AND configuration for a memory array and a NAND flash memory using NAND configuration. As for these flash memories, as one bit line contact is provided to 16 to 128 pieces of cells, a high-density memory array can be implemented. Therefore, the area of a 1-bit memory cell can be reduced more than that of the NOR flash memory and the flash memories can correspond to the increase of capacity. However, it is ascertained that the read time until first data is output is approximately 25 to 50 µs, is slow, and the flash memories lack consistency with SRAM.

Then, one of the objects of the invention is to provide a memory system including ROM and RAM which have large memory size and from/to which data can be read and written at high speed.

Representative means of the invention are as follows. An information processing device, a flash memory, SRAM and DRAM configured by plural memory banks are packaged in one molded device, and an electrode for supplying power to wiring of semiconductor chips and an electrode used for connecting the molded device and the outside of the molded device are provided to the molded device.

At this time, to speed up read time for a request for reading data in the flash memory from the information processing device, a memory controller is connected to SRAM, DRAM and the flash memory, by the memory controller, data transfer from the flash memory to SRAM and data transfer from SRAM to the flash memory are performed, and data transfer from the flash memory to DRAM and data transfer from DRAM to the flash memory are performed. It is desirable that after power is turned on and when a transfer instruction is issued, control that at least a part of data in the flash memory is transferred to SRAM and DRAM by the memory controller is made.

Control may be also made so that even while data transfer between the flash memory and DRAM is performed by the memory controller, access to DRAM from the information processing device for read or write is accepted and data is read or written at high speed. It is desirable that data transfer between the flash memory and DRAM is performed in the background inside the semiconductor device.

Further, the memory controller also executes refresh control of DRAM in data transfer from the flash memory to DRAM after power is turned on. In the data transfer from the flash memory to DRAM, it is desirable that control is made so that DRAM is automatically refreshed, when the data transfer is finished, DRAM is turned in a self-refresh condition and afterward, the self-refresh condition is released by a self-refresh release instruction from a device outside the semiconductor device. Control may be also made so that auto-refresh operation by the memory controller is stopped by an auto-refresh instruction from the information processing device.

BEST MODE CARRYING OUT THE INVENTION

Referring to the attached drawings, embodiments of the invention will be described in detail below. In the embodiments, a circuit element configuring each block is not particularly limited, however, it is formed on/over one semiconductor substrate made of monocrystalline silicon for example by integrated circuit (well-known CMOS (a complementary MOS transistor)) technology.

FIRST EMBODIMENT

Figure 1:
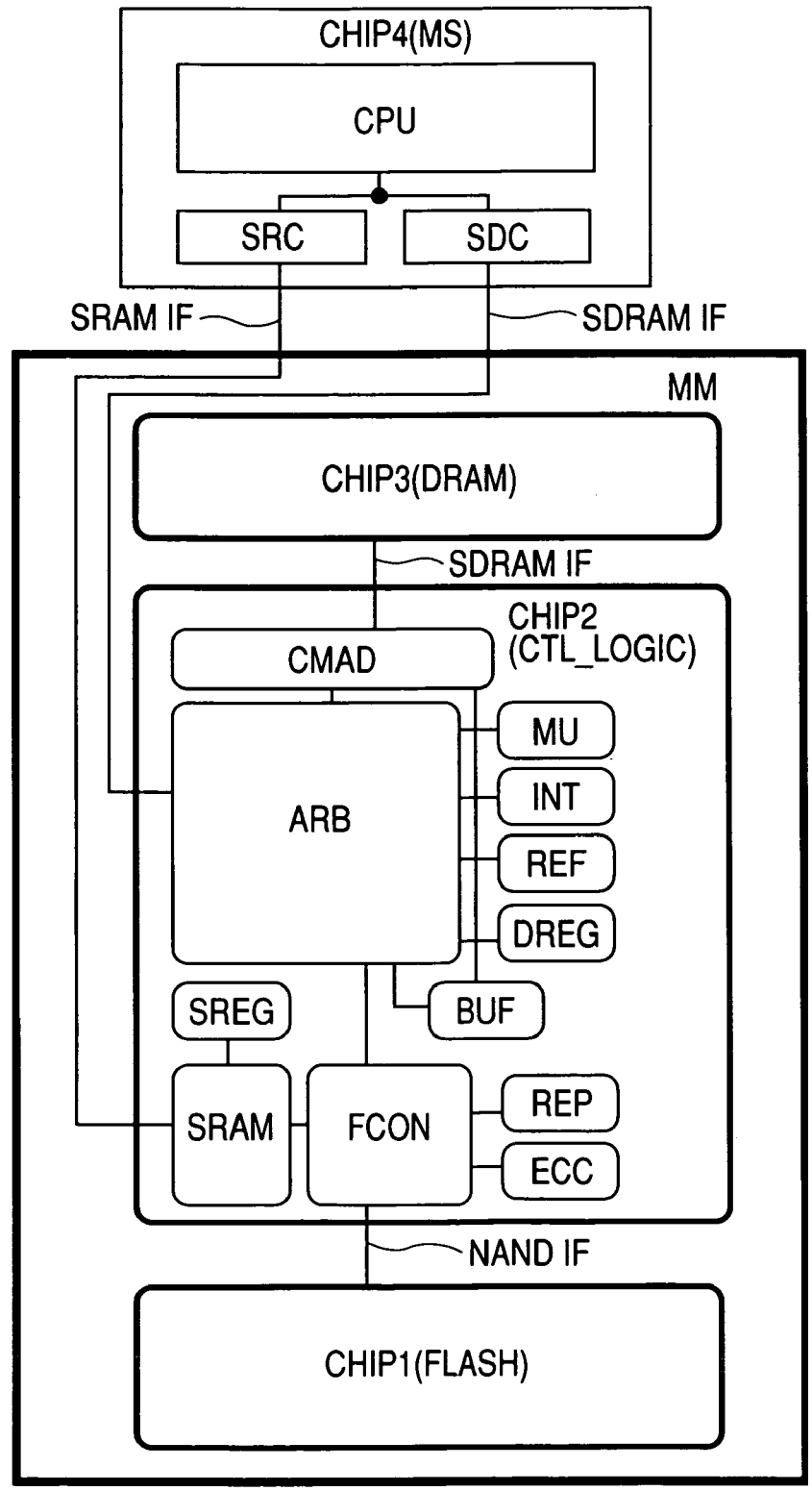
FIG. 1 is a block diagram showing a memory system to which the invention is applied.

FIG. 1 shows a memory system configured by an information processing device CHIP4 (MS) equivalent to a first embodiment to which the invention is applied and a memory module MM. Each will be described below.

The memory module MM includes CHIP1 (FLASH), CHIP2 (CTL_LOGIC) and CHIP3 (DRAM).

CHIP1 (FLASH) is a non-volatile memory. For the non-volatile memory, a read only memory (ROM), electrically erasable and programmable ROM (EEPROM) and a flash memory can be used. This embodiment will be described using a flash memory for an example.

Though the following are not particularly limited, a typical non-volatile memory used for CHIP1 (FLASH) is a large-capacity flash memory equipped with an NAND interface (NAND IF), has large memory size of approximately 128 Mbits, its read time (time since a request for reading until data is output) is approximately 25 to 100 µs, and it is relatively slow.

CHIP3 (DRAM) is a dynamic random access memory and has various types such as extended data out DRAM (EDO DRAM), synchronous DRAM (SDRAM) and a double data rate mode (a DDR mode) depending upon internal configuration and difference in an interface. Any DRAM can be used for the memory module MM. This embodiment will be described using SDRAM for an example.

Though the following are not particularly limited, typical SDRAM used for CHIP3 (DRAM) has large memory size of approximately 256 Mbits and its read time is approximately 35 to 55 ns. CHIP2 (CTL_LOGIC) is a control circuit for controlling data transfer between CHIP1 (FLASH) and CHIP3 (DRAM) and between SRAM and CHIP3 (DRAM).

SRAM is a static random access memory and has various types such as an asynchronous static random access memory and a synchronous static random access memory depending upon internal configuration and difference in an interface. Any static random access memory can be used for the memory module MM, however, this embodiment will be described using an asynchronous static random access memory for an example. Though the following are not particularly limited, the memory size of SRAM used in this embodiment is approximately 64 kbits and its read time is approximately 80 ns.

Data transfer between CHIP1 (FLASH) and CHIP2 (CTL_LOGIC) is performed via a NAND interface (NAND IF) and data transfer between CHIP2 (CTL_LOGIC) and CHIP3 (DRAM) is performed via an SDRAM interface (SDRAM IF).

The information processing device CHIP4 is configured by a central processing unit CPU, an SRAM controller SRC and a DRAM controller SDC. The SRAM controller accesses SRAM via an SRAM interface (SRAM IF) to read/write data. The DRAM controller accesses CHIP3 (DRAM) via CHIP2 (CTL_LOGIC) and the SDRAM interface (SDRAM IF) to read/write data.

CHIP1 (FLASH) is divided into an initial program region and a main data region though they are not particularly limited. In the initial program region, boot program data for activating the information processing device CHIP4 (MS) immediately after power is turned on, designation data for an automatic data transfer region showing a data range in the main data region to be transferred to SDRAM and refresh control select data are stored.

CHIP3 (DRAM) is divided into a work region and a copy region though they are not particularly limited, the work region is utilized for a work memory when a program is executed, and the copy region is utilized for a memory for copying data from FLASH.

SRAM is divided into a boot region and a buffer region though they are not particularly limited, the boot region is utilized for storing boot program data for activating the information processing device CHIP4 (MS), and the buffer region is utilized for a buffer memory for data transfer between CHIP1 (FLASH) and SRAM.

CHIP2 (CTL_LOGIC) is configured by a memory management unit MU, a command/address generator CMAD, an access arbiter ARB, an initialize circuit INT, a refresh control circuit REF, a data buffer BUF, a control register SREG accessible via the SRAM interface (SRAM IF), a control register DREG accessible via the SDRAM interface, a flash control circuit FCON, an error detecting and correcting circuit ECC and an address replacement circuit REP.

Correspondence between an address of CHIP1 (FLASH) and an address in the copy region of CHIP3 (DRAM), in the boot region and in the buffer region respectively of SRAM can be determined by the memory management unit MU of CHIP2 (CTL_LOGIC). For example, generally, CHIP3 (DRAM) is configured by four memory banks (banks 0 to 3), though they are not particularly limited, the copy region of CHIP3 (DRAM) can be allocated to the bank 0 and the bank 1 by the memory management unit and the work region can be also allocated to the bank 2 and the bank 3.

The operation of this memory system will be described below.

When power is applied to the information processing device CHIP4 (MS), CHIP3 (DRAM), CHIP2 (CTL_LOGIC) and CHIP1 (FLASH), the flash control circuit FCON reads data in the initial program region of CHIP1 (FLASH) and the error detecting and correcting circuit ECC checks whether the data has an error or not. If the data has no error, the data is directly transferred to SRAM and in case the data has an error, the error is corrected and data after correction is transferred to SRAM. As described above, the information processing device CHIP4 (MS) reads boot program data and can activate itself promptly by automatically transferring the boot program data from CHIP1 (FLASH) to SRAM immediately after power is turned on.

While the information processing device CHIP4 (MS) activates itself, the initialize circuit INT executes a sequence for initializing CHIP3 (DRAM). The flash control circuit FCON reads designation data for an automatic data transfer region from SRAM, sequentially reads data in the main data region of CHIP1 (FLASH) in a range designated in the data, and the error detecting and correcting circuit ECC checks whether the data has an error or not. If the data has no error, the data is directly transferred to the data buffer BUF, in case the data has an error, the error is corrected, and data after correction is transferred to the data buffer BUF. The command/address generator CMAD sequentially transfers the data held in the data buffer BUF to CHIP3 (DRAM). When data transfer is started, the refresh control circuit REF issues an auto-refresh command to CHIP3 (DRAM) via the command/address generator CMAD to hold data in CHIP3 (DRAM). When the data transfer is finished, the access arbiter writes a data transfer completion flag showing the completion of data transfer to the control register DREG.

The information processing device CHIP4 (MS) accesses the control register DREG via the SDRAM interface (SDRAM IF) and can know that data transfer immediately after power is turned on is completed by reading the data transfer completion flag in the control register DREG.

As CHIP3 (DRAM) has a characteristic that in case refresh operation is not executed periodically, data held in a memory cell is lost, the refresh control circuit REF applies auto-refresh operation to CHIP3 (DRAM) when data transfer from CHIP1 (FLASH) to CHIP3 (DRAM) when power is turned on is started. Further, after the data transfer is completed, the refresh control circuit reads refresh control select data from SRAM. In case the refresh control select data is at a high level, the refresh control circuit REF stops auto-refresh operation and data-hold by refresh operation proceeds to control from the information processing device CHIP4 (MS) when an auto-refresh instruction or a self-refresh instruction is input from the information processing device CHIP4 (MS) to CHIP2 (CTL_LOGIC).

Besides, in case the refresh control select data is at a low level, the refresh control circuit applies self-refresh operation to CHIP3 (DRAM) after data transfer is completed to hold data in CHIP3 (DRAM). In a self-refresh state, data can be held with lower power than normal auto-refresh operation. In the state of self-refreshment by the refresh control circuit REF, when a self-refresh release instruction is input from the information processing device CHIP4 (MS), the self-refresh state is released and simultaneously, data-hold by refresh operation proceeds to control from the information processing device CHIP4 (MS).

As described above, the information processing device CHIP4 (MS) reads its boot program data by automatically transferring the boot program data from CHIP1 (FLASH) to SRAM immediately after power is turned on and can activate itself promptly. Further, as access to the memory module MM is enabled immediately when the information processing device CHIP4 (MS) is activated by automatically transferring data in CHIP1 (FLASH) to CHIP3 (DRAM) while the information processing device CHIP4 (MS) activates itself, the performance can be enhanced.

Data transfer between CHIP1 (FLASH) and CHIP3 (DRAM) after an operational sequence is finished when power is turned on is executed when the information processing device CHIP4 (MS) accesses the control register DREG and writes a load instruction code or a store instruction code to it. Data in the main data region of CHIP1 (FLASH) can be transferred to the copy region of CHIP3 (DRAM) by the load instruction and data in the copy region of CHIP3 (DRAM) can be transferred to the main data region of CHIP1 (FLASH) by the store instruction.

When the information processing device CHIP4 (MS) writes a load instruction code, a load initiation address and transfer data size to the control register DREG via the SDRAM interface (SDRAM IF), data from the load initiation address for the transfer data size out of data in CHIP1 (FLASH) is transferred to the copy region of CHIP3 (DRAM). First, the flash control circuit FCON sequentially reads data from CHIP1 (FLASH). If data read from CHIP1 (FLASH) has no error, the data is directly transferred to the transfer data buffer BUF and in case the data has an error, the error is corrected in the error detecting and correcting circuit ECC and data after correction is transferred to the transfer data buffer BUF. The command/address generator CMAD sequentially transfers data held in the data buffer BUF to CHIP3 (DRAM).

When the information processing device CHIP4 (MS) writes a load instruction code, a load initiation address and transfer data size to the control register DREG via the SDRAM interface (SDRAMIF), data from a store initiation address for the transfer data size out of data in the copy region of CHIP3 (DRAM) is transferred to CHIP1 (FLASH).

First, the command/address generator CMAD issues a read instruction and an address to CHIP3 (DRAM) via the SDRAM interface (SDRAM IF) to read data.

Data read from CHIP3 (DRAM) is transferred to the data buffer BUF. The flash control circuit FCON reads the data transferred to the data buffer BUF and writes it to CHIP1 (FLASH).

The address replacement circuit REP checks whether the writing succeeds or not and finishes processing if the writing succeeds. When the writing fails, the data is written to a new address for replacement prepared in CHIP1 (FLASH) in advance. When replacement is made, a defective address and the information of the address with which the defective address is replaced are held and managed.

In FIG. 1, the error detecting and correcting circuit ECC and the address replacement circuit REP are provided to the control circuit CHIP2 (CTL_LOGIC), however, needless to say, they may be also provided to CHIP1 (FLASH), CHIP1 (FLASH) may also correct an error and transfer the data to CHIP3 (DRAM) via the control circuit CHIP2 (CTL_LOGIC), may also replace an address of data transferred from CHIP3 (DRAM) to CHIP1 (FLASH) and the data may be also written.

Data transfer between CHIP1 (FLASH) and SRAM after an operational sequence is finished when power is turned on is executed when the information processing device CHIP4 (MS) accesses the control register SREG and writes a load instruction code or a store instruction code. Data in CHIP1 (FLASH) can be transferred to the buffer region of SRAM by the load instruction and data in the buffer region of SRAM can be transferred to CHIP1 (FLASH) by the store instruction.

When the information processing device CHIP4 (MS) writes a load instruction, a load initiation address and transfer data size to the control register SREG via the SRAM interface (SRAM IF), data in CHIP1 (FLASH) from the load initiation address is read by the transfer data size and is transferred to the buffer region of SRAM.

First, the flash control circuit FCON sequentially reads from CHIP1 (FLASH). If data read from CHIP1 (FLASH) has no error, the data is directly transferred to the buffer region of SRAM and in case the data has an error, the error is corrected in the error detecting and correcting circuit ECC and data after correction is transferred to the buffer region of SRAM.

When the information processing device CHIP4 (MS) writes a store instruction code, a store initiation address and transfer data size to the control register SREG via the SRAM interface (SRAM IF) in the same way as data transfer between CHIP1 (FLASH) and SRAM by the load instruction, data in the buffer region of SRAM from the store initiation address for the transfer data size is written to CHIP1 (FLASH).

First, the flash control circuit FCON reads data in the buffer region of SDRAM and writes the data to CHIP1 (FLASH).

The address replacement circuit REP checks whether the writing succeeds or not and if the writing succeeds, the circuit finishes the processing. When the writing fails, the address replacement circuit writes the data to a new address for replacement prepared in CHIP1 (FLASH) beforehand. When replacement is made, a defective address and the information of an address with which the defective address is replaced are held and managed.

As described above, as boot program data and designation data for an automatic data transfer region are written to the initial program region of FLASH via SRAM IF and the buffer region of SRAM and a booting method and a data transfer region immediately after power is turned on can be changed, flexible correspondence according to a request of a mobile device is enabled and the function can be enhanced.

In case the information processing device CHIP4 (MS) accesses the copy region of CHIP3 (DRAM), it inputs an address for selecting the copy region of CHIP3 (DRAM) and a read instruction or a write instruction to CHIP2 (CTL_LOGIC) via the SDRAM interface. Afterward, CHIP2 (CTL_LOGIC) reads or writes data from/to the copy region of CHIP3 (DRAM) according to the input instruction and the input address.

As described above, as data in CHIP1 (FLASH) is held in the copy region of CHIP3 (DRAM), time for reading or writing the data in CHIP1 (FLASH) is equalized to that of DRAM by accessing CHIP3 (DRAM) and reading or writing the data. Reading and writing from/to the work region of CHIP3 (DRAM) are also executed according to the same procedure as the access to the copy region.

In case the information processing device CHIP4 (MS) accesses SRAM, it inputs an address and a read instruction or a write instruction to SRAM via the SDRAM interface. Afterward, SRAM reads or writes data according to this instruction and the address.

The information processing device CHIP4 (MS) thereby transfers data from CHIP1 (FLASH) to SRAM immediately after power is turned on, reads held boot program data, and can activate itself promptly. Further, as the information processing device CHIP4 (MS) can change a program in CHIP1 (FLASH) via the buffer region of SRAM and can read and verify the contents of a program, it can flexibly correspond to a request of a mobile device.

Suppose that the copy region of CHIP3 (DRAM) is allocated to the bank 0 and the bank 1 in the memory management unit MU and the work region is allocated to the bank 2 and the bank 3. In case access to the bank 3 of CHIP3 (DRAM) is made via the SDRAM interface of the information processing-device CHIP4 (MS) when access to the bank 0 of CHIP3 (DRAM) is made by a load instruction or a store instruction, the control circuit CHIP2 (CTL_LOGIC) halts the access to CHIP3 (DRAM) by the load instruction or the store instruction and gives the access from the information processing device CHIP4 (MS) priority. When the access is finished, the access by the load instruction or the store instruction is restarted.

As described above, access from the information processing device CHIP4 (MS) to CHIP3 (DRAM) is enabled even during data transfer between CHIP1 (FLASH) and CHIP3 (DRAM) by the load instruction or the store instruction without being conscious of the data transfer and the invention can correspond to the enhancement of the performance and the function of a mobile device.

In other words, data transfer between CHIP1 (FLASH) and CHIP3 (DRAM) by the load instruction or the store instruction can be executed in the background, necessary data can be transferred to CHIP3 (DRAM) or CHIP1 (FLASH) in advance by necessary time, and the invention can correspond to the enhancement of the performance and the function of a mobile device.

As described above, in the memory module according to the invention, the information processing device CHIP4 (MS) can activate itself promptly with boot program data by following a method of providing the SRAM interface and the SDRAM interface and automatically transferring the boot program data in CHIP1 (FLASH) to SRAM immediately after power is turned on. Further, as access to the memory module MM is possible shortly when the information processing device CHIP4 (MS) is activated by automatically transferring data in CHIP1 (FLASH) to CHIP3 (DRAM) while the information processing device CHIP4 (MS) activates itself, the performance can be enhanced.

Data in FLASH can be read at the similar speed as that of DRAM by securing a region in which the data in CHIP1 (FLASH) can be copied in CHIP3 (DRAM) and transferring the data from CHIP1 (FLASH) to CHIP3 (DRAM) in advance immediately after power is turned on or by a load instruction. As data is once written to DRAM and if necessary, can be rewritten to FLASH by a store instruction when the data is written to FLASH, the writing speed of data is also similar to that of DRAM.

As inside the memory module MM, an error is detected and corrected in reading from FLASH and a defective address where writing is not correctly performed is replaced in writing, processing can be executed at high speed and the reliability can be kept.

As a program in CHIP1 (FLASH) can be changed via the buffer region of SRAM and the contents of a program can be read and verified, flexible correspondence in accordance with a request of a mobile device is enabled.

Further, as large-capacity DRAM is used, a large-capacity work region can be also secured in addition to a region in which data in FLASH can be copied and the invention can correspond to the enhancement of the function of a mobile telephone.

Figure 2:
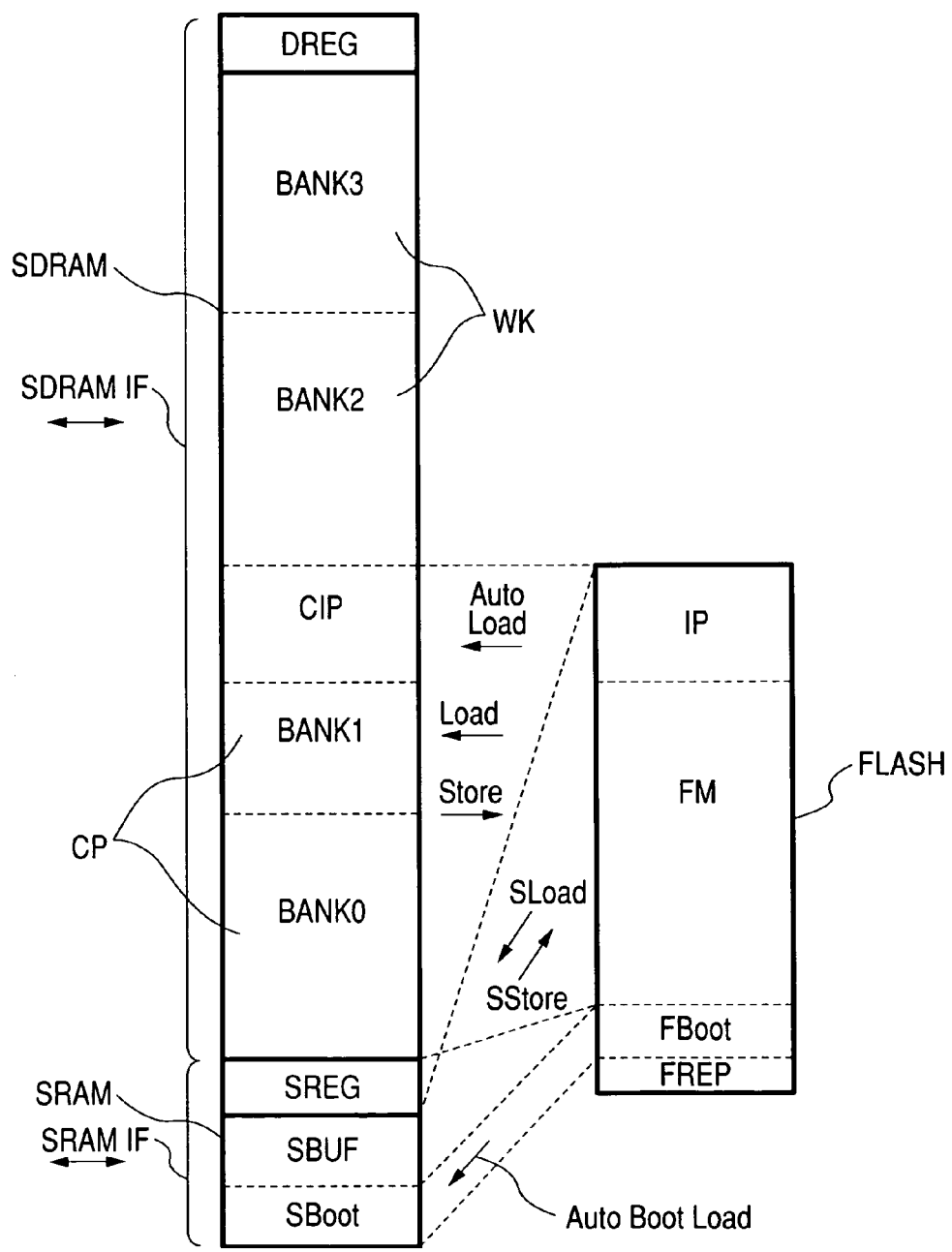
FIG. 2 is an explanatory drawing showing one example of an address map of the memory system to which the invention is applied.

FIG. 2 shows one example of a memory map by the memory management unit MU. In this embodiment, though the following are not particularly limited, a representative memory map will be described using the memory module where a memory area of the non-volatile memory is 128 Mbits+4 Mbits (4 Mbits are equivalent to a region for replacement), a memory area of DRAM is 256 Mbits, SRAM is 8 kbits and the control registers SREG and DREG are respectively 1 kbits for example below.

FIG. 2 shows the memory map in which the memory management unit MU converts to an address in the control register DREG (1 kb), the work region WK (128 Mbits) of DRAM, the copy region CP (128 Mbits) of DRAM and FLASH (128 Mbits) based upon an address input via the SDRAM interface (SDRAM IF) and the SRAM interface (SRAM IF).

Though the following are not particularly limited, SRAM, the control register SREG, the bank 0 (BANK0) of DRAM, the bank 1 (BANK1), the bank 2 (BANK2), the bank 3 (BANK3) and the control register DREG are mapped in order from a lower part of address space of the memory map.

SRAM is divided into a boot region SBoot and a buffer region SBUF.

The bank 0 (BANK0) and the bank 1 (BANK1) of DRAM are mapped in the copy region CP, and the bank 2 (BANK2) and the bank 3 (BANK3) are mapped in the work region WK. The copy region CP is a region to which data in FLASH is transmitted and in which it is held. The work region WK is a region utilized for a work memory. An initial automatic data transfer region IP is included in the copy region CP of the bank 1 (BANK1).

FLASH is divided into a main data region FM, an initial program region FBoot and a replacement region FREP. An initial automatic data transfer region IP for implementing automatic transfer to DRAM when power is turned on is included in the main data region FM of FLASH.

A program and data are stored in the main data region FM of FLASH. As for FLASH, the reliability is deteriorated by repeating rewriting, there occur, though infrequently, that written data is rarely turned different data in reading and that no data is written in rewriting. The replacement region FREP is provided to reload data in the initial program region FBoot and the main data region FM respectively turned defective as described above into a new region. The size of the replacement region is not particularly limited, however, it is desirable that the reliability which FLASH guarantees can be secured.

Data in the main data region FM and the replacement region FREP of FLASH are transferred to the copy region CP of DRAM according to a load instruction via the SDRAM interface (SDRAMIF).

Data transfer from FLASH to DRAM when power is turned on will be described below.

In the initial program region FBoot of FLASH, designation data for an automatic data transfer region showing a range of the initial automatic data transfer region IP automatically transferred from FLASH to DRAM when power is turned on is stored.

After power is turned on, first, data in the initial program region FBoot of FLASH is read, it is checked by the error correcting circuit ECC whether the data has an error or not, and if the data has no error, the data is directly transferred to the boot region SBoot of SRAM. In case the data has an error, data acquired by correcting the error is transferred to the boot region SBoot of SRAM.

Next, data shown in the designation data for the automatic data transfer region in the initial automatic data transfer region IP of FLASH is transferred to an initial automatic data transfer region CIP of DRAM.

Data transfer from FLASH to DRAM by a load instruction will be described below.

A load instruction, a transfer initiation address and transfer data size (one page) are written to the control register DREG via the SDRAM interface (SDRAM IF). Then, the control circuit CHIP2 (CTL_LOGIC) reads data in the main data region FM of FLASH and transfers data for one page to the copy region of DRAM according to the memory map set by the memory management unit MU. When data is read from FLASH, it is checked by the error correcting circuit ECC whether data in FLASH has an error or not, and if the data has no error, the data is directly transferred to the copy region CP of DRAM. In case the data has an error, data acquired by correcting the error is transferred to the copy region CP of DRAM.

Data transfer from DRAM to FLASH by a store instruction will be described below.

A store instruction, a transfer initiation address and transfer data size (one page) are written to the control register DREG via the SDRAM interface (SDRAM IF). Then, the control circuit CHIP2 (CTL_LOGIC) reads data in the copy region of DRAM and transfers data for one page to the main data region of FLASH according to the memory map set by the memory management unit MU.

When data is written to FLASH, the address replacement circuit REP checks whether the writing succeeds or not and if the writing succeeds, the circuit finishes the processing. When the writing fails, the address replacement circuit selects an address in the replacement region FREP of FLASH and writes data.

Next, reading data from DRAM will be described.

When an address in the bank 0 (BANK0) of DRAM in which data in the main data region of FLASH is held and a read instruction are input via the SDRAM interface (SDRAM IF), the address in the bank 0 (BANK0) of DRAM is selected and the data can be read.

That is, data in FLASH can be read at the same speed as that of DRAM. As for the other banks (the bank 1, the bank 2, the bank 3), data can be similarly read.

Next, writing data to DRAM will be described.

When an address in the bank 1 (BANK1) of DRAM and a write instruction are input via the SDRAM interface (SDRAM IF), the address in the bank 1 (BANK1) of DRAM is selected and data can be written. As the data in the bank 1 (BANK1) of DRAM can be rewritten to FLASH by a store instruction if necessary, data in FLASH can be written at the same speed as that of DRAM. As for the other banks (the bank 3, the bank 2, the bank 0), data can be similarly written.

FIG. 3(a) and FIG. 3(b) show initial sequences when power is turned on of CHIP2 (CTL_LOGIC). First, FIG. 3(a) will be described.

For a period (PON) of T1, power is turned on and for a period (RST) of T2, a reset is made. For the next period (BLD) of T3 in which the reset is released, data in the initial program region FBoot of FLASH is transferred to the boot region SBoot of SRAM. For a period (DINIT) of T4, DRAM is initialized and for a period (ALD) of T5, data in the initial automatic data transfer region IP of FLASH is transferred to the initial automatic data transfer region CIP of DRAM. After transfer to the initial automatic data transfer region CIP is started, the refresh control circuit REF performs auto-refreshment. After transfer to the initial automatic data transfer region CIP is finished, a data transfer completion flag showing that the transfer is completed is written to the control register DREG. For a period (IDLE) of T6 and later, DRAM is turned idle and access can be accepted via the SDRAM interface (SDRAM IF) of the information processing device CHIP4 (MS). When an auto-refresh instruction is input from the information processing device CHIP4 (MS) for a period (AREF) of T7, CHIP2 stops auto-refreshment by the refresh control circuit REF and data-hold by refresh operation automatically proceeds to refresh control from the information processing device CHIP4 (MS).

As described above, access from the information processing device CHIP4 (MS) is enabled without being conscious of refresh control from the inside of CHIP2 (CTL_LOGIC).

In FIG. 3(b), for a period of T6, the refresh control circuit REF turns DRAM a self-refresh state according to a self-refresh instruction. Data transferred to DRAM for a period (ALD) of T5 can be held with small power by turning DRAM the self-refresh state.

In the self-refresh state, data can be held with smaller power than that in normal auto-refresh operation. When a self-refresh release instruction from the information processing device CHIP4 (MS) for releasing the self-refresh state is input for a period (SREX) T7, the self-refresh state is released, for a period (IDLE) of T8 and later, DRAM is turned idle, and access for reading or writing data can be accepted. Data-hold by refresh operation automatically proceeds to control from the information processing device CHIP4 (MS).

In case refresh control select data in the initial program region FBoot of FLASH is at a high level, a sequence shown in FIG. 3A is executed and in case refresh control select data is at a low level, a sequence shown in FIG. 3B is executed. An input terminal PSQ only for selecting refresh control may be also provided so that in case the input terminal PSQ is connected to a power terminal, the initial sequence shown in FIG. 3A can be selected and in case the input terminal PSQ is connected to an earth terminal, the initial sequence shown in FIG. 3B can be selected.

Figure 3:
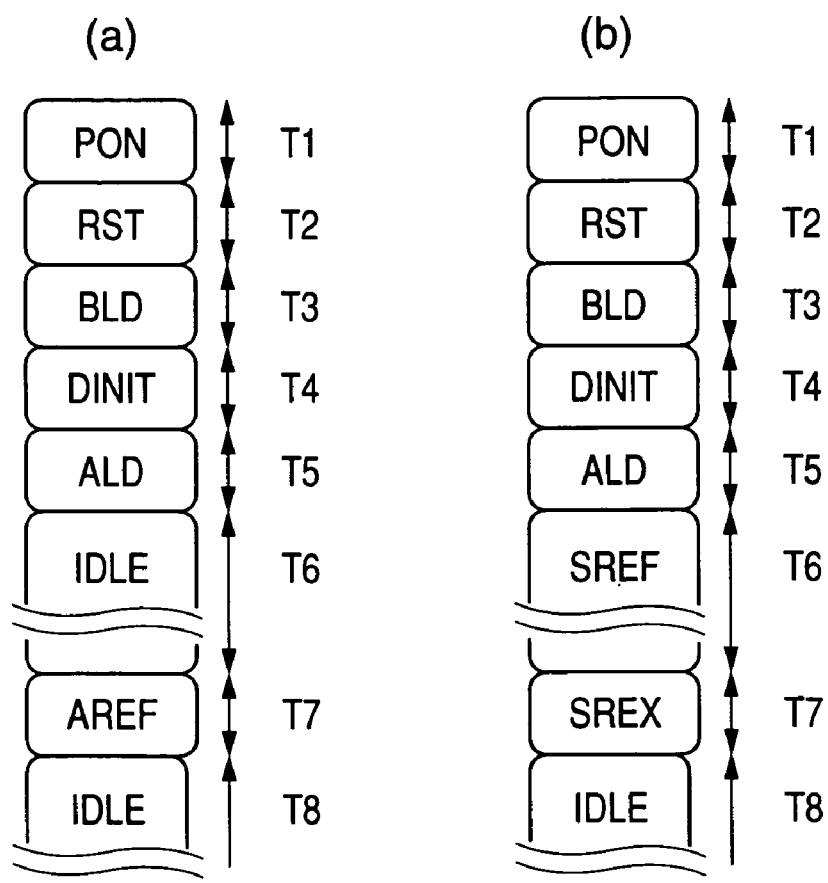
FIG. 3 show one example of the operation when power is turned on of the memory system to which the invention is applied.
Figure 4:
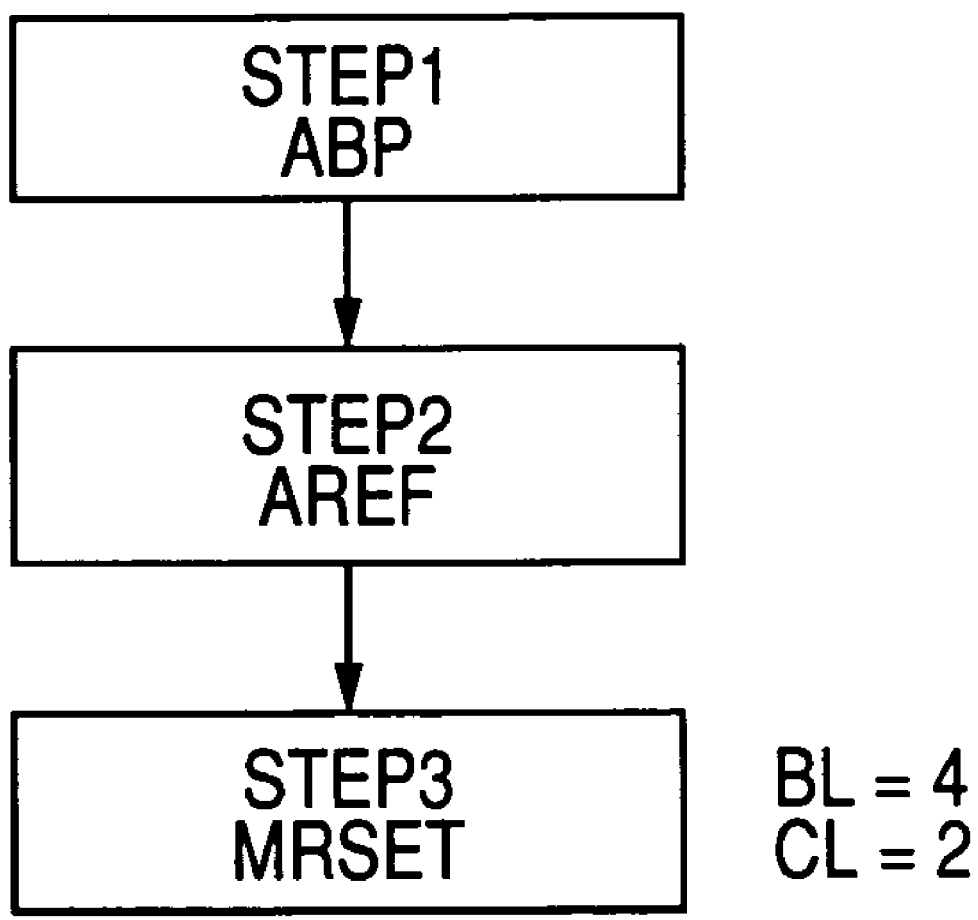
FIG. 4 shows one example of the initialization when power is turned on of DRAM of the memory system to which the invention is applied.

FIG. 4 is a flow chart showing one example of initialization applied to general purpose SDRAM for the period (DINT) of T4 shown in FIG. 3. In initializing DRAM, precharge is applied to all banks of DRAM (STEP1: ABP), next, auto-refreshment is applied (STEP2: AREF), and finally, a mode register is set (STEP3: MRSET). Though the following are not particularly limited, an example that burst length (BL) is set to 4 and CAS latency (CL) is set to 2 in setting the mode register (STEP3: MRSET) is shown.

Figure 5:
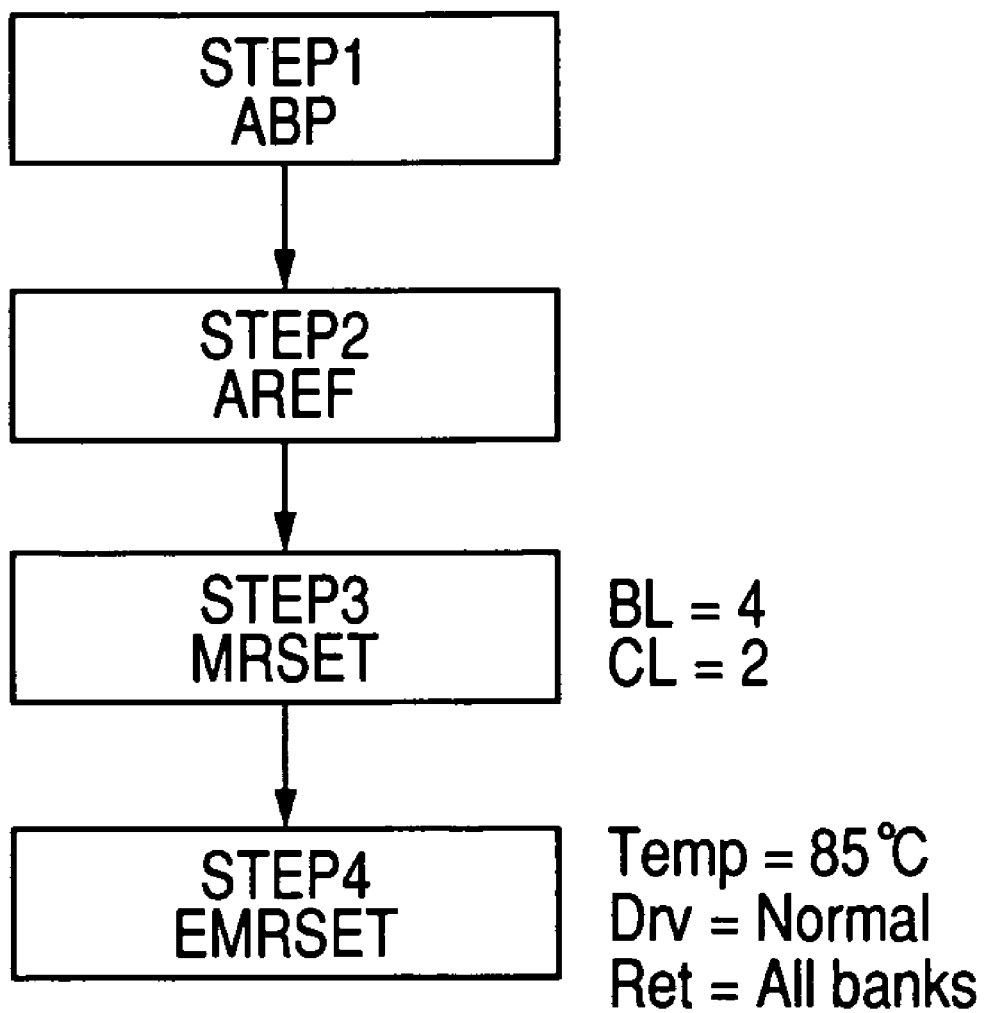
FIG. 5 shows one example of the initialization when power is turned on of DRAM of a memory module to which the invention is applied.

FIG. 5 is a flow chart showing one example of initialization applied for the period (DINT) of T4 to SDRAM which is acquired by adding an extended mode register EMREG to conventional type general purpose SDRAM and in which a change of a data-hold region in self-refreshing, a change of maximum guarantee temperature and a change of the driveability of an output buffer are enabled.

In the initialization of this DRAM, precharge is applied to all banks of DRAM (STEP1: ABP) and next, auto-refreshment is executed (STEP2: AREF). A mode register is set (STEP3: MRSET) and finally, an extended mode register is set (STEP4: EMRSET). The following are not particularly limited, however, there is shown an example that in setting the mode register (STEP3: MRSET), burst length (BL) is set to 4, CAS latency (CL) is set to 2, in setting the extended mode register (STEP4: EMRSET), all banks are set as the data-hold region of DRAM in self-refreshing (Ret=All banks), maximum guarantee temperature is set to 85° C. (Temp=85° C.), and the driveability of the output buffer is set to a normal value (Drv=Normal).

Figure 6:
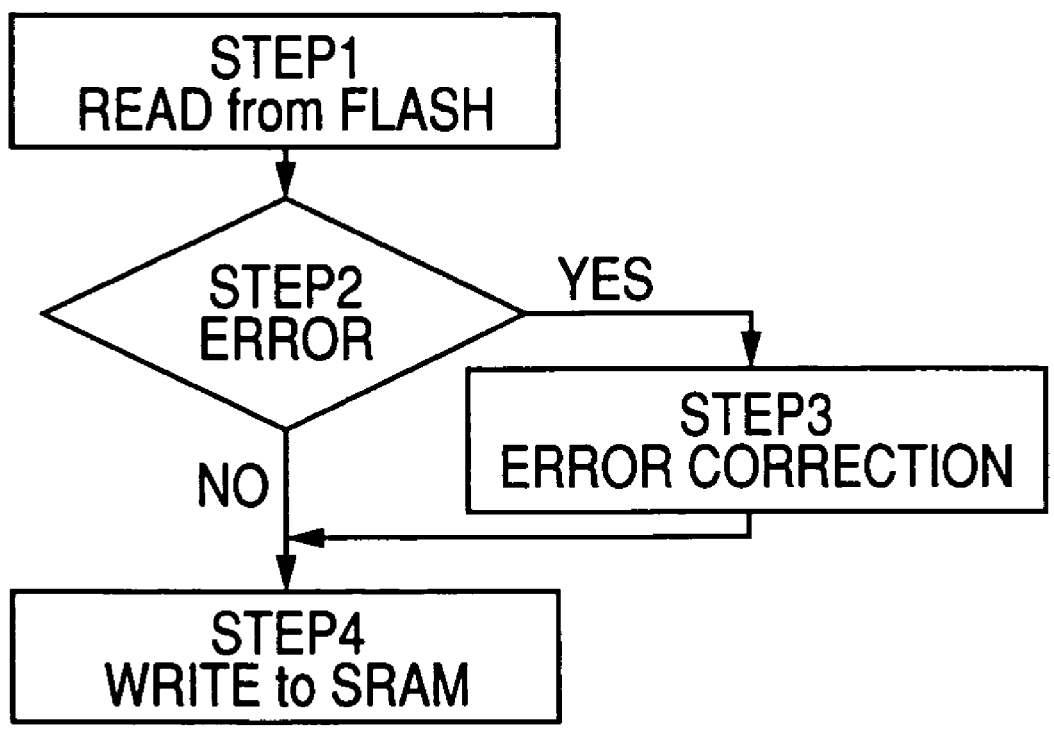
FIG. 6 shows the flow of data transfer operation when power is turned on from FLASH to SRAM in the memory system to which the invention is applied.

FIG. 6 is a flowchart showing one example of data transfer from FLASH to SRAM executed for the period (BLD) of T3 shown in FIG. 3 after power is turned on. After power is turned on, the control circuit CHIP2 reads data in the initial program region FBoot from FLASH (STEP1). The control circuit checks whether the read data has an error or not (STEP2), corrects the error if the data has an error (STEP3), and directly transfers the data to the boot region SBoot of SRAM in case the data has no error (STEP4).

Figure 7:
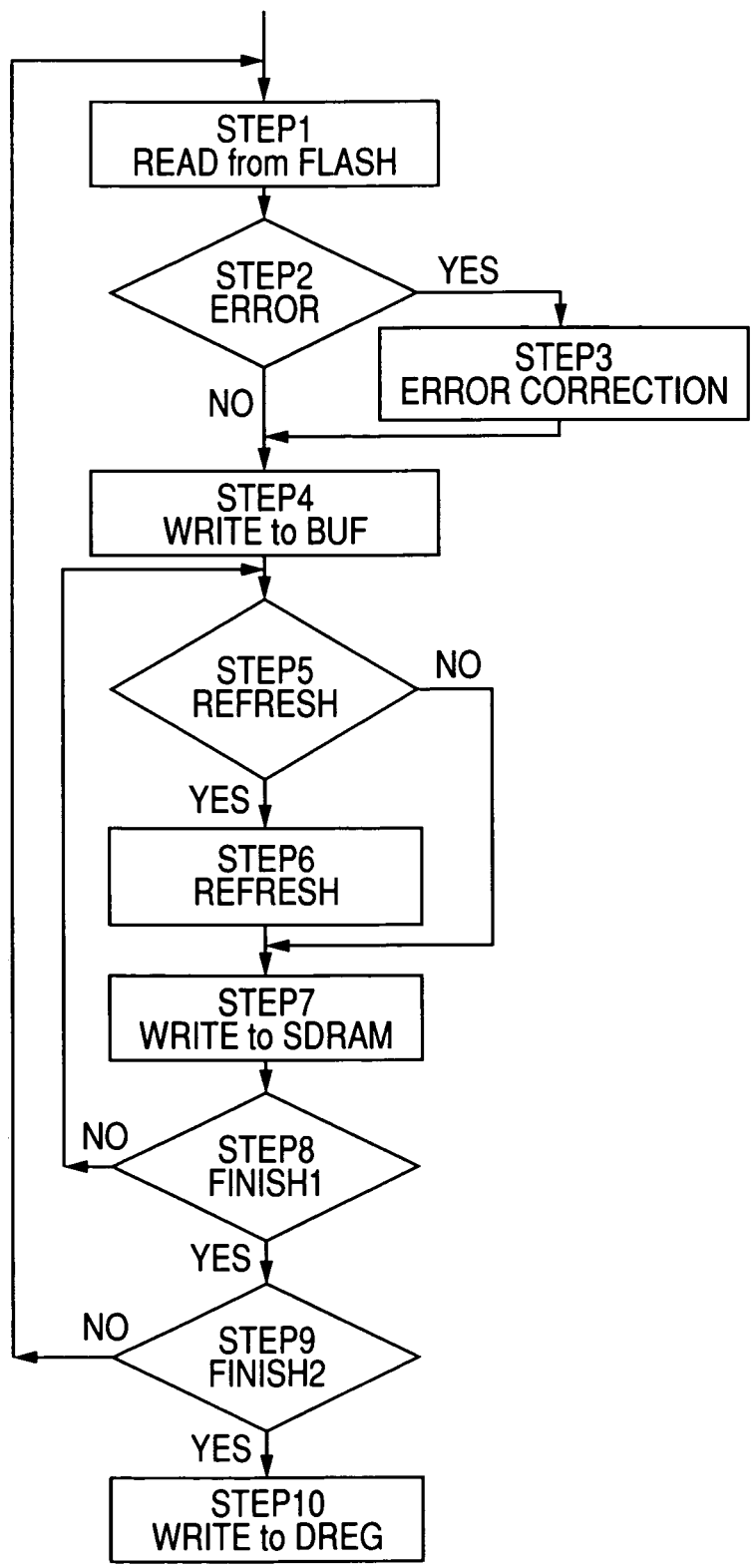
FIG. 7 shows the flow of data transfer operation when power is turned on from FLASH to DRAM in the memory system to which the invention is applied.

FIG. 7 is a flowchart showing one example of data transfer from the initial automatic data transfer region IP of FLASH to the initial automatic data transfer region CIP of DRAM executed for the period (ALD) of T5 shown in FIG. 3 after power is turned on. After power is turned on, the control circuit CHIP2 reads data from FLASH (STEP1). The control circuit checks whether the read data has an error or not (STEP2), corrects the error if the data has an error (STEP3), and directly transfers the data to the data buffer BUF in case the data has no error (STEP4).

When the data written to the data buffer BUF is written to DRAM, it is checked whether a refresh request is made to DRAM or not (STEP5), if the refresh request is made, refresh operation is executed (STEP6), and afterward, the data is written to DRAM (STEP7). In case no refresh request is made, the data is written to DRAM promptly (STEP7). It is checked whether all data in the data buffer BUF are written to DRAM or not (STEP8) and if not all of data are written, STEP5 to STEP8 are repeated. Next, it is checked whether data in the initial automatic data transfer region IP of FLASH are all written to DRAM or not (STEP9). In case not all of data are written, STEP1 to STEP9 are repeated. If data in the initial automatic data transfer region IP of FLASH are all written to DRAM, a value showing that the data transfer is completed is written to the control register DREG (STEP10).

The refresh control circuit REF issues an auto-refresh instruction to DRAM after the initialization of DRAM for the period (ALD) of T5 shown in FIG. 3 and holds data in DRAM until an auto-refresh instruction or a self-refresh instruction is input from the information processing device CHIP4 (MS).

Figure 8:
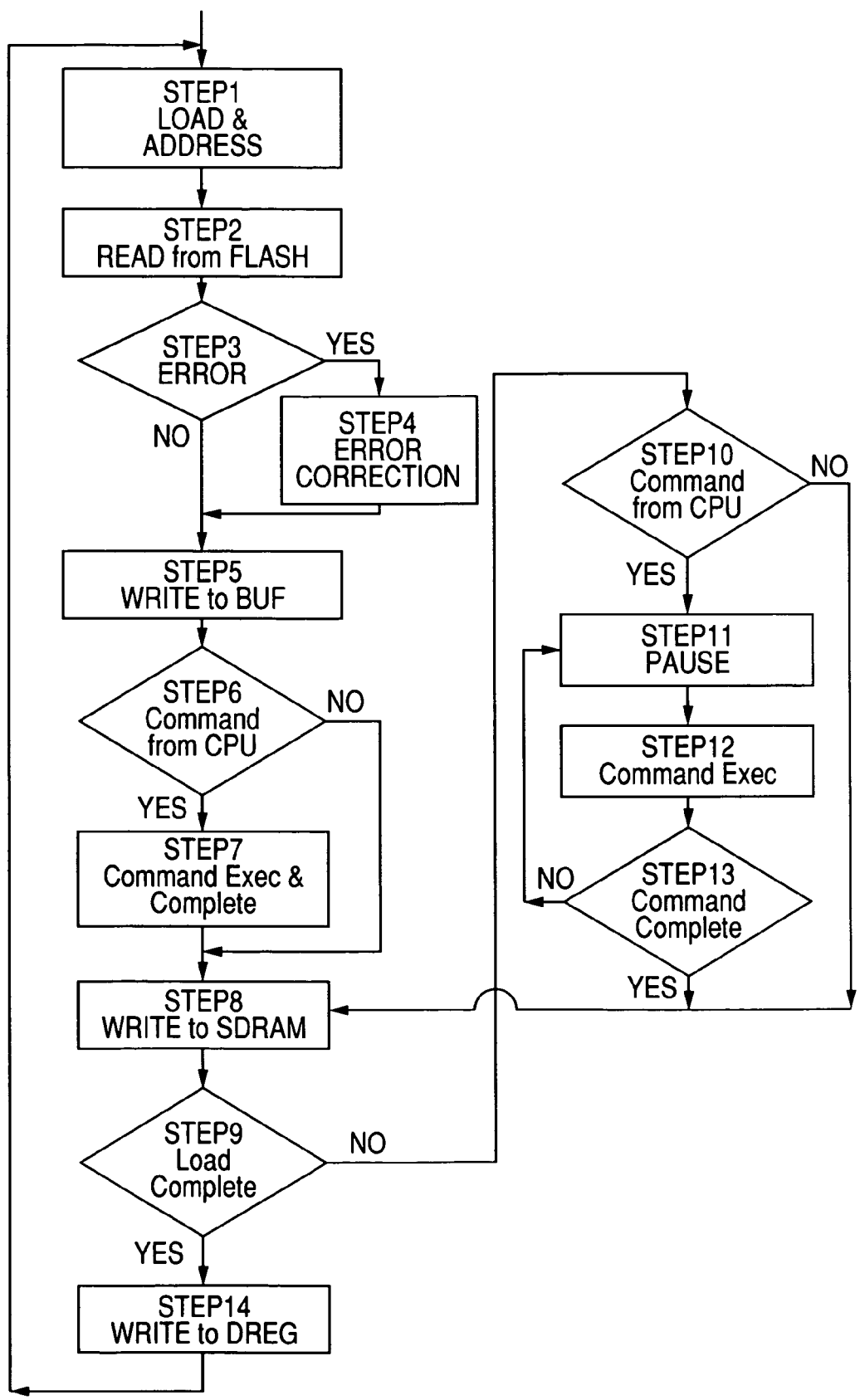
FIG. 8 is a flowchart showing the flow of data transfer operation from FLASH to DRAM in the memory system according to the invention.

FIG. 8 is a flowchart showing data transfer from FLASH to DRAM executed according to a load instruction.

When a load instruction and an address are input to CHIP2 (CTL_LOGIC) from the information processing device CHIP4 (MS) (STEP1), data corresponding to the input address is read from FLASH (STEP2). It is checked whether the read data has an error or not (STEP3), if the data has an error, the error is corrected (STEP4), and data after correction is written to the data buffer BUF (STEP5). In case the data has no error, the data is directly written to the data buffer BUF (STEP5).

Before the data written to the data buffer BUF is written to DRAM, it is checked whether a read instruction, a write instruction or a refresh instruction is issued from the information processing device CHIP4 (MS) to DRAM or not (STEP6), if such an instruction is issued, the instruction is executed (STEP7), and afterward, writing data to DRAM is started (STEP8). In case no instruction is issued, writing the data to DRAM is started promptly (STEP8).

Next, it is checked whether data are all written from the data buffer BUF to DRAM or not (STEP9). In case not all of data are written, that is, during writing, it is checked whether a read instruction, a write instruction or a refresh instruction is issued from the information processing device CHIP4 (MS) to DRAM or not (STEP10), if such an instruction is issued, write operation from the data buffer BUF to DRAM is temporarily halted (STEP11), and the instruction is executed (STEP12). It is checked whether the instruction is finished or not (STEP13) and if the instruction is not finished, STEP11 and STEP13 are repeated. In case the instruction is finished, write operation from the data buffer BUF to DRAM is restarted (STEP8). When data are all written from the data buffer BUF to DRAM, a value showing that the data transfer is finished is written to the control register DREG (STEP14).

Figure 9:
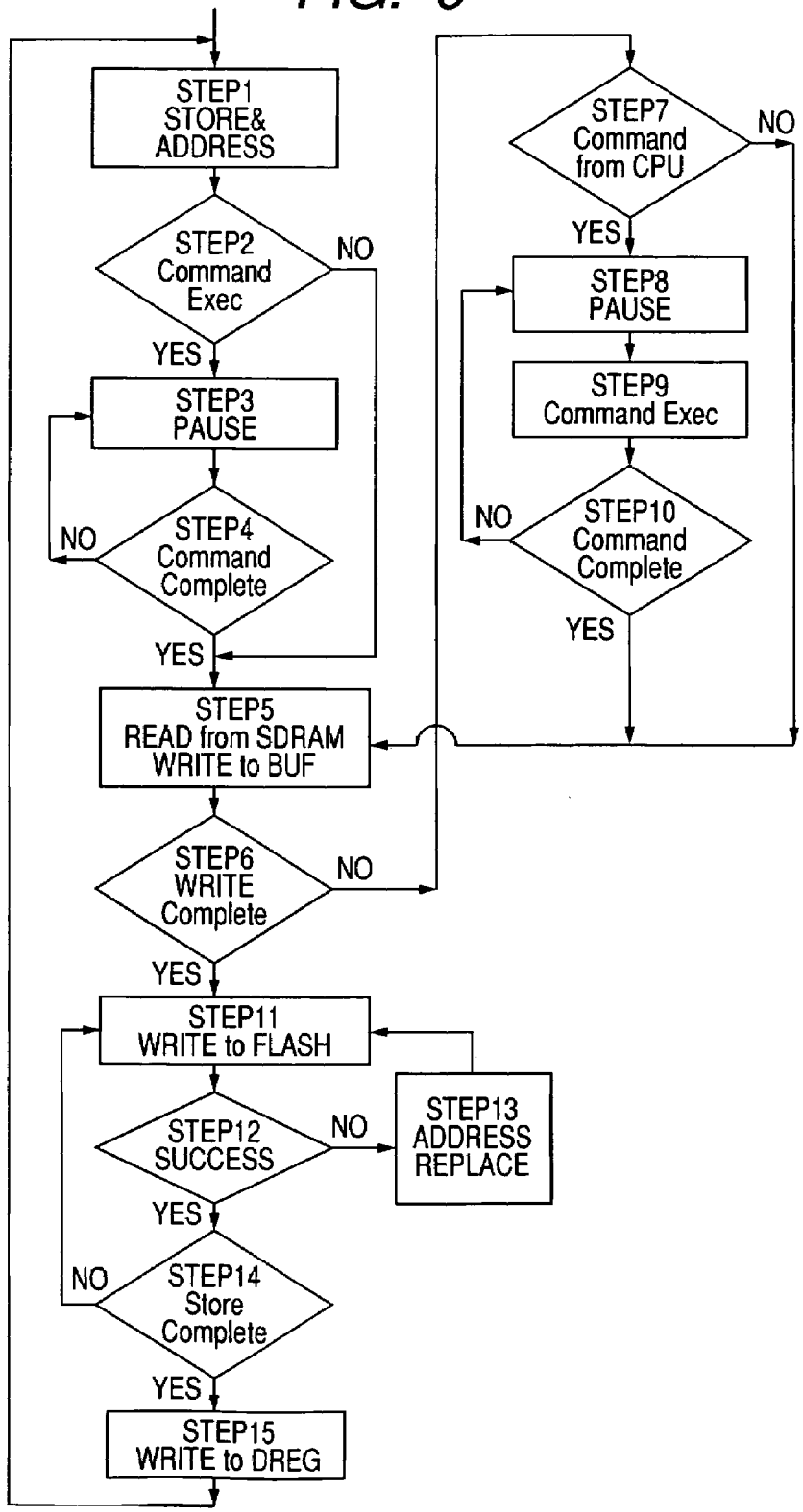
FIG. 9 is a flowchart showing the flow of data transfer operation from DRAM to FLASH in the memory system according to the invention.

FIG. 9 is a flowchart showing data transfer from DRAM to FLASH executed by a store instruction.

When a store instruction and an address are input from the information processing device CHIP4 (MS), CHIP2 takes a procedure for reading data from DRAM according to the store instruction inside (STEP1). Before reading data from DRAM according to the store instruction is started, it is checked whether a read instruction, a write instruction or a refresh instruction is issued from the information processing device CHIP4 (MS) or not (STEP2). In case no instruction is issued, reading data from DRAM according to the store instruction is started (STEP5).

In case such an instruction is issued, the execution of the store instruction is temporarily halted (STEP3) and it is checked whether the currently executed instruction is completed or not (STEP4). In case the execution of the instruction is not completed, the execution of the store instruction is halted (STEP3). If the execution of the instruction is completed, reading data from DRAM according to the store instruction is started and the data read from DRAM is written to the data buffer BUF (STEP5).

It is checked whether writing the data read from DRAM according to the store instruction to the data buffer BUF is finished or not (STEP6). When writing is not finished and writing is continued, it is checked whether a read instruction, a write instruction or a refresh instruction is issued from the information processing device CHIP4 (MS) or not (STEP7), in case such an instruction is issued, the read operation of data from DRAM is temporarily halted (STEP8), and the instruction is executed (STEP9).

It is checked whether the instruction is finished or not (STEP10), if the instruction is not finished, STEP8 and STEP10 are repeated, in case the instruction is finished, read operation from DRAM is restarted, and read data is written to the data buffer BUF (STEP5).

When the data in the data buffer BUF is written to FLASH (STEP11), the data read from DRAM and transferred to the data buffer BUF is written to FLASH.

It is checked whether the writing to FLASH succeeds or not (STEP12), in case the writing fails, another address for replacement is selected (STEP13), and writing to FLASH (STEP11) is executed again. In case the writing succeeds, it is checked whether data transfer according to the store instruction is completed or not (STEP11), if the data transfer is not completed, writing to FLASH (STEP11) is continued, and in case the data transfer is completed, a value showing that the data transfer is finished is written to the control register DREG (STEP15).

Figure 10:
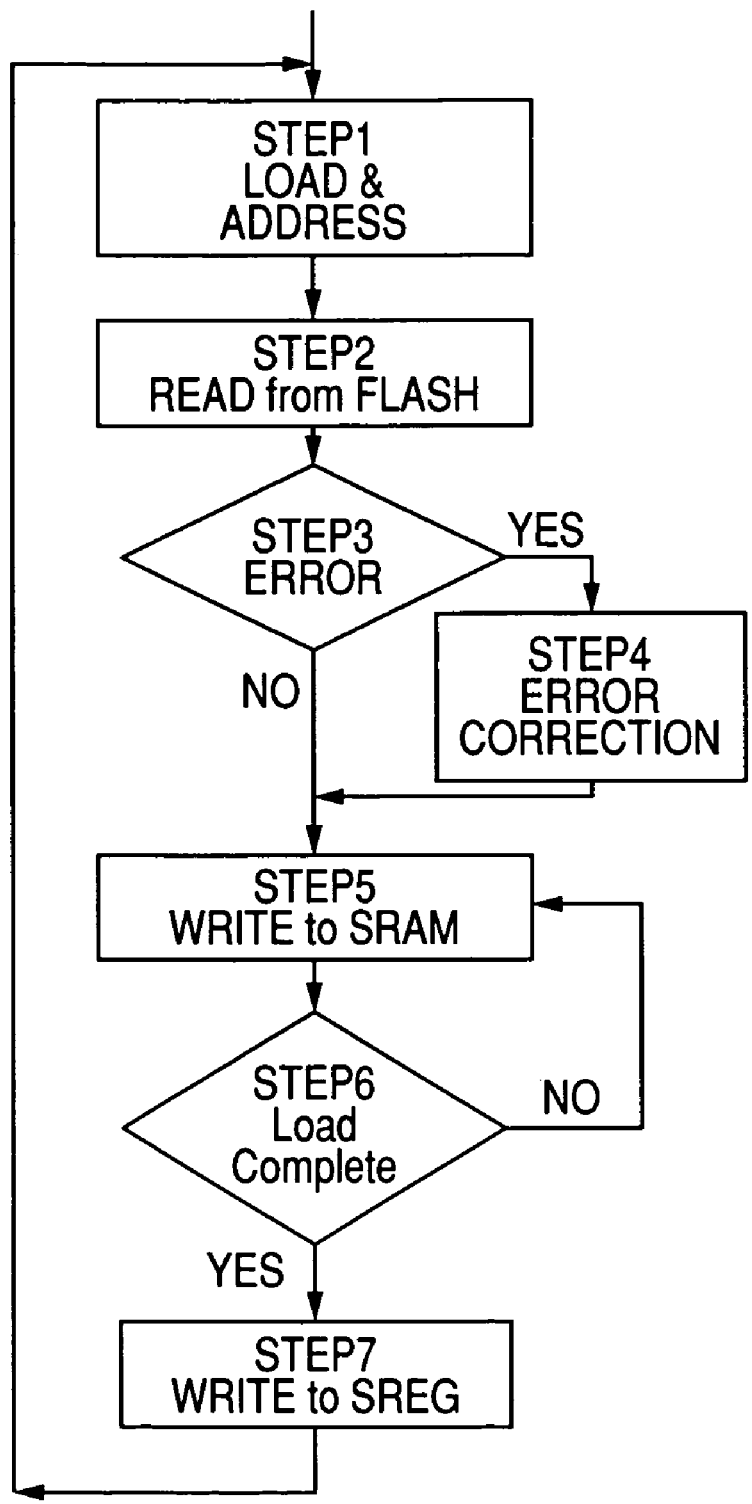
FIG. 10 is a flowchart showing the flow of data transfer operation from FLASH to SRAM in the memory system according to the invention.

FIG. 10 is a flowchart showing data transfer from FLASH to SRAM executed according to a load instruction (SLoad).

When a load instruction and an address are input to CHIP2 from the information processing device CHIP4 (MS) (STEP1), data corresponding to the input address is read from FLASH (STEP2). It is checked whether the read data has an error or not (STEP3), if the data has an error, the error is corrected (STEP4), and data after correction is written to SRAM (STEP5). In case the data has no error, the data is directly written to SRAM (STEP5).

It is checked whether writing to SRAM according to the load instruction is finished or not (STEP6), if the writing is not finished, STEP5 and STEP6 are repeated. In case the writing is completed, a value showing that data transfer is finished is written to the control register SREG (STEP7).

Figure 11:
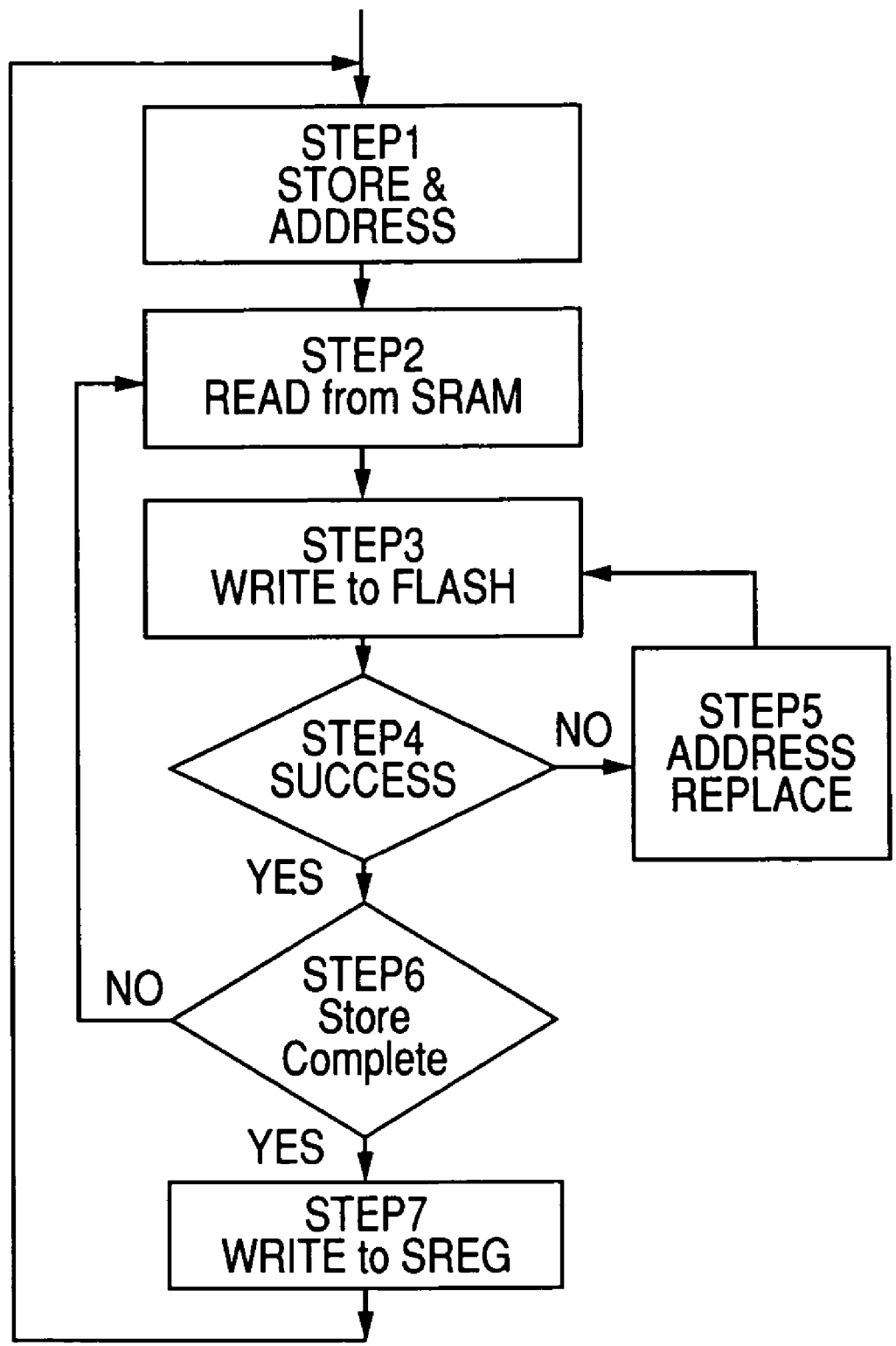
FIG. 11 is a flowchart showing the flow of data transfer operation from SRAM to FLASH in the memory system according to the invention.

FIG. 11 is a flowchart showing data transfer from SRAM to FLASH executed according to a store instruction.

When a store instruction and an address are input to CHIP2 from the information processing device CHIP4 (MS) (STEP1), data is read from SRAM (STEP2), and is written to FLASH (STEP3). It is checked whether the writing to FLASH succeeds or not (STEP4), in case the writing fails, another address for replacement is selected (STEP5), and the data is written to FLASH again (STEP4). In case the writing succeeds, it is checked whether data transfer according to the store instruction is finished or not (STEP6) and if the data transfer is not completed, STEP2 to STEP6 are repeated. If the data transfer is finished, a value showing that the data transfer is finished is written to the control register SREG (STEP7).

Figure 12:
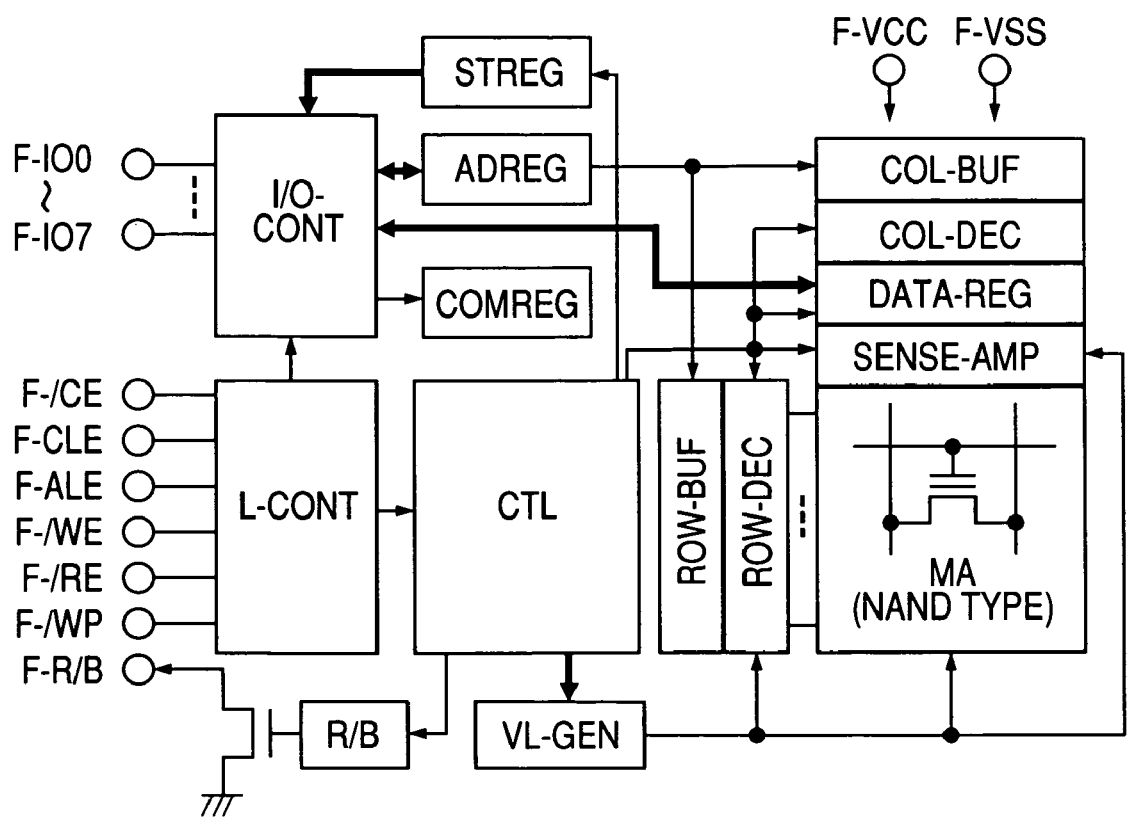
FIG. 12 is a block diagram showing one example of the configuration of FLASH shown in FIG. 1.

FIG. 12 is a block diagram showing one example of a NAND type flash memory equipped with a NAND interface (NAND IF) and used for CHIP1 (FLASH) shown in FIG. 1 and configuring this memory module MM.

The NAND type flash memory is configured by an operating logic controller L-CONT, a control circuit CTL, an input/output control circuit I/O-CONT, a status register STREG, an address register ADREG, a control register COMREG, a ready/busy circuit R/B, a high-voltage generator VL-GEN, a row address buffer ROW-BUF, a row address decoder ROW-DEC, a column buffer COL-BUF, a column decoder COL-DEC, a data register DATA-REG, a sense amplifier SENSE-AMP and a memory array MA.

The operation of CHIP1 (FLASH) is similar to that of a NAND type flash memory used generally heretofore.

Figure 13:
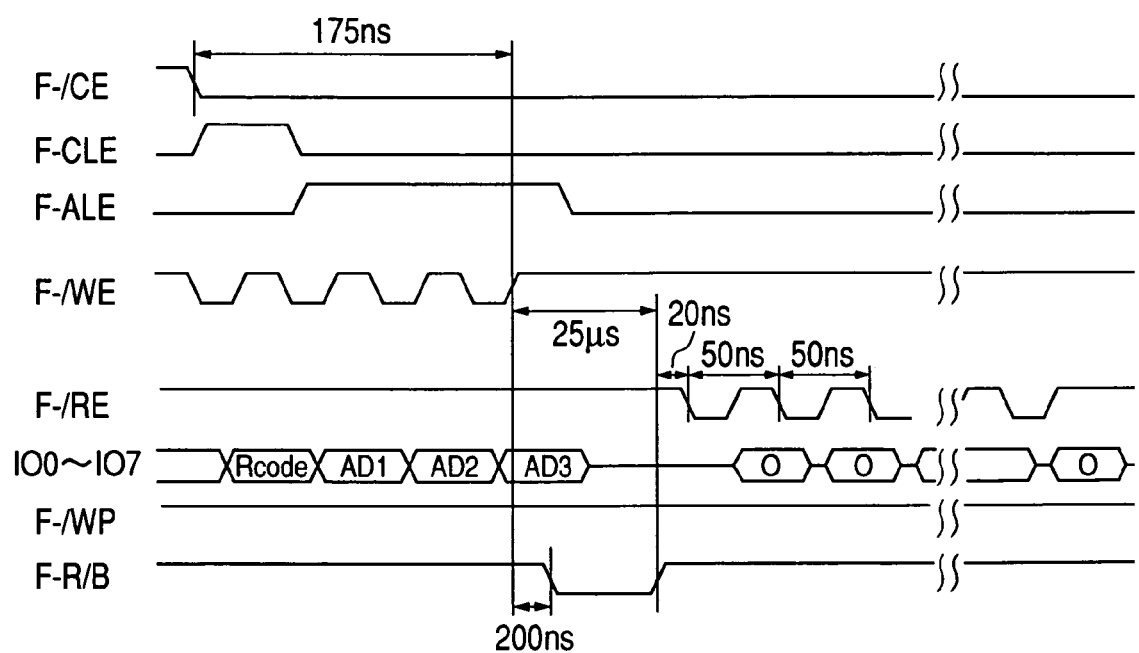
FIG. 13 is a timing chart showing one example of reading data from FLASH shown in FIG. 1.

FIG. 13 shows data read operation from the NAND type flash memory configuring CHIP1. When a chip enable signal F-/CE is turned at a low level, a command latch enable signal F-CLE is turned at a high level and a write enable signal F-/WE is activated, a read instruction code Rcode is input in the form of input/output signals F-I00 to F-I015. Afterward, an address latch enable signal F-ALE is turned at a high level and a page address is input in the form of the input/output signals F-I00 to F-I07 at second, third and fourth leading edges of the write enable signal F-/WE.

Data for one page corresponding to the input page address is transferred from a memory array MA to a data register DATA-REG. While the data is transferred from the memory array MA to the data register DATA-REG, the flash memory is turned busy and the ready/busy circuit R/B turns a ready/busy signal F-R/B at a low level. When data transfer is finished, data in the data register DATA-REG is read in order by 8 bits in synchronization with a trailing edge of the read enable signal F-/RE and is output in the form of the input/output signals F-I00 to F-I07.

Figure 14:
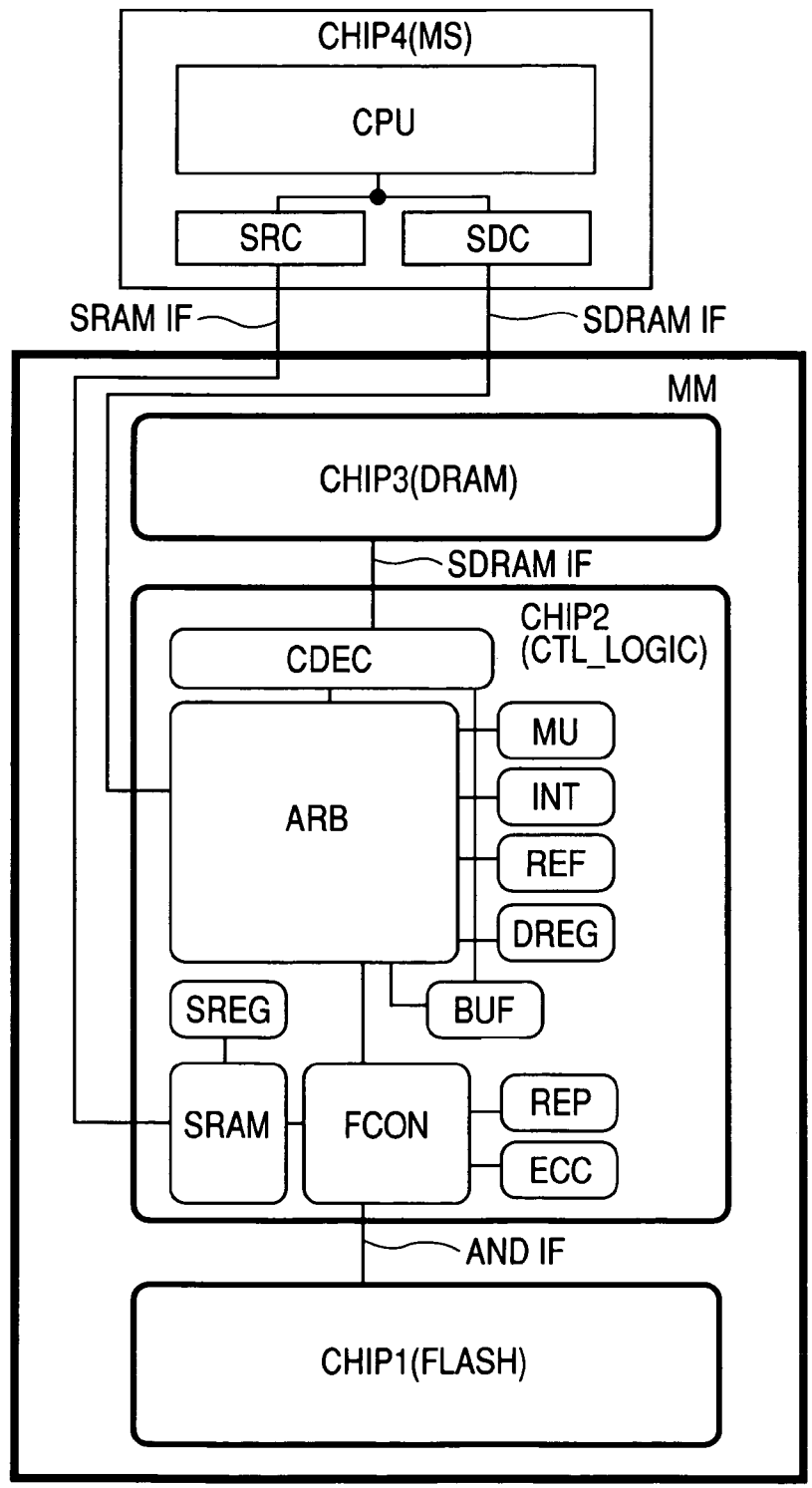
FIG. 14 is a block diagram showing the memory system to which the invention is applied.

FIG. 14 shows an example of the configuration in case an AND type flash memory equipped with an AND interface (AND IF) is used for CHIP1 (FLASH) of this memory module MM. In case the AND type flash memory equipped with the AND interface (AND IF) is used, this memory system can be also implemented.

Figure 15:
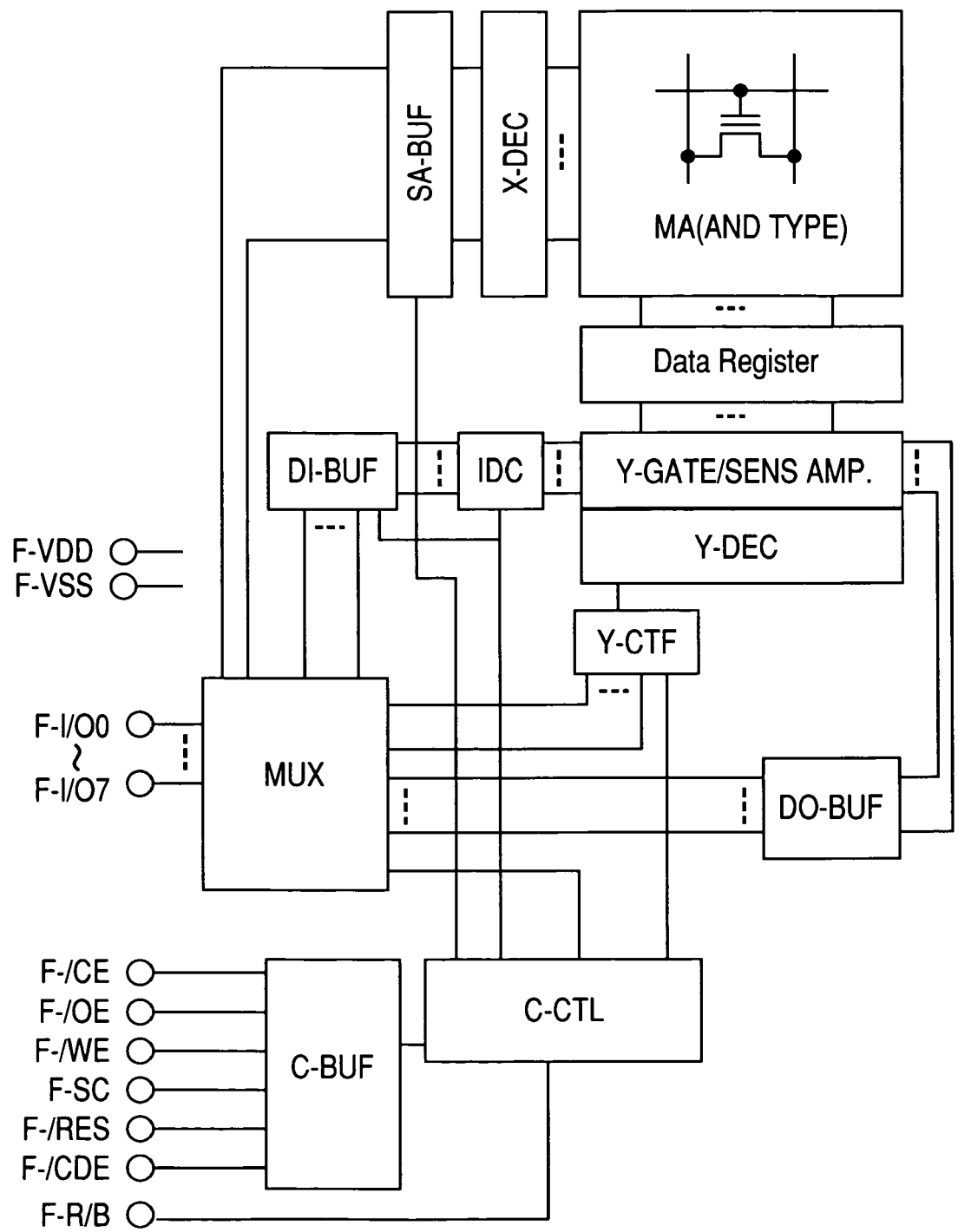
FIG. 15 is a block diagram showing one example of the configuration of FLASH shown in FIG. 14.

FIG. 15 is a block diagram showing an AND flash memory used for CHIP1 in this memory module.

CHIP1 (FLASH) which is the AND type flash memory is configured by a control signal buffer C-BUF, a command controller C-CTL, a multiplexer MUX, a data input buffer DI-BUF, an input data controller IDC, a sector address buffer SA-BUF, an X decoder X-DEC, a memory array MA (AND TYPE), a Y address counter Y-CTF, a Y decoder Y-DEC, a sense amplifier Y-GATE/SENS AMP, a data register Data Register and a data output buffer DO-BUF. The operation of CHIP1 is similar to that of an AND type flash memory used generally heretofore. The memory module in this embodiment can be configured by CHIP1 (FLASH).

Figure 16:
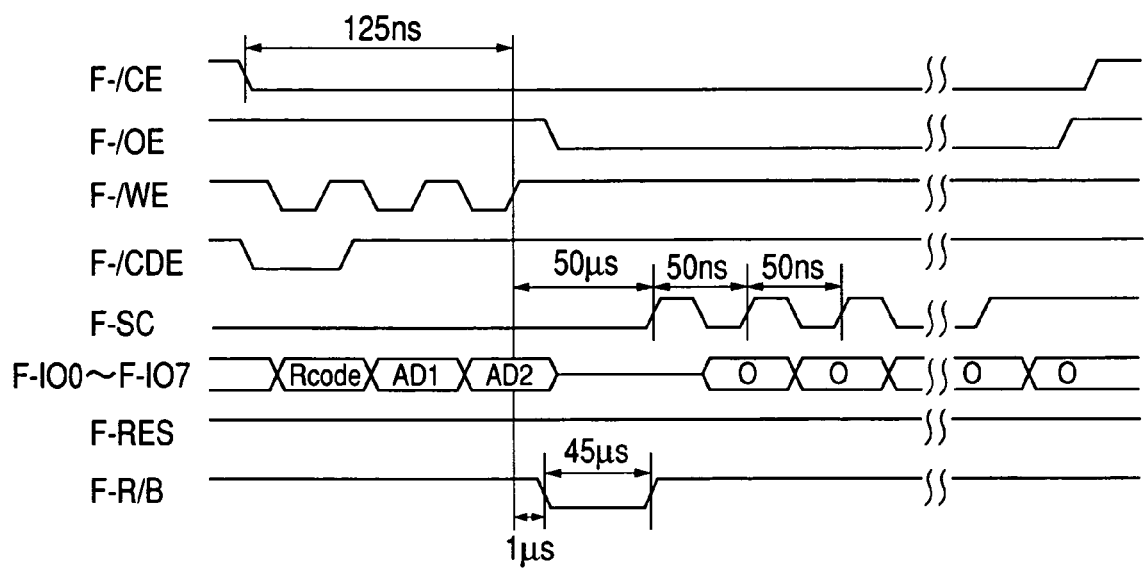
FIG. 16 is a timing chart showing one example of reading data from FLASH shown in FIG. 14.

FIG. 16 shows data read operation from the AND type flash memory configuring CHIP1.

When a chip enable signal F-/CE is turned at a low level, a command data enable signal F-CDE is turned at a low level and a write enable signal F-/WE is activated, a read instruction code Rcode is input in the form of input/output signals F-I00 to F-I07. A sector address is input in the form of the input/output signals F-I00 to F-I07 at second and third leading edges of the write enable signal F-/WE.

Data for one page corresponding to the input sector address is transferred from the memory array MA to the data register Data Register. While the data is transferred from the memory array MA (AND TYPE) to the data register Data Register, FLASH is turned busy and F-R/B turns a ready/busy signal at a low level. When the data transfer is finished, data in the data register DATA-REG is read in order by 8 bits in synchronization with a leading edge of a serial clock signal F-SC and is output in the form of the input/output signals F-I00 to F-I07.

As described above, in the memory module according to the invention, the information processing device CHIP4 (MS) can activate itself promptly with boot program data by following a method of providing the SRAM interface and the SDRAM interface and automatically transferring the boot program data in CHIP1 (FLASH) to SRAM immediately after power is turned on. Further, as prompt access to the memory module MM is enabled when the information processing device CHIP4 (MS) is activated by automatically transferring data in CHIP1 (FLASH) to CHIP3 (DRAM) while the information processing device CHIP4 (MS) activates itself, the performance can be enhanced.

As data transfer between CHIP1 (FLASH) and CHIP3 (DRAM) by a load instruction and a store instruction can be executed in the background, necessary data can be transferred to CHIP3 (DRAM) or to CHIP1 (FLASH) in advance by necessary time without being conscious of access from the outside of the memory module and the invention can correspond to the enhancement of the performance and the function of a mobile device.

Data in FLASH can be read at the similar speed to that of DRAM by securing a region in which the data in CHIP1 (FLASH) can be copied in CHIP3 (DRAM) and transferring data from CHIP1 (FLASH) to CHIP3 (DRAM) in advance immediately after power is turned on or by a load instruction. As data is once written to DRAM when it is written to FLASH and can be rewritten to FLASH by a store instruction if necessary, the write speed of data is also similar to that in DRAM.

As inside the memory module MM, the detection and the correction of an error are performed in reading from FLASH and a defective address to which data is not correctly written is replaced in writing, the processing is enabled at high speed and the reliability can be kept.

As a program in CHIP1 (FLASH) can be changed via the buffer region of SRAM and the contents of a program can be read and verified via the buffer region of SRAM, the invention can flexibly correspond to a request of a mobile device.

Further, as large-capacity DRAM is used, the large-capacity work region can be also secured in addition to the region in which data in FLASH can be copied and the invention can correspond to the enhancement of the function of a mobile device.

SECOND EMBODIMENT

Figure 17:
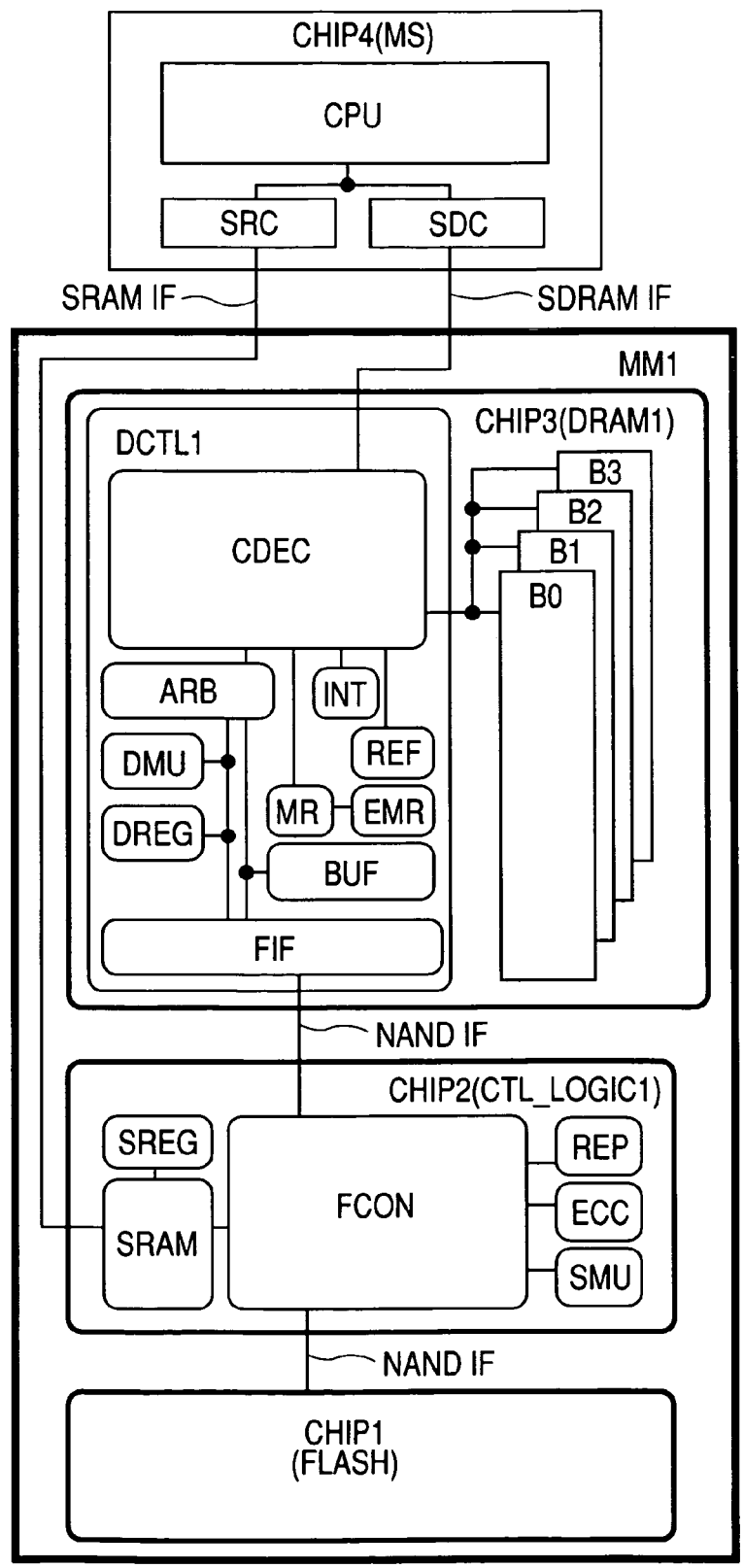
FIG. 17 is a block diagram showing a memory system to which the invention is applied.

FIG. 17 shows a second embodiment to which the invention is applied. Detailedly, FIG. 17 shows the embodiment of a memory system configured by a memory module MM1 and an information processing device CHIP4 (MS). Each will be described below.

The memory module MM1 is configured by CHIP1 (FLASH), CHIP2 (CTL_LOGIC1) and CHIP3 (DRAM1).

CHIP1 (FLASH) is a non-volatile memory and will be described as a large-capacity flash memory equipped with a NAND interface (NAND IF) though the above-mentioned is not particularly limited below. CHIP1 (FLASH) has large memory size of approximately 128 Mbits, read time (time since a request for reading is made until data is output) is approximately 25 to 100 µs and is relatively slow.

CHIP3 (DRAM1) is DRAM equipped with an interface for data transfer to/from CHIP2 (CTL_LOGIC1) and an interface for data transfer to/from the information processing device CHIP4 (MS).

The interface for data transfer to/from the information processing device CHIP4 (MS) has two types of an asynchronous DRAM interface and a synchronous DRAM interface and both interfaces can be used for the memory module MM1. In this embodiment, an SDRAM interface (SDRAM IF) which is the synchronous DRAM interface and is a typical synchronous DRAM interface will be described as an example.

The interface used for data transfer between CHIP3 (DRAM1) and CHIP2 (CTL_LOGIC1) is a flash memory interface, has two types of a so-called AND interface (AND IF) and a so-called NAND interface (NAND IF), and in this embodiment, both can be used. In this embodiment, the interface for data transfer to/from CHIP3 (DRAM1) and CHIP2 (CTL_LOGIC1) will be described as the NAND interface.

Next, the configuration of CHIP3 (DRAM1) will be described. CHIP3 (DRAM1) is configured by memory banks (B0, B1, B2, B3) for holding data and a control circuit DCTL1 for controlling reading and writing data from/to the memory banks. The control circuit DCTL1 is configured by a command decoder CDEC, an access arbiter ARB, a memory management unit DMU, an initialize circuit INT, a refresh control circuit REF, a data buffer BUF, a control register DREG, a mode register MR, an extended mode register EMR and a FLASH interface circuit FIF.

CHIP1 (FLASH) is divided into an initial program region and a main data region though the above-mentioned is not particularly limited, CHIP3 (DRAM1) is divided into a work region and a copy region through the above-mentioned is not particularly limited, and is managed by the memory management unit DMU so that the work region is used for a work memory when a program is executed and the copy region is used for a memory for copying data from FLASH. The memory banks B0 and B1 of CHIP3 (DRAM1) can be also allocated to the copy region and the memory banks B2 and B3 can be also allocated to the work region.

CHIP2 (CTL_LOGIC1) is configured by SRAM, a control register SREG, a flash control circuit FCON, an error detecting and correcting circuit ECC, an address replacement circuit REP and a memory management unit SMU and controls data transfer between CHIP1 (FLASH) and CHIP3 (DRAM1).

SRAM is divided into a boot program region and a buffer region though the above-mentioned is not particularly limited and is managed by the memory management unit SMU so that the boot program region is used for storing boot program data for activating the information processing device CHIP4 (MS) and the buffer region is used for a buffer memory for data transfer between CHIP1 (FLASH) and SRAM.

Data transfer between CHIP1 (FLASH) and CHIP2 (CTL_LOGIC1) is performed via the NAND interface (NAND IF) and data transfer between CHIP2 (CTL_LOGIC1) and CHIP3 (DRAM1) is performed via the SDRAM interface (SDRAM IF). Data transfer to/from the information processing device CHIP4 (MS) is performed via an SRAM interface (SRAM IF).

The information processing device CHIP4 (MS) is configured by a central processing unit (CPU), an SRAM controller SRC and a DRAM controller SDC. The SRAM controller accesses SRAM of CHIP2 (CTL_LOGIC1) via the SRAM interface (SRAM IF) to read or write data. The DRAM controller directly accesses CHIP3 (DRAM1) via the SDRAM interface (SDRAM IF) to read or write data.

As described above, in this embodiment, as the information processing device CHIP4 (MS) and CHIP3 (DRAM1) can be directly connected via the SDRAM interface (SDRAM IF) without requiring a chip between them because CHIP3 (DRAM1) is provided with the plural interfaces of the SDRAM interface (SDRAM IF) and the NAND interface (NAND IF), data can be read at higher speed.

Further, CHIP3 (DRAM1) and CHIP2 (CTL_LOGIC1) are connected via the NAND interface (NAND IF), the number of connected wires is reduced, and the cost can be reduced.

Next, the operation of this embodiment will be described.

When power is turned on, CHIP1 (FLASH), CHIP2 (CTL_LOGIC1) and CHIP3 (DRAM1) set themselves to an initial condition.

Next, the flash control circuit FCON reads data in an initial program region FBoot of CHIP1 (FLASH) and instructs the error detecting and correcting circuit ECC to check whether the data has an error or not. If the data has no error, the data is directly transferred to a boot program region SBoot of SRAM, in case the data has an error, the error is corrected, and is transferred to the boot program region of SRAM.

The information processing device CHIP4 (MS) reads boot program data stored in the boot program region of SRAM to activate itself.

Besides, the initialize circuit INT sets the mode register MR and the extended mode register EMR to a desired value as an initialization sequence of CHIP3 (DRAM1).

When the flash control circuit FCON informs CHIP3 (DRAM1) that transfer to the boot program region of SRAM is finished via the flash interface circuit FIF while the information processing device CHIP4 (MS) activates itself, CHIP3 (DRAM1) instructs the flash control circuit FCON to enable data transfer from CHIP1 (FLASH) to CHIP3 (DRAM1) via the FLASH interface circuit FIF. Afterward, the flash control circuit FCON sequentially reads data in the main data region of CHIP1 (FLASH) and instructs the error detecting and correcting circuit ECC to check whether the data has an error or not. If the data has no error, the data is directly transferred to the data buffer BUF, in case the data has an error, the error is corrected, and data after correction is transferred to the data buffer BUF via the FLASH interface circuit FIF. The command decoder CDEC sequentially transfers the data held in the data buffer BUF to the memory bank 0 (B0) allocated to the copy region. When data transfer is started, the refresh control circuit executes refresh operation to hold the data transferred to the memory bank 0 (B0).

When a load instruction is written to the control register SREG of CHIP2 (CTL_LOGIC1) from the information processing device CHIP4 (MS) via the SRAM interface (SRAM IF), data in the main data region of CHIP1 (FLASH) is transferred to the buffer region of SRAM. When a store instruction is written to the control register SREG, data in the buffer region of SRAM is transferred to the main data region of CHIP1 (FLASH).

When a load instruction is written to the control register DREG of CHIP3 (DRAM1) from the information processing device CHIP4 (MS) via the SDRAM interface (SDRAM IF), data in the main data region of CHIP1 (FLASH) is transferred to the copy region of CHIP3 (DRAM1) via CHIP2. When a store instruction is written to the control register DREG, data in the copy region of CHIP3 (DRAM1) is written to the main data region of CHIP1 (FLASH) via CHIP2 (CTL_LOGIC1).

When an instruction to read CHIP1 (FLASH) data held in the memory bank 0 (B0) of CHIP3 (DRAM1) and an address are input from the information processing device CHIP4 (MS) via the SDRAM interface (SDRAM IF), the access arbiter ARB always precedes the read instruction from the information processing device CHIP4 (MS) and stops data transfer if the data transfer between CHIP1 (FLASH) and CHIP3 (DRAM1) is performed by a load instruction or a store instruction. Afterward, the command decoder CDEC decodes the read instruction, reads data from the memory bank 0 (B0), and outputs it via the SDRAM interface.

In case the AND interface (AND IF) is used for data transfer to/from CHIP1 (FLASH) of this memory module MM1 and the AND interface (AND IF) is used for data transfer between CHIP3 (DRAM1) and CHIP2 (CTL_LOGIC1), it is needless to say that this memory system can be also implemented.

As described above, prompt access to the memory banks (B0, B1, B2, B3) is enabled by building the access arbiter ARB and the command decoder CDEC in CHIP3 (DRAM1) and CHIP1 (FLASH) data can be read at high speed. Further, as CHIP3 (DRAM1) is provided with the SDRAM interface (SDRAM IF) and the NAND interface (NAND IF), the SDRAM interface (SDRAM IF) can be directly connected to the information processing device CHIP4 (MS) and as data transfer is enabled between the information processing device CHIP4 (MS) and CHIP3 (DRAM1) without requiring a chip, data can be read at high speed.

THIRD EMBODIMENT

Figure 18:
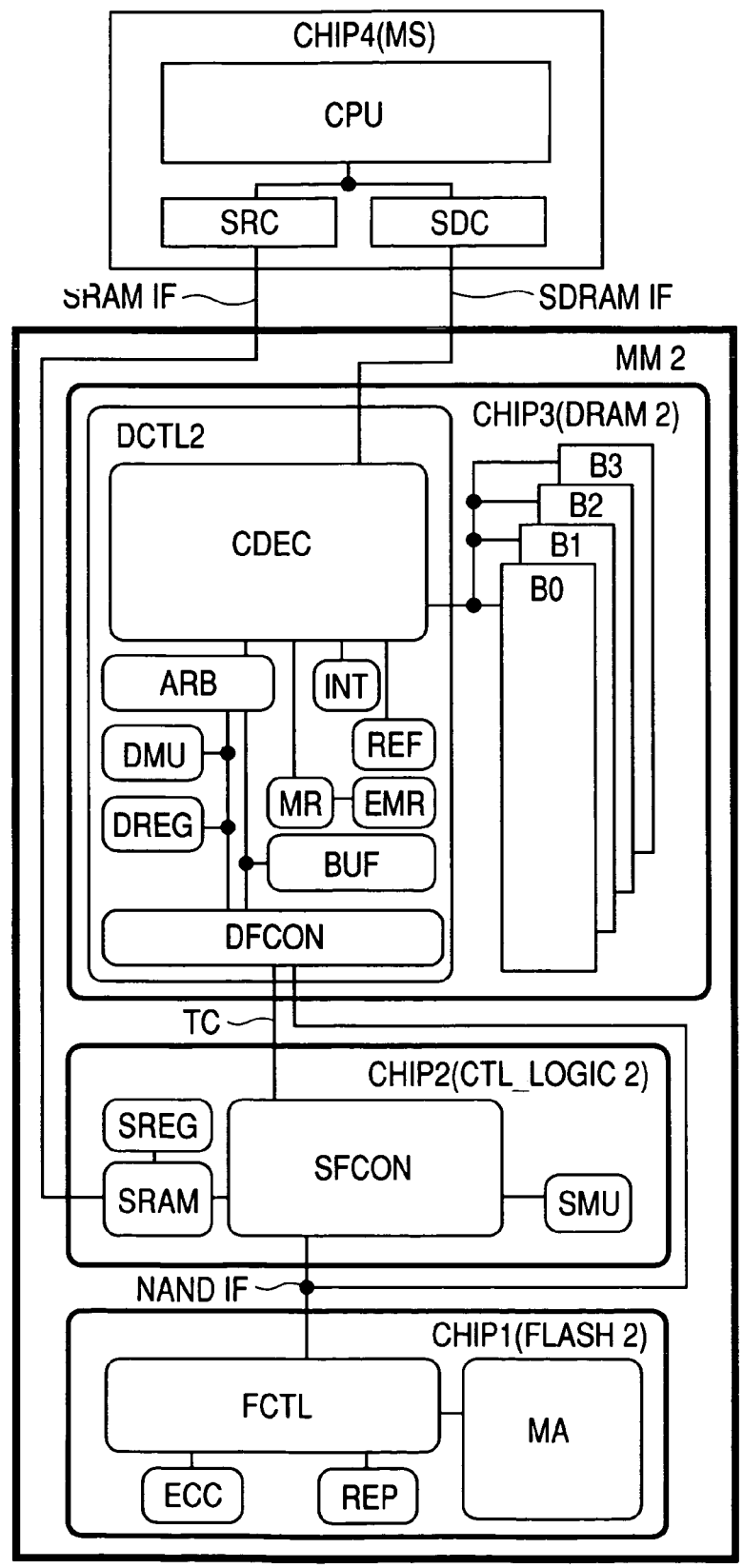
FIG. 18 is a block diagram showing a memory system to which the invention is applied.

FIG. 18 shows a third embodiment to which the invention is applied. FIG. 18 shows an embodiment of a memory system configured by a memory module MM2 and an information processing device CHIP4 (MS). Each will be described below.

The memory module MM2 is configured by CHIP1 (FLASH2), CHIP2 (CTL_LOGIC2) and CHIP3 (DRAM2).

CHIP1 (FLASH2) is a non-volatile memory and is a large-capacity flash memory equipped with a NAND interface (NAND IF) though the above-mentioned is not particularly limited.

CHIP1 (FLASH2) is configured by a non-volatile memory array MA for holding data, a control circuit FCTL for controlling reading and writing data from/to the non-volatile memory array, an error detecting and correcting circuit ECC and an address replacement circuit REP.

As for the configuration of the memory array MA, there are NAND configuration and AND configuration and both can be used.

CHIP3 (DRAM2) is DRAM provided with an interface for data transfer to/from CHIP1 (FLASH2) and an interface for data transfer to/from the information processing device CHIP4 (MS) The interface for data transfer to/from the information processing device (MS) has two types of an asynchronous DRAM interface and a synchronous DRAM interface and in the memory module MM2, both interfaces can be used. This embodiment will be described using an SDRAM interface (SDRAM IF) which is the synchronous DRAM interface and is typically used as an example below.

The interface for data transfer between CHIP3 (DRAM2) and CHIP1 (FLASH2) is a flash memory interface, the interface for a flash memory has two types of an AND interface (AND IF) and a NAND interface (NAND IF), and in this embodiment, both can be used. In this embodiment, the interface for data transfer between CHIP3 (DRAM) and CHIP1 (FLASH2) will be described as the NAND interface.

Next, the configuration of CHIP3 (DRAM2) will be described. CHIP3 (DRAM2) is configured by memory banks (B0, B1, B2, B3) for holding data and a control circuit DCTL2 for controlling reading and writing data from/to the memory bank. The control circuit DCTL2 is configured by a command decoder CDEC, an access arbiter ARB, a memory management unit DMU, an initialize circuit INT, a refresh control circuit REF, a data buffer BUF, a control register DREG, a mode register MR, an extended mode register EMR and a flash control circuit DFCON.

CHIP1 (FLASH2) is divided into an initial program region and a main data region though the above-mentioned is not particularly limited, CHIP3 (DRAM2) is divided into a work region and a copy region though the above-mentioned is not particularly limited, and is managed by the memory management unit DMU so that the work region is used for a work memory when a program is executed and the copy region is used for a memory for copying data from FLASH. The memory banks B0 and B1 of CHIP3 (DRAM2) can be also allocated to the copy region and the memory banks B2 and B3 can be also allocated to the work region.

CHIP2 (CTL_LOGIC2) is configured by SRAM, a control register SREG, a flash control circuit SFCON and a memory management unit SMU and controls data transfer to/from CHIP1 (FLASH2).

SRAM is divided into a boot program region and a buffer region though the above-mentioned is not particularly limited and is managed by the memory management unit SMU so that the boot program region is used for storing boot program data for activating the information processing device CHIP4 (MS) and the buffer region is used for a buffer memory for enabling data transfer between CHIP1 (FLASH2) and SRAM.

Data transfer between CHIP1 (FLASH2) and CHIP2 (CTL_LOGIC2) is performed via the NAND interface (NAND IF) and data transfer to/from the information processing device CHIP4 (MS) is performed via the SRAM interface (SRAM IF).

The information processing device CHIP4 (MS) is configured by a central processing unit CPU, an SRAM controller SRC and a DRAM controller SDC. The SRAM controller SRC accesses SRAM of CHIP2 (CTL_LOGIC2) via the SRAM interface (SRAM IF) to read or write data. The DRAM controller SDC directly accesses CHIP3 (DRAM2) via the SDRAM interface (SDRAM IF) to read or write data.

As described above, in this embodiment, as CHIP1 (FLASH2) is provided with the error detecting and correcting circuit ECC and the address replacement circuit REP inside, the detection and the correction of an error in reading data can be performed at high speed and as the replacement of an address in writing data can be also performed at high speed, data transfer can be sped up.

Further, as CHIP3 (DRAM2) is provided with the SDRAM interface (SDRAM IF) and the NAND interface (NAND IF), the NAND interface (NAND IF) can be directly connected to CHIP1 (FLASH2) and the SDRAM interface (SDRAM IF) can be directly connected to the information processing device CHIP4 (MS), data can be read at higher speed.

Next, the operation of this embodiment will be described.

When power is turned on, CHIP1 (FLASH2), CHIP2 (CTL_LOGIC2) and CHIP3 (DRAM2) set themselves to an initial condition.

Next, the flash control circuit SFCON reads data in the initial program region of CHIP1 (FLASH2) and transfers it to the boot program region of SRAM.

In CHIP1 (FLASH2), the error detection and the error correction of data are performed at high speed by the built-in error detecting and correcting circuit ECC in reading the data.

The information processing device CHIP4 (MS) reads boot program data stored in the boot program region of SRAM to activate itself.

The initialize circuit INT sets the mode register MR and the extended mode register EMR to a desired value as an initialization sequence of CHIP3 (DRAM2).

While the information processing device CHIP4 (MS) activates itself, the flash control circuit SFCON informs CHIP3 (DRAM2) that data transfer to the boot program region of SRAM is finished in the form of a data transfer termination signal TC. Afterward, the flash control circuit DFCON of CHIP3 (DRAM2) sequentially reads data in the main data region of CHIP1 (FLASH2) and transfers it to the data buffer BUF. The command decoder CDEC sequentially transfers the data held in the data buffer BUF to the memory bank 0 (B0) allocated to the copy region. When data transfer is started, the refresh control circuit performs refresh operation to hold the data transferred to the memory bank.

When a load instruction is written to the control register SREG of CHIP2 (CTL_LOGIC2) from the information processing device CHIP4 (MS) via the SRAM interface (SRAM IF), data in the main data region of CHIP1 (FLASH2) is transferred to the buffer region of SRAM. When a store instruction is written to the control register SREG, data in the buffer region of SRAM is transferred to the main data region of CHIP1 (FLASH2). When data is written to CHIP1 (FLASH2), it is checked at high speed by the built-in address replacement circuit REP whether the writing succeeds or not, if the writing succeeds, the writing is finished, when the writing fails, an address in an address replacement region FREP of FLASH is selected, and the data is written to it.

When a load instruction is written to the control register DREG of CHIP3 (DRAM) from the information processing device CHIP4 (MS) via the SDRAM interface (SDRAM IF), data in the main data region of CHIP1 (FLASH2) is directly transferred to the copy region of CHIP3 (DRAM2). When a store instruction is written to the control register DREG, data in the copy region of CHIP3 (DRAM2) is directly written to the main data region of CHIP1 (FLASH2).

When an instruction to read CHIP1 (FLASH2) data held in the memory bank 0 (B0) of CHIP3 (DRAM2) and an address are input from the information processing device CHIP4 (MS) via the SDRAM interface (SDRAM IF), the access arbiter ARB always precedes the read instruction from the information processing device CHIP4 (MS) and stops data transfer if the data transfer between CHIP1 (FLASH2) and CHIP3 (DRAM2) is performed by a load instruction or a store instruction. Afterward, the command decoder CDEC decodes the read instruction, reads data from the memory bank 0 (B0), and outputs it via the SDRAM interface.

It is needless to say that in case the AND interface (AND) is used for data transfer between CHIP1 (FLASH2) and CHIP3 (DRAM2) in this memory module MM2, this memory module can be also implemented.

As described above, in this embodiment, as the error detecting and correcting circuit ECC and the address replacement circuit REP are built in CHIP1 (FLASH2), error detection and error correction in reading data can be performed at high speed and as the replacement of an address in writing data can be also made at high speed, data transfer can be sped up.

Further, as CHIP3 (DRAM2) is provided with the SDRAM interface (SDRAM IF) and the NAND interface (NAND IF), the NAND interface (NAND IF) can be directly connected to CHIP1 (FLASH2) and the SDRAM interface (SDRAM IF) can be directly connected to the information processing device CHIP4 (MS), data can be read at higher speed.

Figure 19:
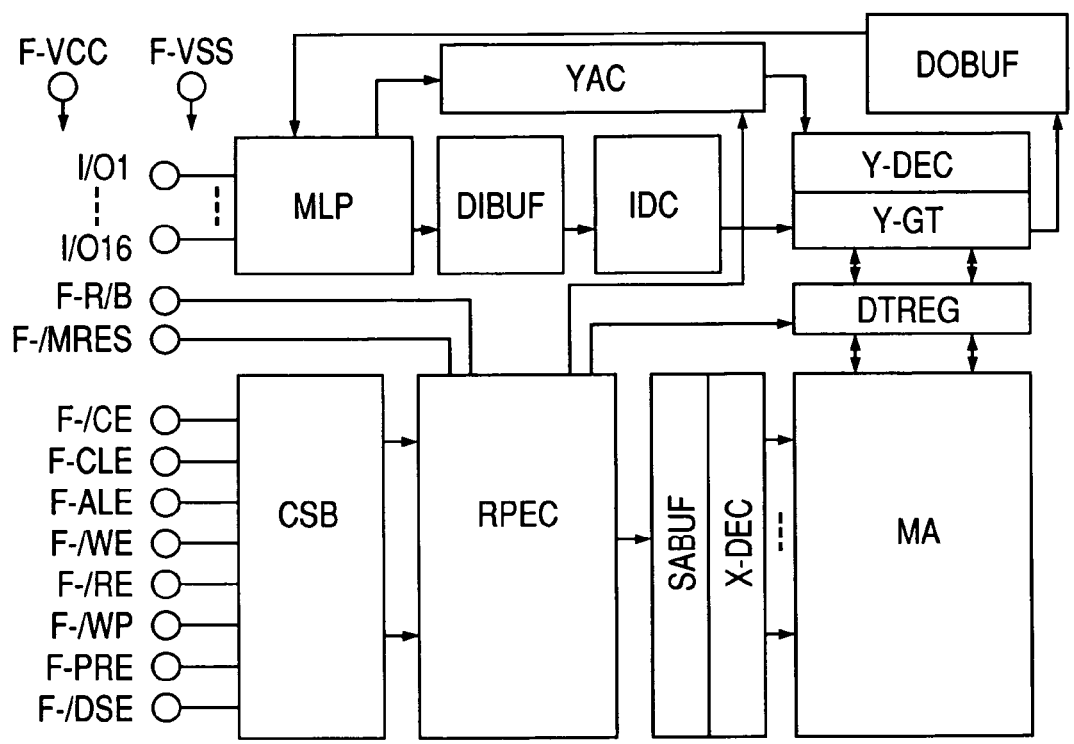
FIG. 19 is a block diagram showing one example of the configuration of FLASH shown in FIG. 18.

FIG. 19 is a block diagram showing one example of the flash memory used for CHIP1 (FLASH2) shown in FIG. 18 configuring this memory module MM2.

The flash memory is configured by a control signal buffer CSB, a read/program/erase control circuit RPEC, a sector address buffer SABUF, an X decoder X-DEC, a multiplexing circuit MLP, a Y address counter YAC, a data input buffer DIBUF, an input data control circuit IDC, a data output buffer DOBUF, a Y decoder Y-DEC, a Y gate circuit Y-GT, a data register DTREG and a memory array MA.

Figure 20:
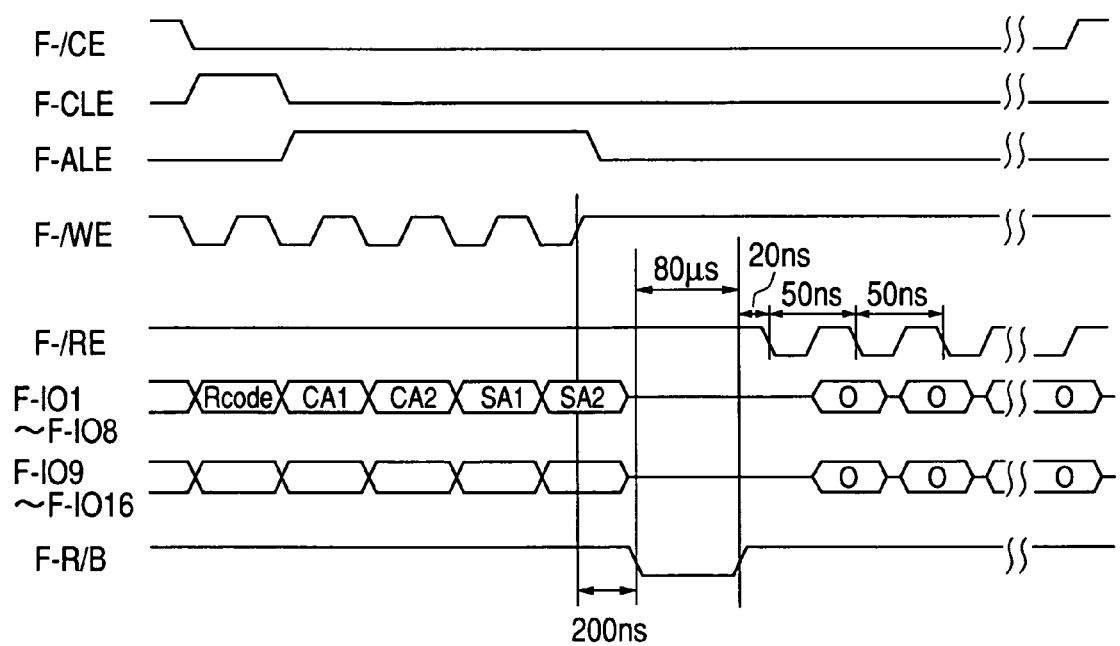
FIG. 20 is a timing chart showing one example of reading data from FLASH shown in FIG. 18.

FIG. 20 shows data read operation from the flash memory of CHIP1 (FLASH2). When a chip enable signal F-/CE is turned at a low level, a command latch enable signal F-CLE is turned at a high level and a, write enable signal F-/WE is activated, an instruction code Rcode of a read instruction is input in the form of input/output signals F-I01 to F-I08. Afterward, an address latch enable signal F-ALE is turned at a high level and addresses (CA1, CA2, SA1, SA2) are input in the form of the input/output signals F-I01 to F-I08 at a leading edge of the write enable signal F-/WE. A start address is specified by CA1 and CA2 and a sector address is specified by SA1 and SA2.

Data for one sector corresponding to the input sector address is transferred from the memory array MA to the data register DTREG. While the data is transferred from the memory array MA to the data register DTREG, the flash memory is turned busy and a ready/busy circuit R/B turns a ready/busy signal F-R/B at a low level. When the data transfer to the data register DTREG is finished, data in the data register DTREG is read in order from the input start address by 16 bits in synchronization with a read enable signal F-/RE and is output in the form of input/output signals F-I01 to F-I016.

FOURTH EMBODIMENT

Figure 21:
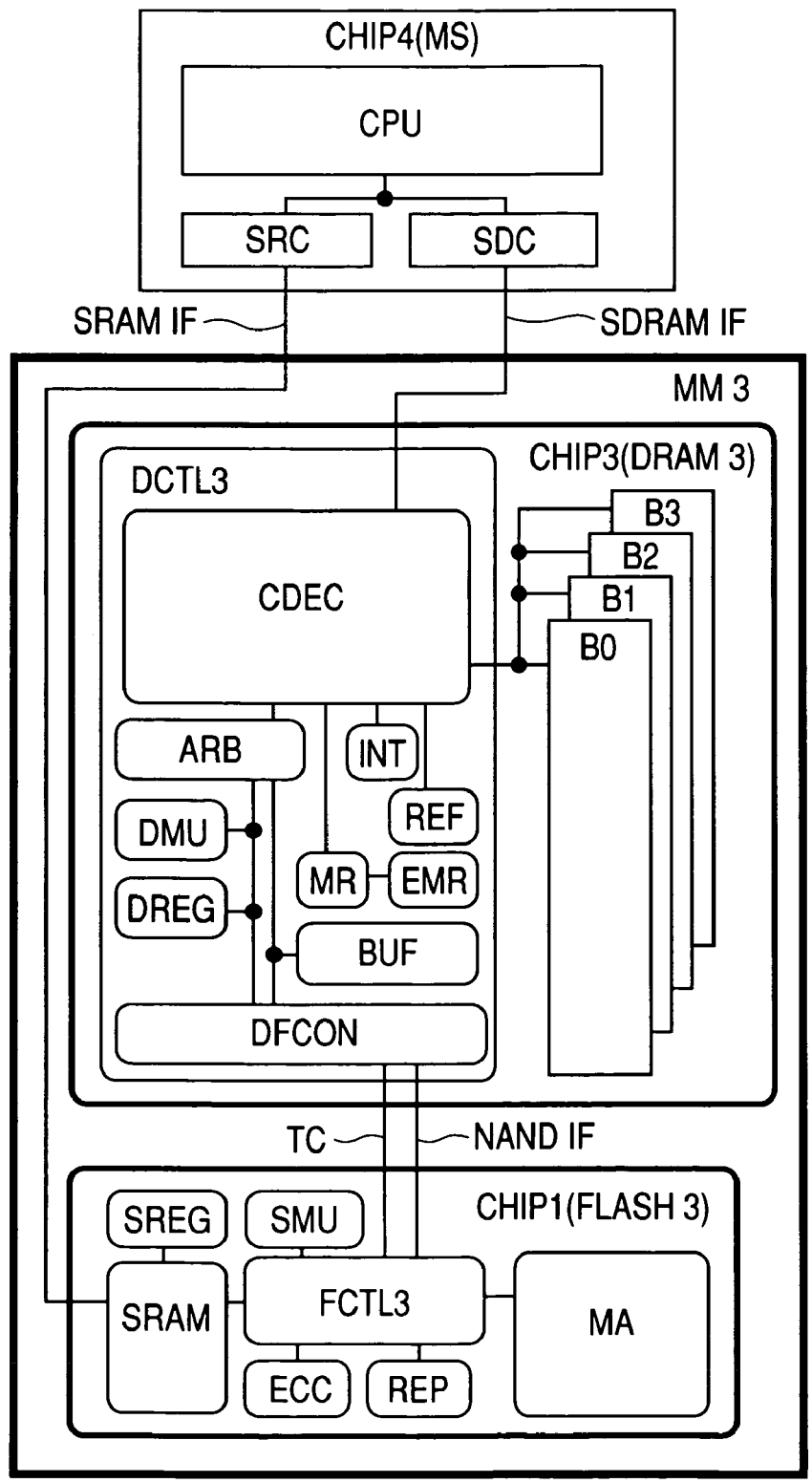
FIG. 21 is a block diagram showing a memory system to which the invention is applied.

FIG. 21 shows a fourth embodiment to which the invention is applied. FIG. 21 shows an embodiment of an information processing system configured by a memory module MM3 and an information processing device CHIP4 (MS). Each will be described below.

The memory module MM3 is configured by CHIP1 (FLASH3) and CHIP3 (DRAM3). CHIP1 (FLASH3) is a non-volatile memory and is a large-capacity flash memory equipped with a NAND interface (NAND IF) though the above-mentioned is not particularly limited.

CHIP1 (FLASH3) is configured by a non-volatile memory array MA for holding data, a transfer control circuit FCTL3 for controlling data transfer from the non-volatile memory array MA to SRAM, an error detecting and correcting circuit ECC, an address replacement circuit REP, SRAM, a control register SREG and a memory management unit SMU.

SRAM is divided into a boot program region and a buffer region though the above-mentioned is not particularly limited and is managed by the memory management unit SMU so that the boot program region is used for storing boot program data for activating the information processing device CHIP4 (MS) and the buffer region is used for a buffer memory for data transfer between the non-volatile memory array MA of CHIP1 (FLASH3) and SRAM.

The configuration of the memory array MA mainly has two types of NAND configuration and AND configuration and both can be used.

CHIP3 (DRAM3) is DRAM equipped with an interface for data transfer to/from CHIP1 (FLASH3) and an interface for data transfer to/from the information processing device CHIP4 (MS).

The interface for data transfer to/from the information processing device CHIP4 (MS) has two types of an asynchronous DRAM interface and a synchronous DRAM interface and both can be used in the memory module MM2. This embodiment will be described using an SDRAM interface (SDRAM IF) which is the synchronous DRAM interface typically used for an example below.

The interface for data transfer between CHIP3 (DRAM3) and CHIP1 (FLASH3) is a flash memory interface, the flash memory interface has two types of an AND interface (AND IF) and a NAND interface (NAND IF), and in this embodiment, both can be used. In this embodiment, the interface for data transfer between CHIP3 (DRAM3) and CHIP1 (FLASH3) will be described as the NAND interface below.

Next, the configuration of CHIP3 (DRAM3) will be described. CHIP3 (DRAM3) is configured by memory banks (B0, B1, B2, B3) for holding data and a control circuit DCTL3 for controlling reading and writing data from/to the memory bank. The control circuit DCTL3 is configured by a command decoder CDEC, an access arbiter ARB, a memory management unit DMU, an initialize circuit INT, a refresh control circuit REF, a data buffer BUF, a control register DREG, a mode register MR, an extended mode register EMR and a flash control circuit DFCON.

By the memory management unit DMU, CHIP1 (FLASH3) is divided into an initial program region and a main data region though the above-mentioned is not particularly limited, CHIP3 (DRAM3) is divided into a work region and a copy region though the above-mentioned is not particularly limited, and is managed so that the work region is used for a work memory when a program is executed and the copy region is used for a memory for copying data from CHIP1 (FLASH3). The memory banks B0 and B1 of CHIP3 (DRAM3) can be also allocated to the copy region and the memory banks B2 and B3 can be also allocated to the work region.

The information processing device CHIP4 (MS) is configured by a central processing unit CPU, an SRAM controller SRC and a DRAM controller SDC. The SRAM controller accesses SRAM of CHIP1 (FLASH3) via an SRAM interface (SRAM IF) to read or write data. The DRAM controller directly accesses CHIP3 (DRAM3) via the SDRAM interface (SDRAM IF) to read or write data.

As described above, in this embodiment, as SRAM, the error detecting and correcting circuit ECC and the address replacement circuit REP are built in CHIP1 (FLASH3), data transfer between the non-volatile memory array and SRAM can be performed at high speed.

As CHIP3 (DRAM3) is provided with the SDRAM interface (SDRAM IF) and the NAND interface (NAND IF), the NAND interface (NAND IF) can be directly connected to CHIP1 (FLASH3) and the SDRAM interface (SDRAM IF) can be directly connected to the information processing device CHIP4 (MS), data can be read at higher speed.

Further, as the number of chips for implementing this memory system can be reduced, the power and the cost can be reduced.

Next, the operation of this embodiment will be described.

When power is turned on, CHIP1 (FLASH3) and CHIP3 (DRAM3) set themselves to an initial condition.

Next, the transfer control circuit FCTL3 reads data in the initial program region of the non-volatile memory array MA and transfers it to the boot program region of SRAM.

When the data is read from the non-volatile memory array MA of CHIP1 (FLASH3), error detection and error correction are performed at high speed by the built-in error detecting and correcting circuit ECC.

The information processing device CHIP4 (MS) reads boot program data stored in the boot program region of SRAM and activates itself.

The initialize circuit INT sets the mode register MR and the extended mode register EMR to a desired value as a sequence for initializing CHIP3 (DRAM3).

While the information processing device CHIP4 (MS) activates itself, the transfer control circuit FCTL3 informs that data transfer to the boot program region of SRAM is finished in the form of a data transfer termination signal TC. Afterward, the flash control circuit DFCON of CHIP3 (DRAM3) sequentially reads data in the main data region of the non-volatile memory array MA via the transfer control circuit FCTL3 and transfers the data to the data buffer BUF. The command decoder CDEC sequentially transfers the data held in the data buffer BUF to the memory bank 0 (B0) allocated to the copy region. When data transfer is started, the refresh control circuit executes refresh operation to hold the data transferred to the memory bank.

When a load instruction is written from the information processing device CHIP4 (MS) to the control register SREG of CHIP1 (FLASH3) via the SRAM interface (SRAM IF), data in the main data region held in the non-volatile memory array MA is transferred to the buffer region of SRAM. When a store instruction is written to the control register SREG, data in the buffer region of SRAM is transferred to the main data region of the non-volatile memory array MA.

When data is written to the non-volatile memory array MA, it is checked at high speed by the built-in address replacement circuit REP whether the writing succeeds or not, if the writing succeeds, it is finished, when the writing fails, an address in an address replacement region FREP of CHIP1 (FLASH3) is selected, and the data is written there.

When a load instruction is written from the information processing device CHIP4 (MS) to the control register DREG of CHIP3 (DRAM3) via the SDRAM interface (SDRAM IF), data in the main data region of CHIP1 (FLASH3) is directly transferred to the copy region of CHIP3 (DRAM3). When a store instruction is written to the control register DREG, data in the copy region of CHIP3 (DRAM3) is directly written to the main data region of CHIP1 (FLASH3).

When an instruction to read CHIP1 (FLASH3) data held in the memory bank 0 (B0) of CHIP3 (DRAM3) and an address are input from the information processing device CHIP4 (MS) via the SDRAM interface (SDRAM IF), the access arbiter ARB always precedes the read instruction from the information processing device CHIP4 (MS) and if data transfer between CHIP1 (FLASH3) and CHIP3 (DRAM3) is performed by a load instruction or a store instruction, the access arbiter stops it. Afterward, the command decoder CDEC decodes the read instruction, reads the data from the memory bank 0 (B0), and outputs it via the SDRAM interface.

In case an AND interface (AND IF) is used for data transfer between CHIP1 (FLASH3) and CHIP3 (DRAM3) in this memory module MM3, it need scarcely be said that this memory module can be also implemented.

As described above, in this embodiment, as SRAM, the error detecting and correcting circuit ECC and the address replacement circuit REP are built in CHIP1 (FLASH3), data transfer between the non-volatile memory array and SRAM can be performed at high speed.

As CHIP3 (DRAM3) is provided with the SDRAM interface (SDRAM IF) and the NAND interface (NAND IF), the NAND interface (NAND IF) can be directly connected to CHIP1 (FLASH3) and the SDRAM interface (SDRAM IF) can be directly connected to the information processing device CHIP4 (MS), data can be read at higher speed.

Further, as the number of chips for implementing this memory system can be reduced, the power and the cost can be reduced.

FIFTH EMBODIMENT

Figure 22:
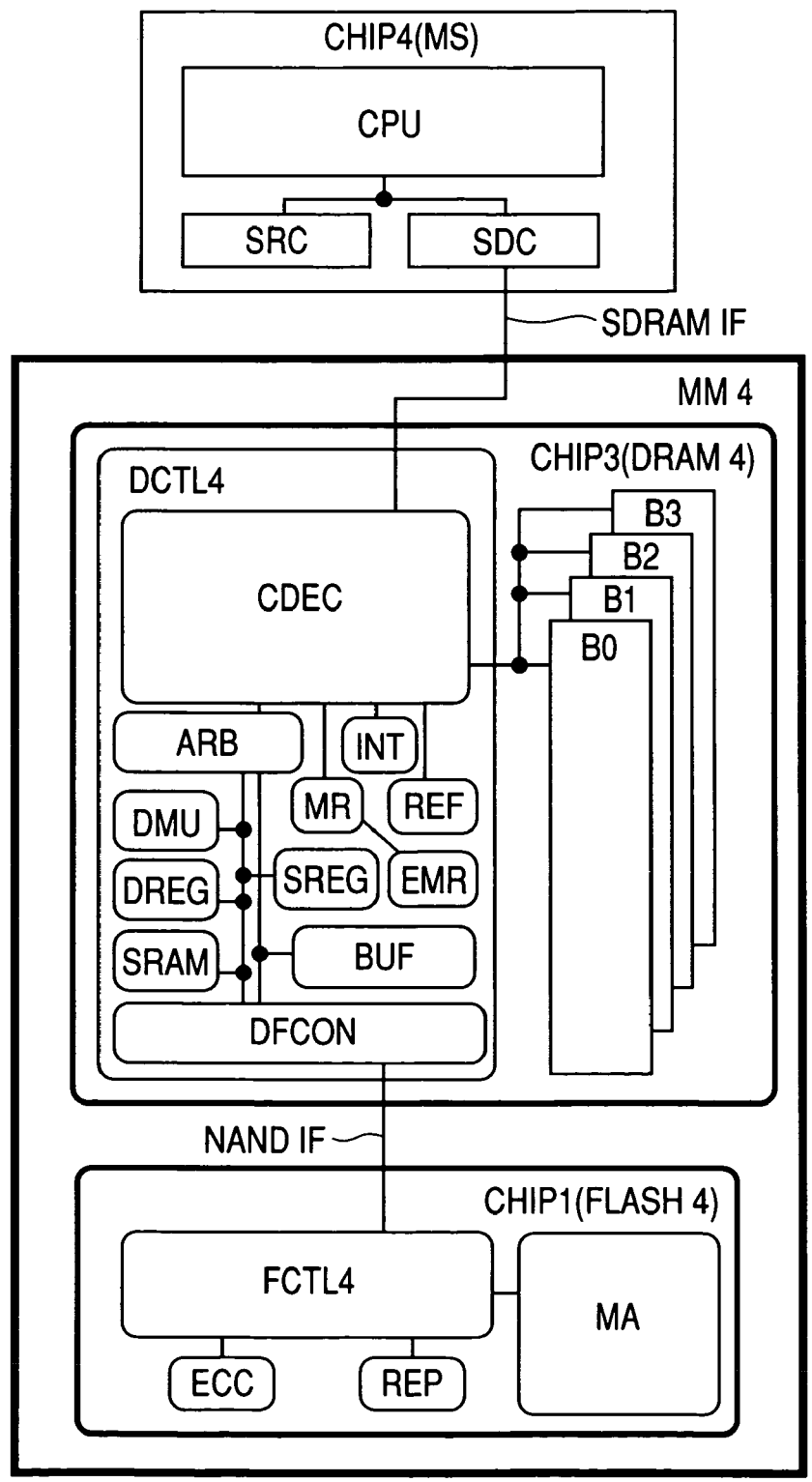
FIG. 22 is a block diagram showing a memory system to which the invention is applied.

FIG. 22 shows a fifth embodiment to which the invention is applied. FIG. 22 shows an embodiment of an information processing system configured by a memory module MM4 and an information processing device CHIP4 (MS). Each will be described below.

The memory module MM4 is configured by CHIP1 (FLASH4) and CHIP3 (DRAM4). CHIP1 (FLASH4) is a non-volatile memory and is a large-capacity flash memory equipped with a NAND interface (NAND IF) though the above-mentioned is not particularly limited.

CHIP1 (FLASH4) is configured by a non-volatile memory array MA for holding data, a transfer control circuit FCTL4, an error detecting and correcting circuit ECC and an address replacement circuit REP.

As for the configuration of the memory array MA, there are mainly NAND configuration and AND configuration and both can be used.

CHIP3 (DRAM4) is DRAM equipped with an interface for data transfer to/from CHIP1 (FLASH4) and an interface for data transfer to/from the information processing device CHIP4 (MS).

The interface for data transfer to/from the information processing device CHIP4 (MS) has two types of an asynchronous DRAM interface and a synchronous DRAM interface and both interfaces can be used in the memory module MM4. This embodiment will be described using an SDRAM interface (SDRAM IF) which is the synchronous DRAM interface typically used for an example.

The interface for data transfer between CHIP3 (DRAM4) and CHIP1 (FLASH4) is a flash memory interface, the flash memory interface has two types of an AND interface (AND IF) and a NAND interface (NAND IF), and in this embodiment, both can be used. This embodiment will be described using the NAND interface for the interface for data transfer between CHIP3 (DRAM4) and CHIP1 (FLASH4) below.

Next, the configuration of CHIP3 (DRAM4) will be described. CHIP3 (DRAM4) is configured by memory banks (B0, B1, B2, B3) for holding data and a control circuit DCTL4 for controlling reading and writing data from/to the memory bank. The control circuit DCTL4 is configured by a command decoder CDEC, an access arbiter ARB, a memory management unit DMU, an initialize circuit INT, a refresh control circuit REF, a data buffer BUF, a control register DREG, a mode register MR, an extended mode register EMR, a flash control circuit DFCON and SRAM.

By the memory management unit DMU, CHIP1 (FLASH4) is divided into an initial program region and a main data region though the above-mentioned is not particularly limited, CHIP3 (DRAM4) is divided into a work region and a copy region though the above-mentioned is not particularly limited, and is managed so that the work region is used for a work memory when a program is executed and the copy region is used for a memory for copying data from FLASH. The memory banks B0 and B1 of CHIP3 (DRAM4) can be also allocated to the copy region and the memory banks B2 and B3 can be also allocated to the work region.

Further, SRAM is divided into a boot program region and a buffer region and is managed so that the boot program region is used for storing boot program data for activating the information processing device CHIP4 (MS) and the buffer region is used for a buffer memory for data transfer between the non-volatile memory array MA of CHIP1 (FLASH4) and SRAM.

The information processing device CHIP4 (MS) is configured by a central processing unit CPU, an SRAM controller SRC and a DRAM controller SDC. The DRAM controller accesses SRAM of CHIP3 (DRAM4) and the memory banks (B0, B1, B2, B3) via the SDRAM interface (SDRAM IF) to read or write data.

As described above, in this embodiment, as the error detecting and correcting circuit ECC and the address replacement circuit REP are built in CHIP1 (FLASH4), error detection and error correction in reading data can be made at high speed and the replacement of an address in writing data can be also made at high speed, data transfer can be sped up.

As CHIP3 (DRAM4) is provided with the SDRAM interface (SDRAM IF) and the NAND interface (NAND IF), the NAND interface (NAND IF) can be directly connected to CHIP1 (FLASH4) and the SDRAM interface (SDRAM IF) can be directly connected to the information processing device CHIP4 (MS), data can be read at higher speed.

As the number of chips for implementing this memory system can be reduced, the power and the cost can be reduced.

Further, as this memory system is operated only via the SDRAM interface, terminals for connection to the information processing device CHIP4 (MS) can be reduced, and the power and the cost can be further reduced.

Next, the operation of this embodiment will be described.

When power is turned on, CHIP1 (FLASH4) and CHIP3 (DRAM4) set themselves to an initial condition.

Next, the flash control circuit DFCON reads data in the initial program region of the non-volatile memory array MA and transfers it to the boot program region of SRAM.

When data is read from the non-volatile memory array MA of CHIP1 (FLASH4), an error in the data is detected and corrected at high speed by the built-in error detecting and correcting circuit ECC.

The information processing device CHIP4 (MS) reads boot program data stored in the boot program region of SRAM via the SDRAM interface (SDRAM IF) and activates itself.

The initialize circuit INT sets the mode register MR and the extended mode register EMR to a desired value as a sequence for initializing CHIP3 (DRAM4).

Next, the flash control circuit DFCON of CHIP3 (DRAM4) sequentially reads data in the main data region of the non-volatile memory array MA via the transfer control circuit FCTL4 and transfers it to the data buffer BUF. The command decoder CDEC sequentially transfers the data held in the data buffer BUF to the memory bank 0 (B0) allocated to the copy region. When data transfer is started, the refresh control circuit REF executes refresh operation to hold the data transferred to the memory bank 0 (B0).

When a load instruction is written to a control register SREG of CHIP3 (DRAM4) from the information processing device CHIP4 (MS) via the SDRAM interface (SDRAM IF), data in the main data region held the non-volatile memory array MA is transferred to the buffer region of SRAM. When a store instruction is written to the control register SREG, the data in the buffer region of SRAM is transferred to the main data region of the non-volatile memory array MA.

When data is written to the non-volatile memory array MA, it is checked at high speed by the built-in address replacement circuit REP whether the writing succeeds or not, if the writing succeeds, it is finished, when the wiring fails, an address in an address replacement region FREP of CHIP1 (FLASH4) is selected and the data is written.

When a load instruction is written to the control register DREG of CHIP3 (DRAM4) from the information processing device CHIP4 (MS) via the SDRAM interface (SDRAM IF), data in the main data region of CHIP1 (FLASH4) is transferred to the copy region of CHIP3 (DRAM4). When a store instruction is written to the control register DREG, data in the copy region of CHIP3 (DRAM4) is directly written to the main data region of CHIP1 (FLASH4).

When an instruction to read CHIP1 (FLASH4) data held in the memory bank 0 (B0) of CHIP3 (DRAM4) and an address are input from the information processing device CHIP4 (MS) via the SDRAM interface (SDRAM IF), the access arbiter ARB always precedes the read instruction from the information processing device CHIP4 (MS) and if data transfer is performed between CHIP1 (FLASH4) and CHIP3 (DRAM4) by a load instruction or a store instruction, the access arbiter stops it. Afterward, the command decoder CDEC decodes the read instruction, reads data in the memory bank 0 (B0), and outputs it via the SDRAM interface.

In case an AND interface (AND IF) is used for data transfer between CHIP1 (FLASH4) and CHIP3 (DRAM4) in this memory module MM4, it need scarcely be said that this memory module can be also implemented.

As described above, in this embodiment, as the error detecting and correcting circuit ECC and the address replacement circuit REP are built in CHIP1 (FLASH4), an error can be detected and corrected at high speed in reading data and as the replacement of an address in writing data can be also made at high speed, data transfer can be sped up.

As CHIP3 (DRAM4) is provided with the SDRAM interface (SDRAM IF) and the NAND interface (NAND IF), the NAND interface (NAND IF) can be directly connected to CHIP1 (FLASH4) and the SDRAM interface (SDRAM IF) can be directly connected to the information processing device CHIP4 (MS), data can be read at higher speed.

As the number of chips for implementing this memory system can be reduced, the power and the cost can be reduced.

Further, as this memory system is operated only via the SDRAM interface, terminals for connection to the information processing device CHIP4 (MS) can be reduced, and the power and the cost can be further reduced.

Figure 23:
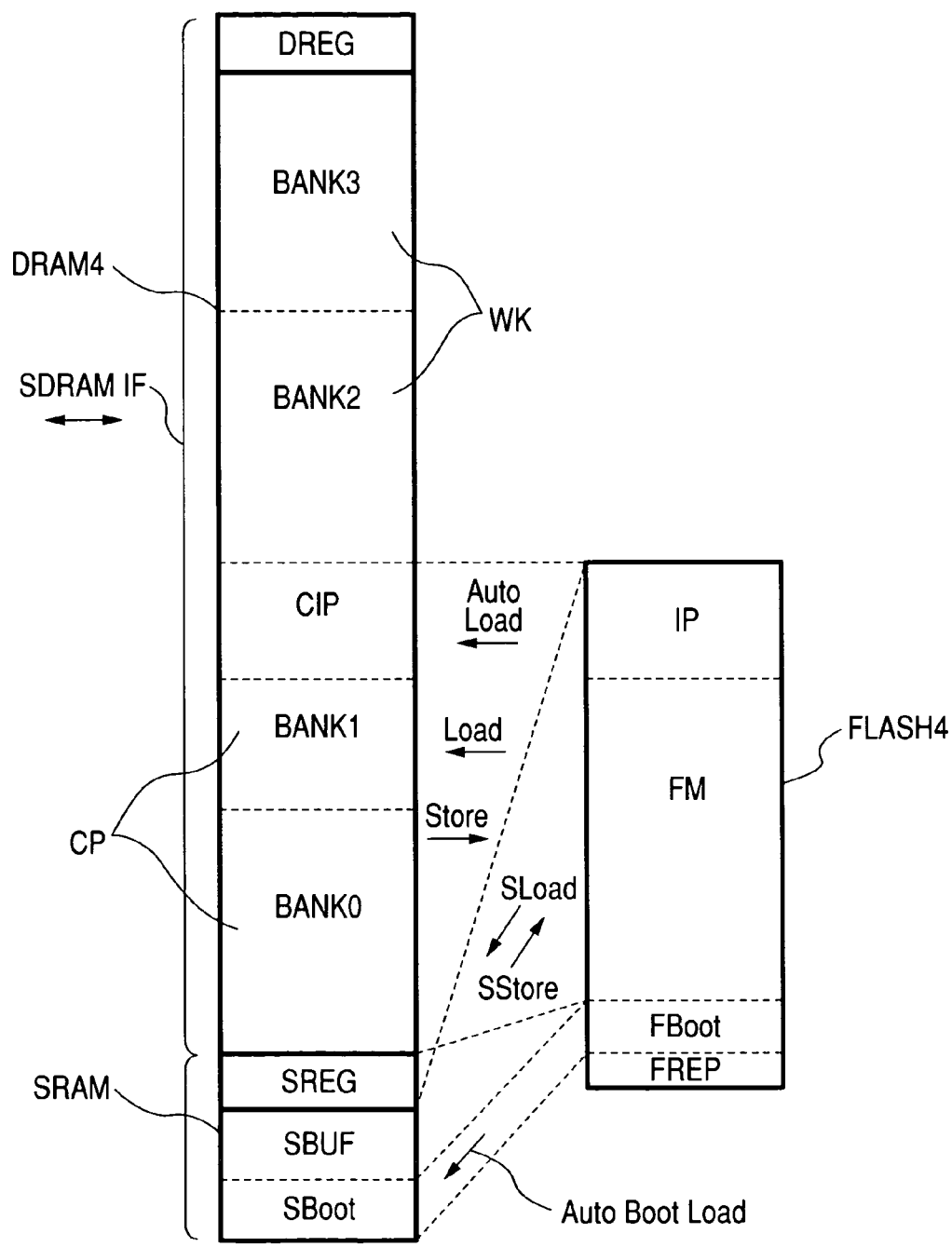
FIG. 23 is an explanatory drawing showing one example of an address map of the memory system to which the invention is applied.

FIG. 23 shows one example of a memory map by the memory management unit DMU in this embodiment. In this embodiment, though the following are not particularly limited, a representative memory map will be described using a memory module where a memory area of the non-volatile memory is 128 Mbits++4 Mbits (4 Mbits are an address replacement region), a memory area of DRAM is 256 Mbits, SRAM is 8 kbits and the control registers SREG and DREG are 1 kbits for an example below.

There is shown a memory map showing that the memory management unit DMU converts to an address in the control register DREG (1 kb), the work region WK (128 Mbits) of DRAM, the copy region CP (128 Mbits) of DRAM, the control register SREG, SRAM and Flash (128 Mbits) based upon an address input via the SDRAM interface (SDRAM IF).

Though the following is not particularly limited, SRAM, the control register SREG, the bank 0 (BANK0), the bank1 (BANK1), the bank 2 (BANK2) and the bank 3 (BANK3) respectively of DRAM and the control register DREG are mapped from a lower part of address space of the memory map.

SRAM is divided into the boot program region SBoot and a buffer region SBUF.

The bank 0 (BANK0) and the bank 1 (BANK1) of DRAM are mapped in the copy region CP, and the bank 2 (BANK2) and the bank 3 (BANK3) are mapped in the work region WK. The copy region CP is a region to/in which data in FLASH is transferred and held. The work region WK is a region used for a work memory. An initial automatic data transfer region CIP is included in the copy region CP of the bank 1 (BANK1).

FLASH is divided into the main data region FM, the initial program region FBoot and the address replacement region FREP. An initial automatic data transfer region IP from which data is automatically transferred to DRAM when power is turned on is included in the main data region FM of FLASH.

In the main data region FM of FLASH, a program and data are stored. There occurs, though infrequently, that the reliability of FLASH is deteriorated by repeating writing, written data may be turned to be different data in reading, and in writing, no data is written. The address replacement region FREP is provided to reload data turned defective as described above in the initial program region FBoot and in the main data region FM into a new region. The size of the address replacement region is not particularly limited, however, it is desirable that the size is determined so that the reliability which FLASH guarantees can be secured.

After power is turned on, first, data in the initial program region FBoot of FLASH is transferred to the boot program region SBoot of SRAM. The information processing device CHIP4 (MS) reads the data in the boot program region SBoot of SRAM via the SDRAM interface (SDRAM IF) and activates itself.

Next, data in the initial automatic data transfer region IP of FLASH is transferred to the initial automatic data transfer region CIP of DRAM.

Data transfer from FLASH to DRAM according to a load instruction (Load) will be described below.

When the load instruction is written to the control register DREG via the SDRAM interface (SDRAM IF), data in the main data region of FLASH is transferred to the copy region of DRAM according to the memory map set by the memory management unit MU.

Data transfer from DRAM to FLASH according to a store instruction (Store) will be described below.

When the store instruction is written to the control register DREG via the SDRAM interface (SDRAM IF), data in the copy region of DRAM is transferred to the main data region of FLASH according to the memory map set by the memory management unit MU.

Next, reading data from DRAM will be described.

When an address of the bank 0 (BANK0) of DRAM and a read instruction are input via the SDRAM interface, an address in the bank 0 (BANK0) of DRAM is selected and data can be read from there. That is, data in FLASH can be read at the same speed as that in DRAM. Data can be similarly read from other banks (the bank 1, the bank 2 and the bank 3).

Next, writing data to DRAM will be described.

When an address of the bank 1 (BANK1) of DRAM and a write instruction are input via the SDRAM interface, an address in the bank 1 (BANK1) of DRAM is selected and data can be written there. That is, data in FLASH can be written at the same speed as that in DRAM. Data can be similarly written to other banks (the bank 3, the bank 2 and the bank 0).

Data transfer from FLASH to SRAM according to a load instruction will be described below.

When the load instruction (SLoad) is written to the control register SREG via the SDRAM interface (SDRAM IF), data in FLASH is transferred to the buffer region of SRAM according to the memory map set by the memory management unit DMU.

Data transfer from SRAM to FLASH according to a store instruction (SStore) will be described below.

When the store instruction is written to the control register SREG via the SDRAM interface (SDRAM IF), data in the buffer region of SRAM is transferred to FLASH according to the memory map set by the memory management unit DMU.

Next, reading data from SRAM will be described.

When an address for selecting SRAM and a read instruction are input via the SDRAM interface, SRAM is selected and data can be read from there.

Next, writing data to SRAM will be described.

When an address for selecting SRAM and a write instruction are input via the SDRAM interface, SRAM is selected and data can be written there.

As described above, all data transfer is performed via the SDRAM interface (SDRAM IF).

SIXTH EMBODIMENT

Figure 24:
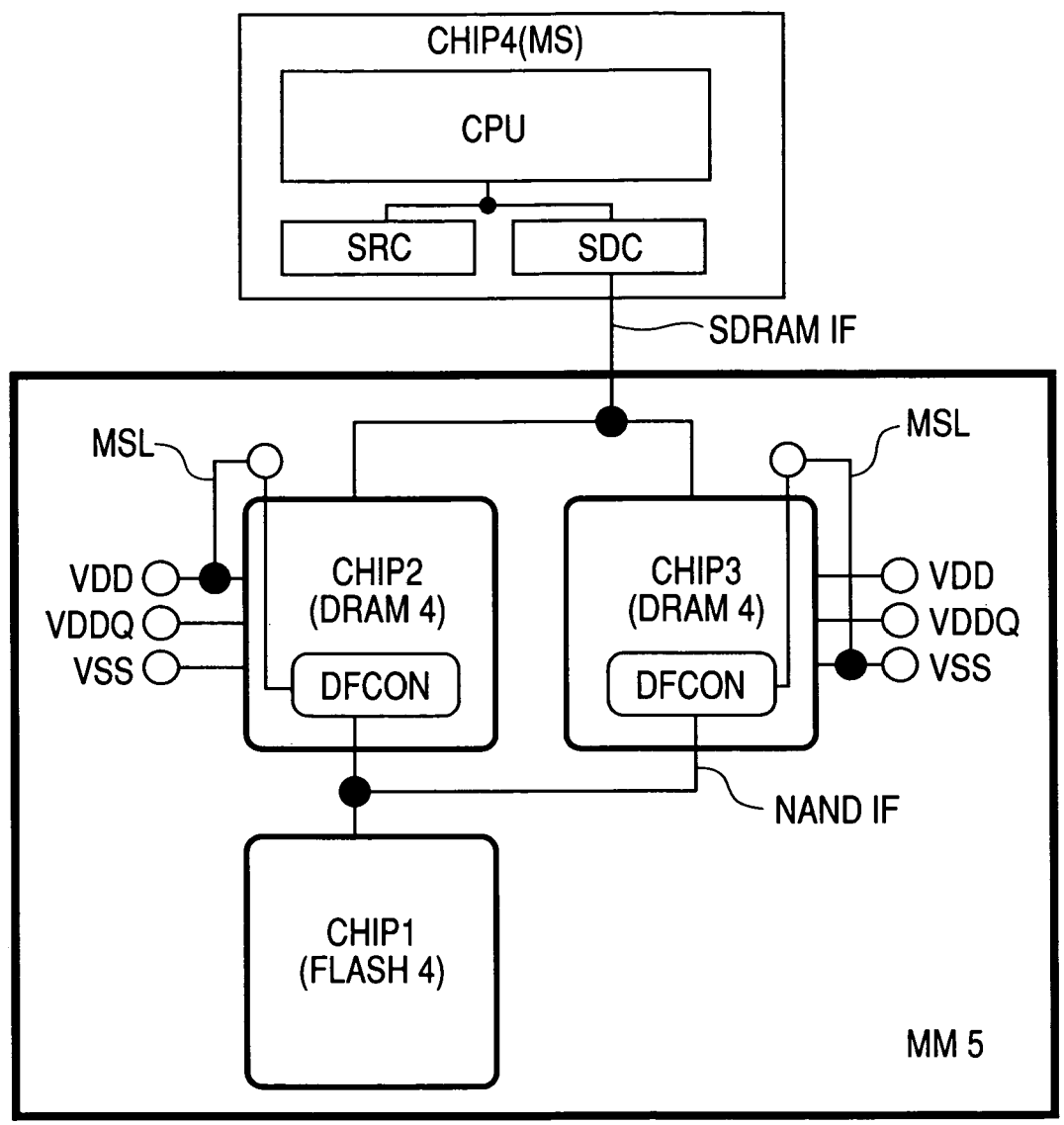
FIG. 24 is a block diagram showing a memory system to which the invention is applied.

FIG. 24 shows a sixth embodiment to which the invention is applied. FIG. 24 shows an embodiment of a memory system configured by a memory module MM5 and an information processing device CHIP4 (MS). Each will be described below.

The memory module MM5 is configured by CHIP1 (FLASH4), CHIP2 (DRAM4) and CHIP3 (DRAM4). CHIP1 (FLASH4) is the similar memory to the non-volatile memory shown in FIG. 22 and is provided with a NAND interface (NAND IF).

CHIP2 (DRAM4) and CHIP3 (DRAM4) are the same DRAM and are DRAM acquired by adding a master selection signal MSL to DRAM shown in FIG. 22. DFCON denotes a flash control circuit for controlling data transfer to/from CHIP1 (FLASH4).

This memory module MM5 uses two DRAMs to increase the memory size of DRAM.

Data transfer between CHIP2 (DRAM4) or CHIP3 (DRAM4) and CHIP1 (FLASH4) is performed via the NAND interface (NAND IF) and data transfer between CHIP2 (DRAM4) or CHIP3 (DRAM4) and the information processing device CHIP4 (MS) is performed via the SDRAM interface (SDRAM IF).

The master selection signal MSL is a signal for selecting which of CHIP2 (DRAM4) or CHIP3 (DRAM4) mainly accesses CHIP1 (FLASH4).

In CHIP2 (DRAM4), a master selection signal line MSL is connected to a power supply terminal VDD and CHIP2 becomes master DRAM that independently accesses CHIP1 (FLASH4). In CHIP3 (DRAM4), the master selection signal line MSL is connected to an earth terminal VSS (0 V) and CHIP3 becomes slave DRAM that does not independently access CHIP1 (FLASH4).

In CHIP2 (DRAM4) as master DRAM, the flash control circuit DFCON issues a control signal to enable data transfer to/from CHIP1 (FLASH4).

In CHIP3 (DRAM4) as slave DRAM, the flash control circuit DFCON in CHIP2 (DRAM4) does not issue a control signal and data for data transfer to/from CHIP1 (FLASH4) and performs data transfer to/from CHIP1 (FLASH4) using a control signal issued by the flash control circuit DFCON of CHIP2 (DRAM4).

In case there are plural master DRAMs that independently access the flash memory, control signals to the flash memory are in a competitive situation, data transfer between the flash memory and DRAM fails, and it is difficult to increase memory size using plural DRAM chips. According to this embodiment, as master DRAM and slave DRAM can be selected by issuing the master selection signal MSL and the memory size can be increased using the plural DRAM chips, the invention can flexibly correspond to a request of a mobile device.

SEVENTH EMBODIMENT

Figure 25:
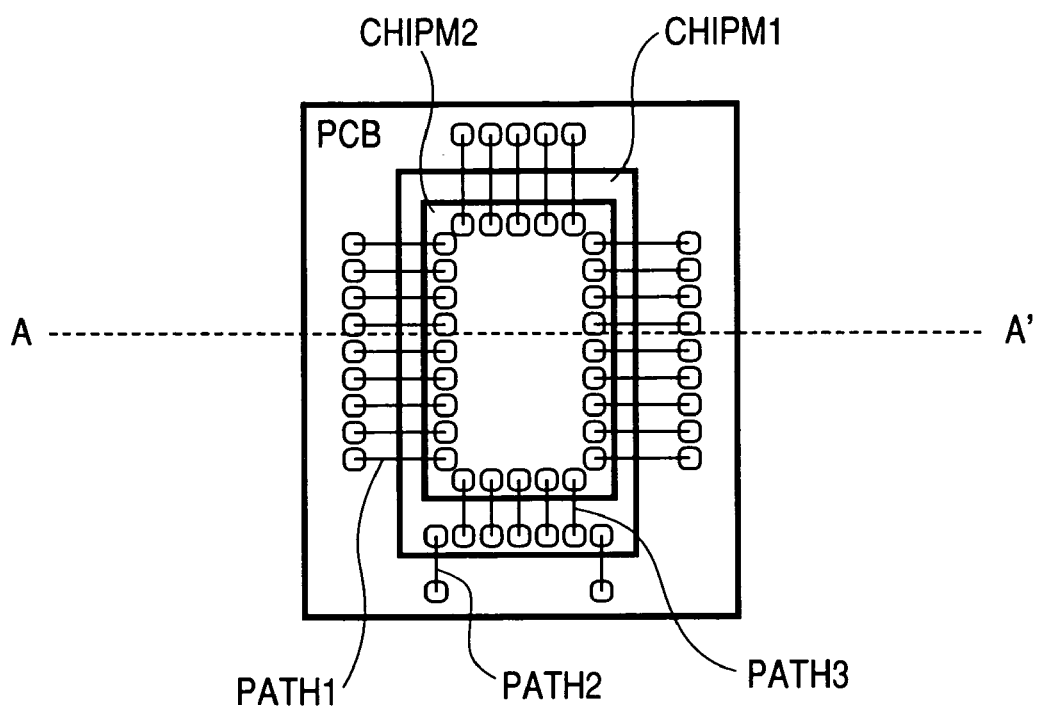
FIG. 25 show one embodiment of the memory system according to the invention.
Figure 25:
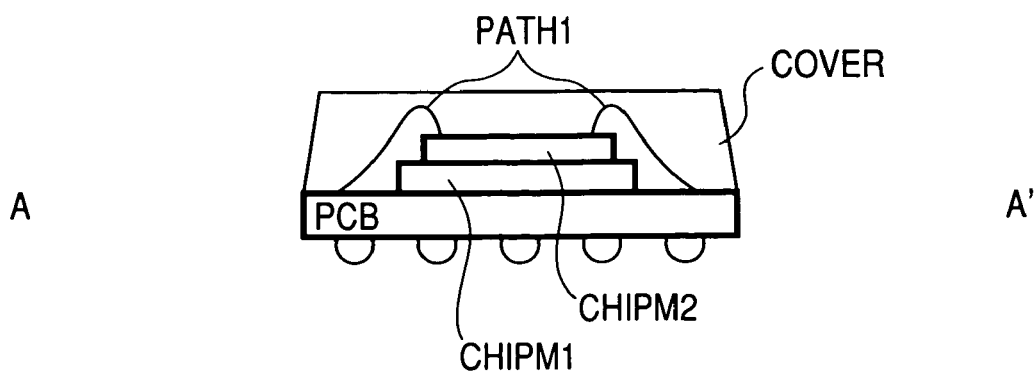

FIG. 25 show a seventh embodiment in the invention. FIG. 25(a) is a top view and FIG. 25(b) is a sectional view showing a part viewed along a line A-A' shown in the top view.

As for a multichip module equivalent to this embodiment, CHIPM1 and CHIPM2 are mounted on a board for mounting the devices with a ball grid array (BGA)(for example, a printed circuit board made of glass epoxy) PCB. CHIPM1 is a non-volatile memory and CHIPM2 is DRAM. The memory module MM3 shown in FIG. 21 and the memory module MM4 shown in FIG. 22 can be integrated in one molded device by this multichip module.

CHIPM1 and a bonding pad on the board PCB are connected via bonding wire (PATH2), and CHIPM2 and a bonding pad on the board PCB are connected via bonding wire (PATH1). CHIPM1 and CHIPM2 are connected via bonding wire (PATH3).

The top face of the board PCB on which the chips are mounted is resin molded to protect each chip and wiring for connection. Further, a cover (COVER) made of metal, a ceramic or resin may also cover them.

In this embodiment, as the bare chip is directly mounted on the printed circuit board PCB, the memory module having small packaging area can be configured. Besides, as each chip can be laminated, wiring length between the chip and the board PCB can be reduced and the packaging area can be reduced. The memory module can be manufactured with a small number of processes by unifying wiring between the chips and wiring between each chip and the board in a method using bonding wire.

Further, the number of bonding pads on the board and the number of bonding wires are reduced by directly connecting the chips via bonding wire and the memory module can be manufactured with a small number of processes. In case the cover made of resin is used, the tougher memory module can be configured. In case the cover made of a ceramic or metal is used, the memory module excellent in the performance of outgoing radiation and the effect of shielding in addition to the strength can be configured.

EIGHTH EMBODIMENT

Figure 26:
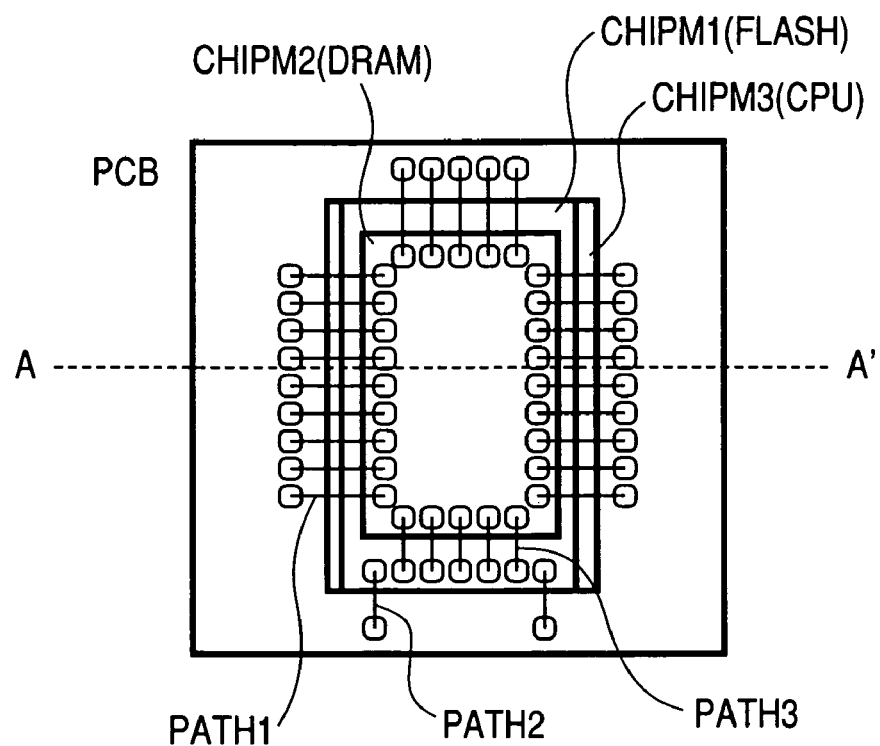
FIG. 26 show one embodiment of the memory system according to the invention.
Figure 26:
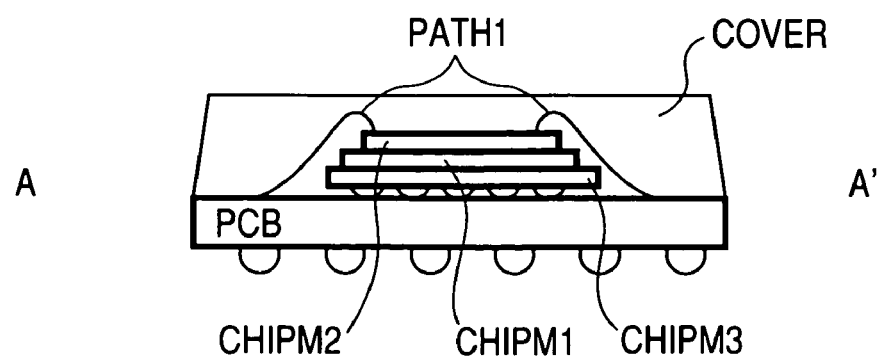

FIG. 26 show an eighth embodiment in the invention. FIG. 26(a) is a top view and FIG. 26(b) is a sectional view showing a part viewed along a line A-A' shown in the top view.

As for a multichip module equivalent to this embodiment, CHIPM1, CHIPM2 and CHIPM3 are mounted on a board for mounting the devices with a ball grid array (BGA) (for example, a printed circuit board made of glass epoxy) PCB. CHIPM1 is anon-volatile memory and CHIPM2 is DRAM. CHIPM3 is an information processing device configured by a central processing unit CPU, an SRAM controller SRC and a DRAM controller SDC or a control circuit for controlling data transfer between CHIPM1 and CHIPM2.

The memory module MM shown in FIG. 1, the memory module MM shown in FIG. 14, the memory module MM1 shown in FIG. 17, the memory module MM2 shown in FIG. 18, the memory system shown in FIG. 21 and the memory system shown in FIG. 22 can be integrated in one molded device by this multichip module.

CHIPM1 and a bonding pad on the board PCB are connected via bonding wire (PATH2), and CHIPM2 and a bonding pad on the board PCB are connected via bonding wire (PATH1). CHIPM1 and CHIPM2 are connected via bonding wire (PATH3). The ball grid array is used for mounting and wiring CHIPM3.

As the three chips can be laminated in the mounting method in this embodiment, packaging area can be kept small. Further, as bonding between CHIPM3 and the board is not required and the number of bonding wires can be reduced, man hours required for assembly can be reduced and in addition, the more reliable multichip module can be implemented.

NINTH EMBODIMENT

Figure 27:
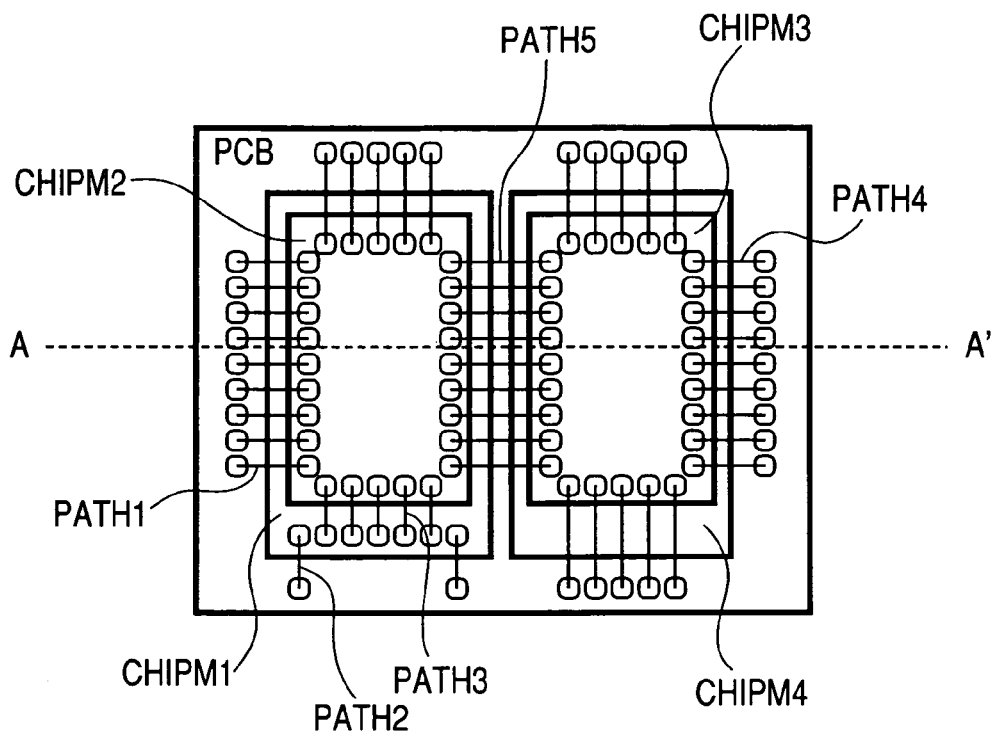
FIG. 27 show one embodiment of the memory system according to the invention.
Figure 27:
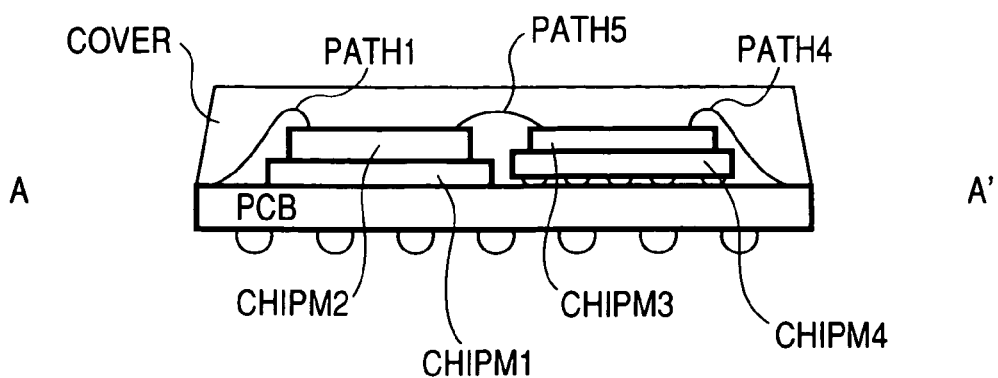

FIG. 27 show a ninth embodiment of the multichip module according to the invention. FIG. 27(a) is a top view and FIG. 27(b) is a sectional view showing a part viewed along a line A-A' shown in the top view.

As for a memory module equivalent to this embodiment, CHIPM1, CHIPM2, CHIPM3 and CHIPM4 are mounted on a board for mounting the devices with a ball grid array (BGA) (for example, a printed circuit board made of glass epoxy) PCB. CHIPM1 is a non-volatile memory and CHIPM3 is DRAM. CHIPM2 is a control circuit for controlling data transfer between CHIPM1 and CHIPM2 and CHIPM4 is an information processing device configured by a central processing unit CPU, an SRAM controller SRC and a DRAM controller SDC.

In the mounting method in this embodiment, the memory system shown in FIG. 1, the memory system module shown in FIG. 14, the memory system shown in FIG. 17 and the memory system shown in FIG. 18 can be integrated in one molded device.

CHIPM1 and a bonding pad on the board PCB are connected via bonding wire (PATH2), CHIPM2 and a bonding pad on the board PCB are connected via bonding wire (PATH1), and CHIPM3 and a bonding pad on the board PCB are connected via bonding wire (PATH4).

CHIPM1 and CHIPM2 are connected via bonding wire (PATH3), and CHIPM2 and CHIPM3 are connected via bonding wire (PATH5).

The ball grid array (BGA) is used for mounting and wiring CHIPM4.

As the bare chips are directly mounted on the printed circuit board PCB in the mounting method in this embodiment, the memory module having small packaging area can be configured. Besides, as each chip can be closely arranged, wiring length between the chips can be reduced.

The number of bonding pads on the board and the number of bonding wires are reduced by directly wiring the chips via the bonding wire and the memory module can be manufactured with small processes.

Further, as bonding between CHIPM4 and the board is not required and the number of bonding wires can be reduced, man hours for assembly can be reduced and in addition, the more reliable multichip module can be implemented.

TENTH EMBODIMENT

Figure 28:
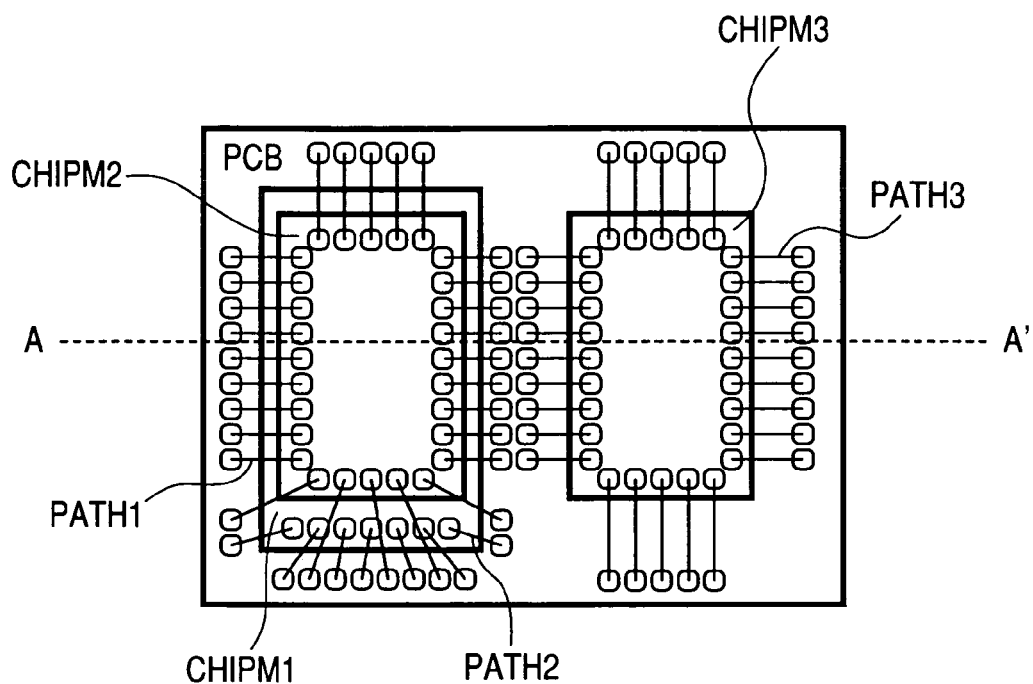
FIG. 28 show a transformed example of an embodiment of the memory system according to the invention.
Figure 28:
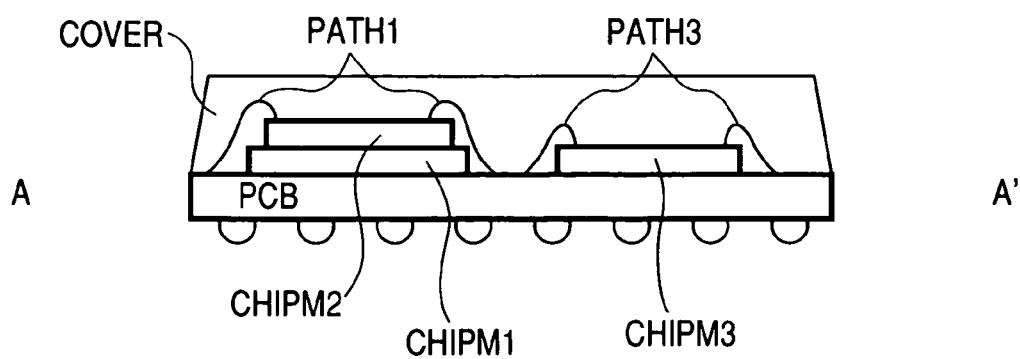

FIG. 28 show a tenth embodiment of the memory system according to the invention. FIG. 28(a) is a top view and FIG. 28(b) is a sectional view showing a part viewed along a line A-A' shown in the top view.

As for a memory module equivalent to this embodiment, CHIPM1, CHIPM2 and CHIPM3 are mounted on a board for mounting the devices with a ball grid array (BGA) (for example, a printed circuit board made of glass epoxy) PCB. CHIPM1 is a non-volatile memory, and CHIPM2 and CHIPM3 are DRAM. The memory module can be manufactured with small processes by unifying wiring between the chips and wiring between each chip and the board in a method using bonding wire.

In the mounting method in this embodiment, the module MM5 shown in FIG. 24 can be integrated in one molded device.

CHIPM1 and a bonding pad on the board PCB are connected via bonding wire (PATH2), CHIPM2 and a bonding pad on the board PCB are connected via bonding wire (PATH1), and CHIPM3 and a bonding pad on the board PCB are connected via bonding wire (PATH3).

In this embodiment, as the bare chips are directly mounted on the printed circuit board PCB, the memory module having small packaging area can be configured.

Besides, as each chip can be closely arranged, wiring length between the chips can be reduced.

The memory module can be manufactured with small processes by unifying wiring between each chip and the board in a method using bonding wire.

ELEVENTH EMBODIMENT

Figure 29:
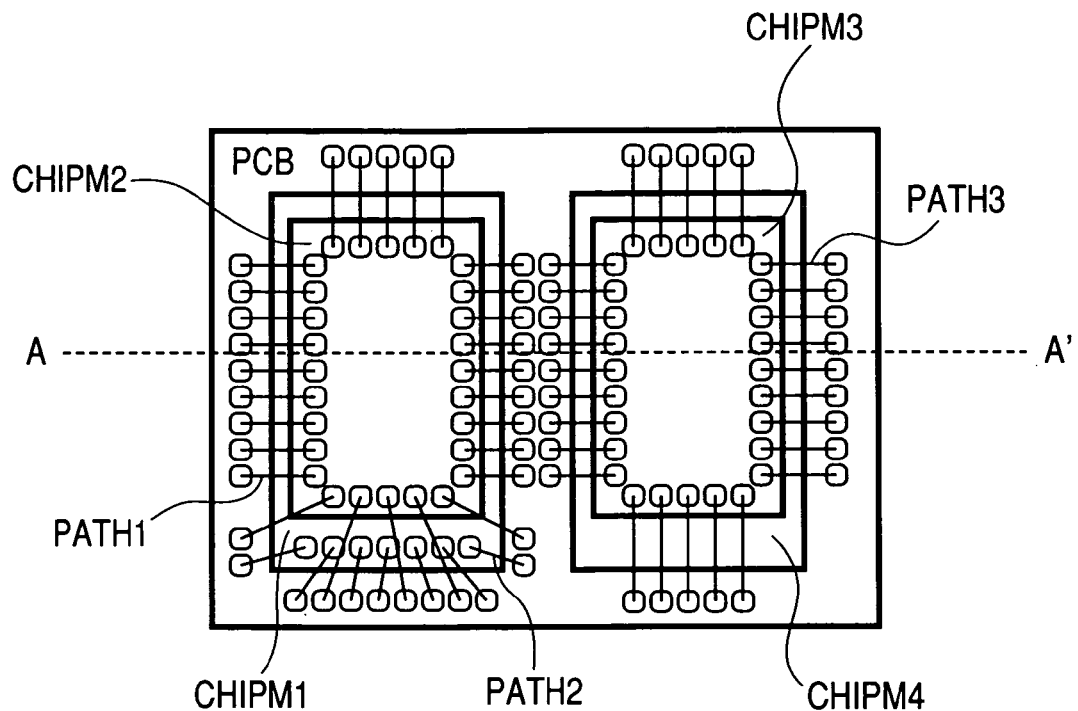
FIG. 29 show one embodiment of the memory system according to the invention.
Figure 29:
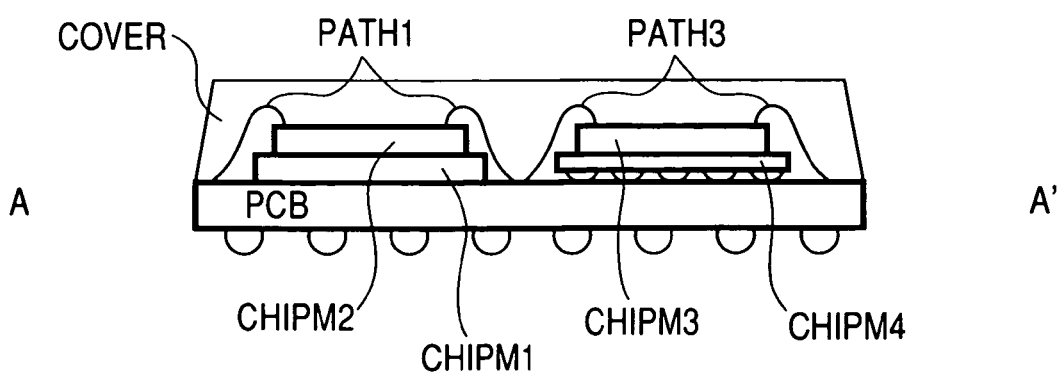

FIG. 29 show an eleventh embodiment of the memory system according to the invention. FIG. 29(a) is a top view and FIG. 29(b) is a sectional view showing a part viewed along a line A-A' shown in the top view.

As for a memory module equivalent to this embodiment, CHIPM1, CHIPM2, CHIPM3 and CHIPM4 are mounted on a board for mounting the devices with a ball grid array (BGA) (for example, a printed circuit board made of glass epoxy) PCB. CHIPM1 is a non-volatile memory, and CHIPM2 and CHIPM3 are DRAM. CHIPM4 is an information processing device configured by a central processing unit CPU, an SRAM controller SRC and a DRAM controller SDC.

In this multichip module, the memory system shown in FIG. 24 can be integrated in one molded device.

CHIPM1 and a bonding pad on the board PCB are connected via bonding wire (PATH2), CHIPM2 and a bonding pad on the board PCB are connected via bonding wire (PATH1), and CHIPM3 and a bonding pad on the board PCB are connected via bonding wire (PATH3).

The ball grid array (BGA) is used for mounting and wiring CHIPM4.

In this embodiment, as the bare chips are directly mounted on the printed circuit board PCB, the memory module having small packaging area can be configured. Besides, as each chip can be closely arranged, wiring length between the chips can be reduced. As bonding between CHIPM4 and the board is not required and the number of bonding wires can be reduced, man hours required for assembly can be reduced and in addition, a more reliable multichip module can be implemented.

TWELFTH EMBODIMENT

Figure 30:
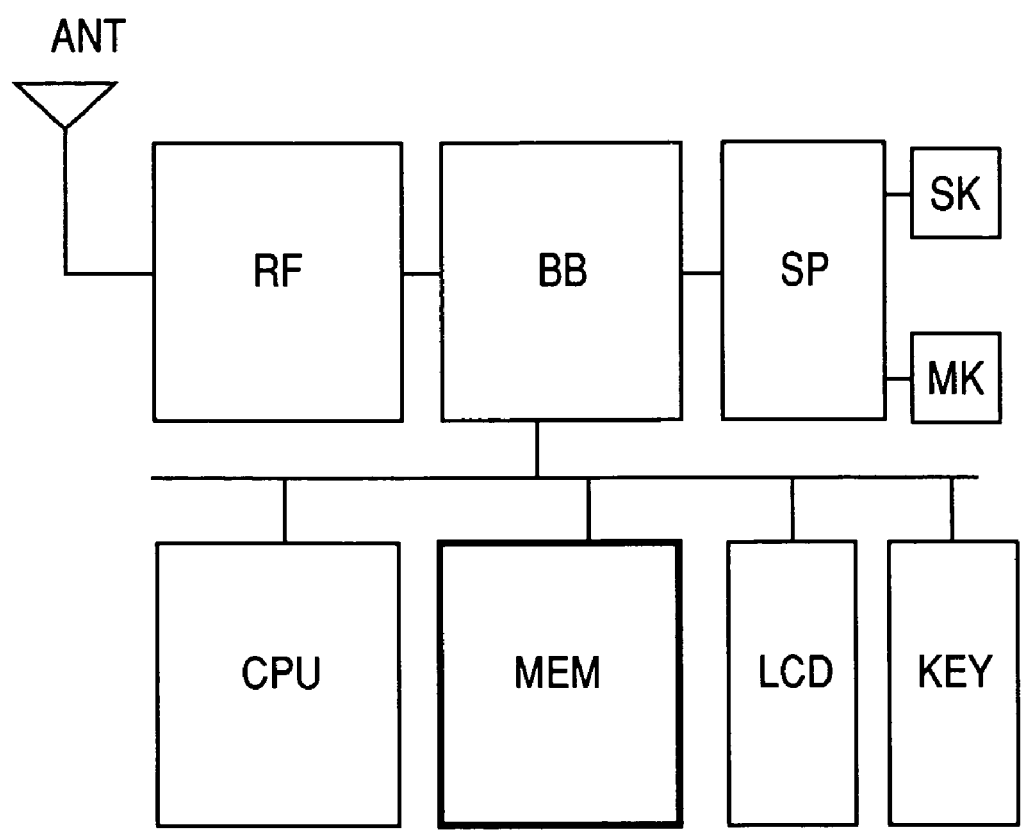
FIG. 30 is a block diagram showing an example of the configuration of a mobile telephone utilizing the memory system according to the invention.

FIG. 30 shows a twelfth embodiment showing a mobile telephone utilizing the memory module according to the invention. The mobile telephone is configured by an antenna ANT, a wireless block RF, a base-band block BB, a voice codec block SP, a speaker SK, a microphone MK, a processor CPU, a liquid crystal display block LCD, a keyboard KEY and the memory module MEM according to the invention.

The operation in a call will be described below.

Voice received via the antenna ANT is amplified in the wireless block RF and is input to the base-band block BB. In the base-band block BB, an analog signal of the voice is converted to a digital signal, error correction and decoding are performed, and the digital signal is output to the voice codec block SP. When the voice codec block converts the digital signal to an analog signal and outputs it to the speaker SK, the voice of a partner can be heard from the speaker.

The operation when a series of work that a home page of the Internet is accessed from the mobile telephone, music data is downloaded, is reproduced and heard and finally the downloaded music data is stored is performed will be described below.

In the memory module MEM, a basic program and an application program for a mail, for reproducing music and for a game such as a web browser are stored.

When the activation of the web browser is instructed via the keyboard, a program of the web browser stored in FLASH in the memory module MEM is transferred to DRAM in the same memory module. When data transfer to DRAM is finished, the processor CPU executes the program of the web browser in DRAM and instructs the liquid crystal display block LCD to display the web browser. When a desired home page is accessed and the download of desired music data is instructed via the keyboard KEY, the music data is received via the antenna ANT, is amplified in the wireless block RF, and is input to the baseband block BB. In the baseband block BB, the music data which is an analog signal is converted to a digital signal, and error correction and decoding are performed. Finally, the digitized music data is once stored in DRAM of the memory module MEM and is transferred to FLASH.

Next, when the activation of a music reproduction program is instructed via the keyboard KEY, the music reproduction program stored in FLASH in the memory module MEM is transferred to DRAM in the same memory module. When the data transfer to DRAM is finished, the processor CPU executes the music reproduction program in DRAM and instructs the liquid crystal display block LCD to display the music reproduction program.

When an instruction to listen to music data downloaded into DRAM is made via the key board KEY, the processor CPU executes a music reproduction program, processes the music data held in DRAM, and finally music can be heard from the speaker SK.

At this time, as the memory module according to the invention uses large-capacity DRAM, a web browser and the music reproduction program are held in DRAM and both programs are simultaneously executed by CPU. Further, an electronic mail program is activated, and the execution of the electronic mail program and the transmission/reception of a mail are also simultaneously enabled.

As a web browser is held in DRAM in the memory module even if the web browser is stopped, it can be promptly activated in reactivation.

When an instruction to turn off power is input via the keyboard, the memory module instructs so that only SRAM is operated, holds data at the minimum, and enables the extreme minimization of power consumption.

As described above, a large quantity of mails, reproduced music, application programs, music data, static image data and dynamic image data can be stored by using the memory module according to the invention, and further, plural programs can be simultaneously executed.

THIRTEENTH EMBODIMENT

Figure 31:
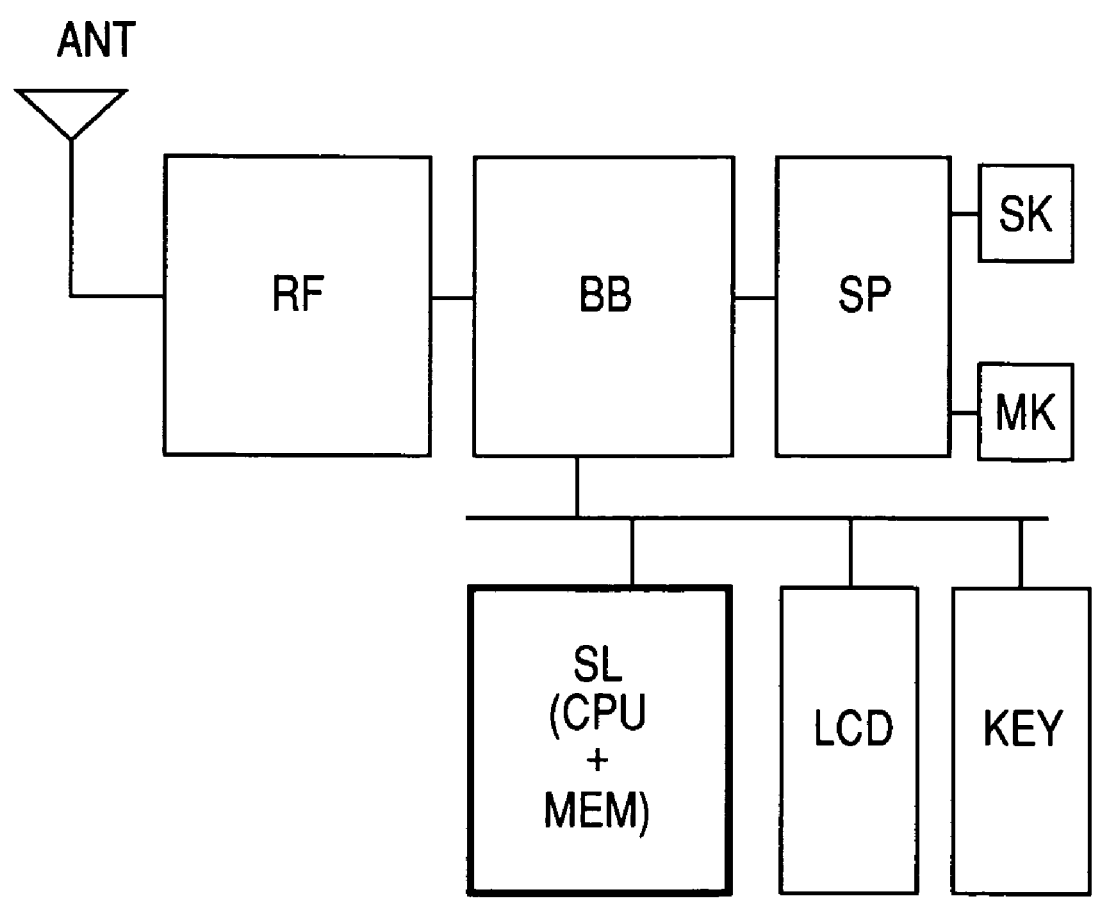
FIG. 31 is a block diagram showing an example of the configuration of a mobile telephone utilizing the memory system according to the invention.
Figure 32:
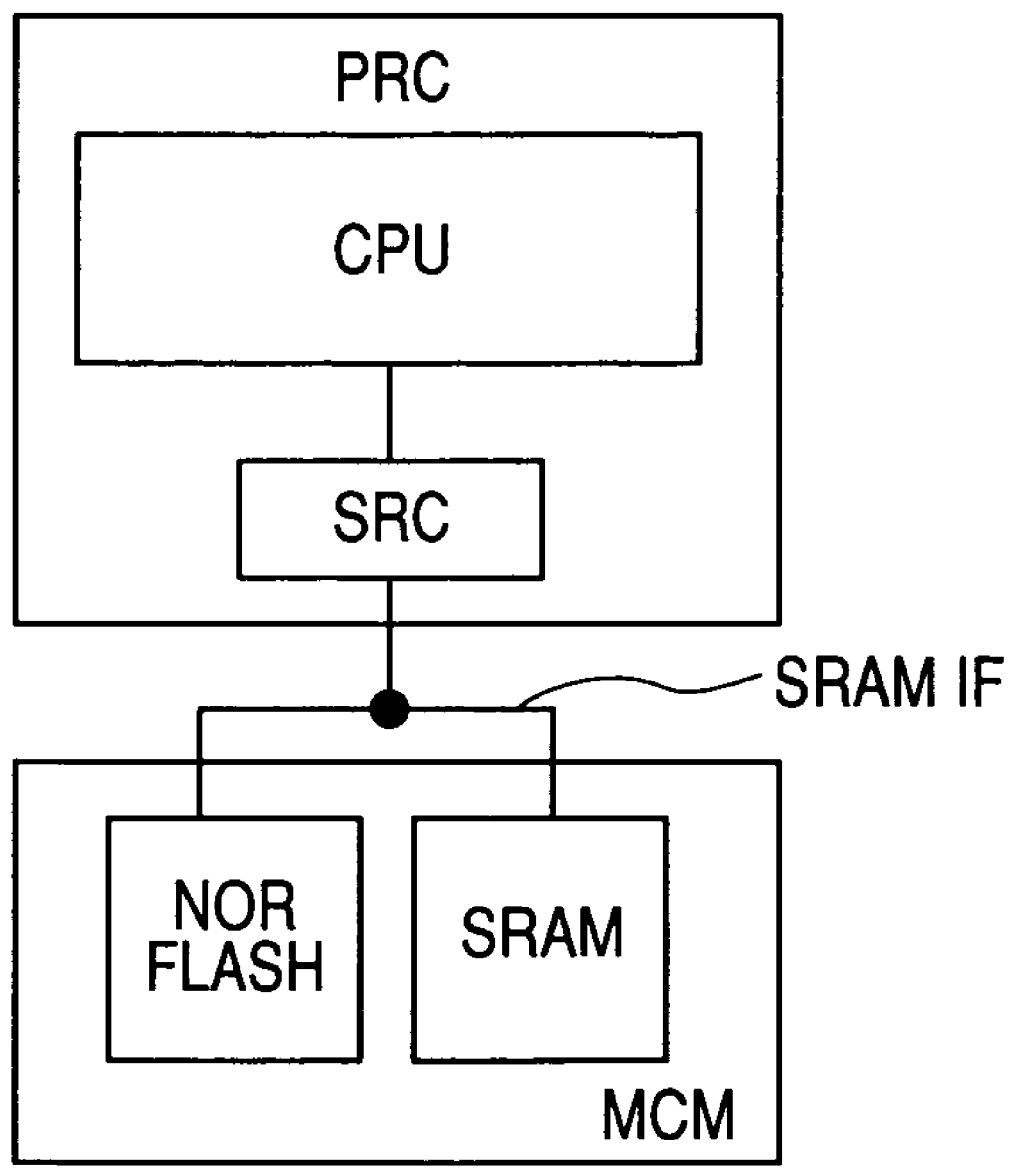
FIG. 32 is a block diagram showing an example of the configuration of a conventional type memory utilized in a mobile telephone.

FIG. 31 shows a thirteenth embodiment showing a mobile telephone utilizing the memory system according to the invention. The mobile telephone is configured by an antenna ANT, a wireless block RF, a base-band block BB, a voice codec block SP, a speaker SK, a microphone MK, a liquid crystal display block LCD, a keyboard KEY and the memory system SL according to the invention in which a processor CPU and the memory module MEM are integrated in one molded device.

As the number of parts can be reduced by using the memory system SL according to the invention, the cost can be reduced, the reliability of the mobile telephone is enhanced, the packaging area of parts configuring the mobile telephone can be reduced, and the mobile telephone can be small-sized.

INDUSTRIAL APPLICABILITY

As described above, effect acquired by the invention is as follows.

First, the mobile device can read a boot program in SRAM and can promptly activate itself by automatically transferring the boot program from FLASH to SRAM when power is turned on.

Second, as this memory module can be accessed promptly when the mobile device is activated by automatically transferring a program required when power is turned on from FLASH to DRAM, the performance of the mobile device can be enhanced.

Third, in the memory module to which the memory system according to the invention is applied, data in FLASH can be read and written at the similar speed to that of data in DRAM by securing a region in which a part of data or the whole data in FLASH can be copied in DRAM and transferring data from FLASH to the region in DRAM in advance.

Fourthly, inside this memory module, as the detection and the correction of an error are performed in reading from FLASH and a defective address at which writing is not correctly performed is replaced in writing, high-speed processing is enabled and reliability can be kept.

Fifthly, as large-capacity DRAM is used in this memory module, a large-capacity work region can be also secured in addition to a region in which data in FLASH can be copied and the memory module can correspond to the enhancement of the function of the mobile telephone.

Sixthly, even if data is being transferred between FLASH and DRAM according to a load instruction or a store instruction inside this memory module, access from a device outside the memory module to DRAM is enabled without being conscious of the data transfer and the memory module can correspond to the enhancement of the performance and the function of the mobile device.

Seventhly, as inside the memory module, automatic refresh is performed since the transfer of an initial program from FLASH to DRAM after power is turned on is started until an automatic refresh instruction is input from a device outside the memory module, the switching of refresh control can be promptly and precisely made.

Besides, data in DRAM can be held with small power until an instruction to release a self-refresh condition is input from a device outside the memory module by turning DRAM a self-refresh condition after the transfer of an initial program from FLASH to DRAM after power is turned on is finished.

Eighthly, as boot program data and designation data for the automatic data transfer region can be written to the initial program region of FLASH via the SRAM interface which is a general interface and the boot method and the data transfer region immediately after power is turned on can be changed, the invention can flexibly correspond to a request of the mobile device and the function can be enhanced.

Ninthly, the system memory module having small packaging area can be provided by integrating plural semiconductor chips in one molded device.

The invention claimed is:

1. A memory module including a non-volatile memory, a dynamic random access memory, a static random access memory, and a first control circuit that accesses the non-volatile memory, the dynamic random access memory, and the static random access memory, the memory module comprising:
   a dynamic random access memory interface to outside the memory module for accessing the dynamic random access memory from outside the memory module; and
   a static random access memory interface to outside the memory module for accessing the static random access memory from outside the memory module,
   wherein the dynamic random access memory interface is arranged to connect to a first memory controller outside the memory module,
   wherein the static random access memory interface is arranged to connect to a second memory controller outside the memory module, different from the first memory controller,
   wherein the first control circuit receives a first instruction code, which indicates to transfer data stored in the non-volatile memory to the dynamic random access memory, via the dynamic random access memory interface,
   wherein the first control circuit receives a second instruction code, which indicates to transfer data stored in the non-volatile memory to the static random access memory, via the static random access memory interface,
   wherein, when data stored in the non-volatile memory is to be outputted to outside the memory module, data stored in the non-volatile memory is transferred to at least one of the dynamic random access memory based on the first instruction code and the static random access memory based on the second instruction code, and then any portion of said data transferred to the dynamic random access memory is outputted to outside the memory module via the dynamic random access memory interface, and any portion of said data transferred to the static random access memory is outputted to outside the memory module via the static random access memory interface.

2. A memory module according to claim 1, wherein:
immediately after power is turned on, data in a predetermined address region of the non-volatile memory is transferred to the static random access memory.

3. A memory module according to claim 1, wherein:
immediately after power is turned on, data in a predetermined address region of the nonvolatile memory is transferred to the dynamic random access memory.

4. A memory module according to claim 1, wherein:
data transfer between the non-volatile memory and the dynamic random access memory is performed based on the first instruction code, which is sent via the dynamic random access memory interface.

5. A memory module according to claim 1, wherein:
data transfer between the non-volatile memory and the static random access memory is performed based on the second instruction code, which is sent via the static random access memory interface.

6. A memory module according to claim 1, wherein:
in transferring data from the non-volatile memory to the static random access memory or the dynamic random access memory, data having an error is corrected before being transferred.

7. A memory module according to claim 1, wherein:
in transferring data from the static random access memory or the dynamic random access memory to the non-volatile memory, an address replacement process is executed.

8. A memory module according to claim 1, wherein:
a boot program is held in the non-volatile memory.

9. A memory module according to claim 1, wherein:
data transfer range data, which includes a range of data transferred from the non-volatile memory to the dynamic random access memory at initial time when operating power is turned on, is held in the non-volatile memory.

10. A memory module according to claim 1, wherein:
the static random access memory has a memory size equal to or smaller than $1/1000$ of the memory size of the non-volatile memory.

11. A memory module according to claim 1, wherein:
a data-hold operation of the dynamic random access memory is executed inside the memory module.

12. A memory module according to claim 11, wherein:
the memory module is accessed first;
the dynamic random access memory performs a data-hold operation second; and
the memory module performs data transfer between the non-volatile memory and the static random access memory or the dynamic random access memory third.

13. A memory module according to claim 1, wherein:
the dynamic random access memory is synchronous DRAM; and
access to the non-volatile memory and the dynamic random access memory from outside the memory module is made via the dynamic random memory access interface.

14. A memory module according to claim 1, wherein:
the non-volatile memory is a NAND flash memory; and
the dynamic random access memory is synchronous DRAM.

15. A memory module according to claim 1, wherein:
the non-volatile memory is an AND flash memory; and
the dynamic random access memory is synchronous DRAM.

16. A memory module according to claim 1, wherein:
the dynamic random access memory includes plural interfaces.

17. A memory module according to claim 1, wherein:
the dynamic random access memory includes a second control circuit which processes access from the outside of the memory module and a third control circuit that independently accesses the non-volatile memory.

18. A memory module according to claim 1, wherein:
the dynamic random access memory includes a second control circuit to independently access the non-volatile memory and a circuit to subordinately process the access from the second control circuit.

19. A memory module according to claim 1, wherein:
the non-volatile memory includes a static random access memory, an error detecting and correcting circuit, and an address replacement circuit.

20. A memory module according to claim 1, wherein:
the non-volatile memory includes plural interfaces.

21. A memory module according to claim 1, wherein:
said accessing the dynamic random access memory from outside the memory module is from a device outside the memory module.

* * * * *